US006914307B2

(12) United States Patent
Iwamatsu et al.

(10) Patent No.: US 6,914,307 B2
(45) Date of Patent: Jul. 5, 2005

(54) SEMICONDUCTOR DEVICE AND METHOD OF MANUFACTURING THE SAME

(75) Inventors: Toshiaki Iwamatsu, Tokyo (JP); Takashi Ipposhi, Tokyo (JP); Hideki Naruoka, Tokyo (JP); Nobuyoshi Hattori, Tokyo (JP); Shigeto Maegawa, Tokyo (JP); Yasuo Yamaguchi, Tokyo (JP); Takuji Matsumoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/657,068

(22) Filed: Sep. 9, 2003

(65) Prior Publication Data

US 2004/0046216 A1 Mar. 11, 2004

Related U.S. Application Data

(62) Division of application No. 09/985,020, filed on Nov. 1, 2001, now Pat. No. 6,646,306.

(30) Foreign Application Priority Data

Nov. 21, 2000 (JP) ........................................ 2000-354043

(51) Int. Cl.[7] .............................................. H01L 29/76
(52) U.S. Cl. .......................... 257/377; 257/51; 257/347; 257/382; 257/384; 257/412; 257/413
(58) Field of Search ........................ 257/51, 347, 377, 257/382, 384, 412, 413

(56) References Cited

U.S. PATENT DOCUMENTS

| 4,374,700 A | 2/1983 | Scott et al. |
| 4,422,885 A | 12/1983 | Brower et al. |
| 4,476,482 A | 10/1984 | Scott et al. |

(Continued)

FOREIGN PATENT DOCUMENTS

| JP | 2-159035 | 6/1990 |
| JP | 6-204334 | 7/1994 |
| JP | 9-275134 | 10/1997 |

(Continued)

OTHER PUBLICATIONS

M. Inohara et al., "Cooper Contamination Induced Degradation of MOSFET Characteristics and Reliability", 2000 Symposium on VLSI Technology Digest of Technical Papers, IEEE, 2000, pp. 26–27.

Kazuyuki Hozawa, et al., "Cooper distribution behavior near a $SIO_2$/SI Interface by low–temperature (<400 ° C.) annealing and its influence on electrical characteristics of MOS–capacitors", 2000 Symposium on VLSI Technology Digest of Technical Papers, IEEE, 2000, pp. 24–25.

A. Steegen, et al., "Silicide and Shallow Trench Isolation line width dependent stress induced junction leakage", 2000 Symposium on VLSI Technology Digest of Technical Papers, IEEE, 2000, pp. 180–181.

*Primary Examiner*—Andy Huynh
(74) *Attorney, Agent, or Firm*—Oblon, Spivak, McClelland, Maier & Neustadt, P.C.

(57) ABSTRACT

A semiconductor device includes a semiconductor layer, a plurality of semiconductor elements formed on the semiconductor layer, and an isolation film provided in a surface of the semiconductor layer, semiconductor elements being electrically isolated from each other by the isolation film. The semiconductor device also includes a PN junction portion provided under the isolation film and formed by two semiconductor regions of different conductivity types in the semiconductor layer. The isolation film includes a nitride film provided in a position corresponding to a top of the PN junction portion and has a substantially uniform thickness across the two semiconductor regions and an upper oxide film and a lower oxide film which are provided in upper and lower portions of the nitride film. The surface of the semiconductor layer is silicidized in such a state that a surface of the isolation film is exposed.

8 Claims, 34 Drawing Sheets

U.S. PATENT DOCUMENTS

| | | |
|---|---|---|
| 4,498,223 A | 2/1985 | Goldman et al. |
| 4,682,403 A | 7/1987 | Hartmann et al. |
| 4,786,611 A | 11/1988 | Pfiester |
| 5,079,182 A | 1/1992 | Ilderem et al. |
| 5,086,012 A | 2/1992 | Sik |
| 5,164,803 A | 11/1992 | Ozaki et al. |
| 5,223,456 A | 6/1993 | Malwah |
| 5,294,822 A | 3/1994 | Verrett |
| 5,466,960 A | 11/1995 | Ilderem et al. |
| 5,612,243 A * | 3/1997 | Verrett ................ 438/233 |
| 5,841,185 A | 11/1998 | Ishikawa |
| 5,847,433 A | 12/1998 | Kerber |
| 5,956,617 A | 9/1999 | Kimura et al. |
| 6,097,103 A | 8/2000 | Ishigaki |
| 6,261,882 B1 | 7/2001 | Kim |

FOREIGN PATENT DOCUMENTS

| | | | |
|---|---|---|---|
| KR | 1996-0002744 | * | 1/1996 |
| KR | 1997-0051968 | | 7/1997 |
| KR | 1998-058455 | | 10/1998 |
| KR | 10-0230610 | | 11/1999 |

* cited by examiner

F I G . 2 4
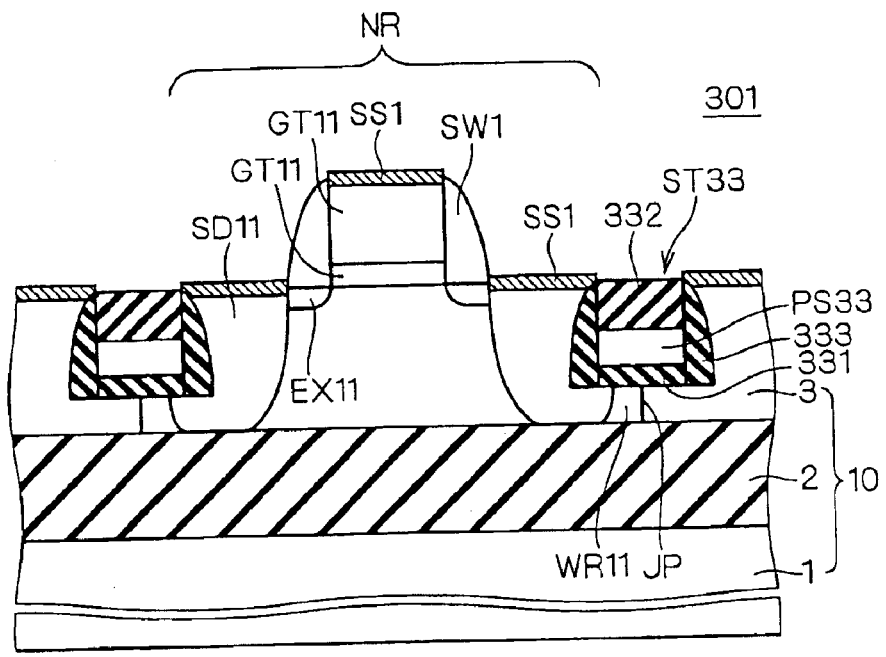
F I G . 2 5
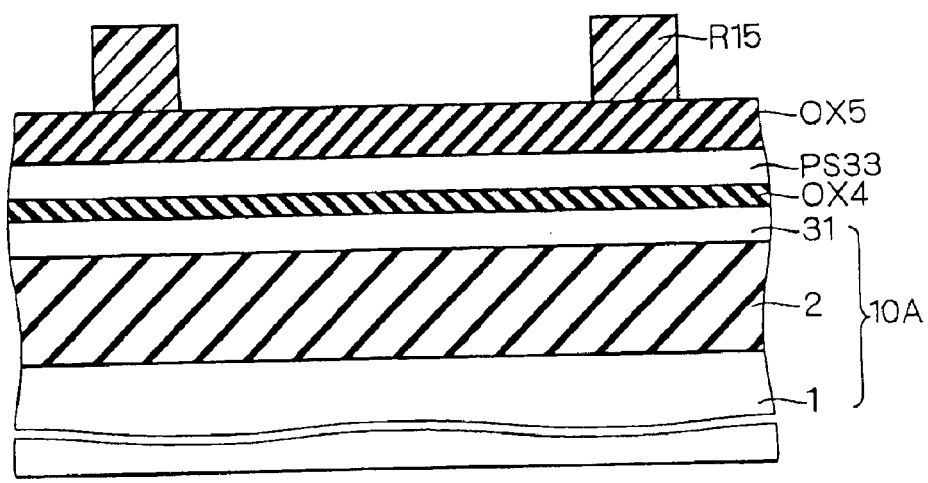

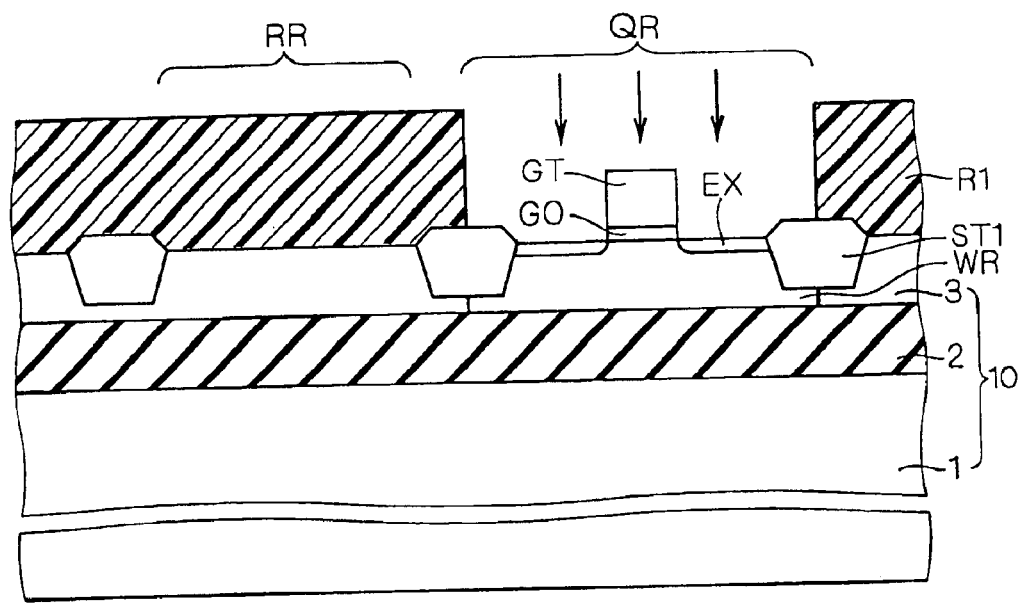
F I G . 6 2 (BACKGROUND ART)
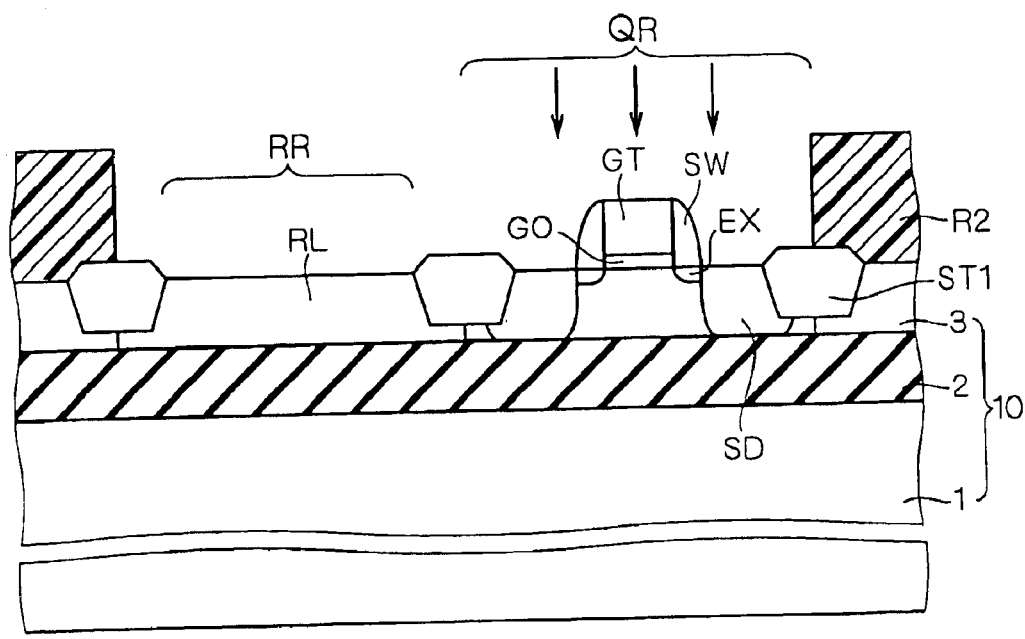
F I G . 6 3 (BACKGROUND ART)

SEMICONDUCTOR DEVICE AND METHOD OF MANUFACTURING THE SAME

CROSS-REFERENCE TO RELATED APPLICATION

This application is a Divisional of co-pending U.S. patent application Ser. No. 09/985,020, filed Nov. 1, 2001 now U.S. Pat. No. 6,646,306, and claims priority to Japanese Patent Application No. 2000-354043, filed Nov. 21, 2000. The contents of these applications are incorporated herein by reference in their entirety.

BACKGROUND OF THE INVENTION

1. Field of the Invention

The present invention relates to a semiconductor device and a method of manufacturing the semiconductor device, and more particularly to a semiconductor device having a higher tolerance to metal pollution and a method of manufacturing the semiconductor device.

2. Description of the Background Art

A semiconductor device having an SOI structure (hereinafter referred to as an SOI device) to be formed on an SOI substrate in which a buried oxide film and an SOI (Silicon On Insulator) layer are provided on a silicon substrate is characterized in that a parasitic capacitance can be reduced, an operation can be carried out at a high speed and power consumption can be reduced, and is used for portable equipment and the like.

In order to implement a high speed operating circuit, a technique for reducing a resistance is essential. As the technique for reducing a resistance, generally, a method of forming a metal compound layer (silicide layer) in self-alignment in a gate wiring or a source-drain region of a transistor constituting the circuit.

For example, as shown in FIG. 83 of Japanese Patent Application Laid-Open No. 6-204334 (1994), a metal layer such as Ti (titanium) or Co (cobalt) is deposited through sputtering or the like over an upper portion of a gate electrode formed of polysilicon and a source-drain region and a heat treatment is carried out for a short time so that a silicide layer is formed. In general, it has been known that the metal layer does not form the silicide layer over an isolating film, an oxide film such as a side wall oxide film of a gate electrode, and a nitride film at this time.

Depending on the conditions of the heat treatment or the kind of an insulating film, however, a metallic element such as Co is diffused into the insulating film and reaches a silicon layer provided under the insulating film so that a silicide is formed therein in some cases.

For example, there is a problem in that a circuit malfunctions due to an increase in a junction leakage current when the silicide is formed in a PN junction region.

In recent years, moreover, a wiring material tends to be changed from a conventional Al (aluminum)-Cu (copper) alloy wiring to a Cu wiring or the like due to a reduction in a resistance of a wiring. Correspondingly, it has been reported that a characteristic of a device is deteriorated due to the diffusion of Cu.

In addition, the number of process steps is increased with microfabrication of a semiconductor device and multilayered wiring. Consequently, the metal pollution often occurs. When a metal pollutant is segregated into a junction interface, the junction leakage current is increased and the circuit malfunctions as described above.

A conventional silicide process will be described with reference to FIGS. 62 to 65.

First of all, an SOI substrate 10 in which a buried oxide film 2 and an SOI layer 3 are provided on a silicon substrate 1 is prepared as shown in FIG. 62 and a trench isolation oxide film ST1 is selectively formed as an isolating film in a surface of the SOI layer 3, thereby defining a region QR forming a MOS transistor and a region RR forming a resistive element.

A trench isolation oxide film ST1 is also referred to as a shallow trench isolation oxide film (ST1) and has a well region WR provided thereunder so that elements are not electrically isolated completely from each other. In some cases, therefore, the trench isolation oxide film ST1 is also referred to as a partial isolation oxide film (PT1).

After the trench isolation oxide film ST1 is formed, a gate oxide film GO and a gate electrode GT are selectively formed on the SOI layer 3 of the MOS transistor region QR.

Then, a resist mask R1 is formed such that the region QR is to be an opening, and an impurity ion of the same conductivity type as that of the source-drain region in the SOI layer is implanted by using the gate electrode GT as a mask. Thus, an extension region EX is formed in self-alignment.

The extension region EX is a shallower diffusion region than a source-drain region which is to be formed at a subsequent step, and is formed by implanting the impurity ion in a lower concentration than that of the source-drain region or in substantially the same concentration as that of the source-drain region such that it acts as a part of the source-drain region.

At a step shown in FIG. 63, next, a side wall spacer SW is formed on a side surface of the gate electrode GT, a resist mask R2 is formed such that the regions QR and RR are to be openings, and an impurity ion is implanted into the SOI layer 3 to form a source-drain region SD in self-alignment. At this time, the impurity is also implanted into the resistive element region RR so that a resistive layer RL is formed.

At a step shown in FIG. 64, subsequently, an insulating film IF is selectively formed on the SOI layer 3 in the region RR to prevent the formation of a silicide layer. Then, a metal layer such as Ti or Co is deposited through sputtering or the like and a silicide reaction is promoted by a heat treatment.

The silicide reaction is achieved by causing an exposed silicon layer to react to the metal layer provided thereon through a beat treatment at a low temperature for a short time. Since the metal layer formed on an insulating film such as an oxide film is not silicided, it is removed in a subsequent removing process. Then, a silicide film having a stable structure is formed through a second heat treatment.

FIG. 64 shows a state obtained after an unreacted metal film is removed, and a silicide layer SS is formed over the source-drain region SD, the gate electrode GT and the resistive layer RL. A silicide layer SS is formed in two positions interposing an insulating film IF over the resistive layer RL and acts as two electrodes of the resistive element.

At a step shown in FIG. 65, then, an interlayer insulating film IZ is formed on the SOI layer 3, and a plurality of contact portions CH reaching the silicide layer SS formed on the source-drain layer SD and the resistive layer RL are provided through the interlayer insulating film IZ. Thus, an SOI device 90 is constituted.

Referring to FIGS. 62 to 65, the SOI device 90 formed on the SOI substrate 10 has been described. FIG. 66 shows a bulk device 90A formed on a bulk silicon substrate 1.

In the bulk device 90A, a deeper trench isolation oxide film ST2 is provided in place of the trench isolation oxide film ST1. Since other structures are the same as those of the SOI device 90 shown in FIG. 65, the same structures have the same reference numerals and repetitive description will be omitted.

As described above, the silicide reaction causes the exposed silicon layer to react to the metal layer provided thereon through the heat treatment (first heat treatment) at a low temperature for a short time and the unreacted metal film is removed, and the silicide film having a stable structure is then formed through the second heat treatment. There is a possibility that a metal constituting the metal film might be diffused into the insulating film through the first heat treatment or the unreacted metal film might be removed insufficiently to cause the metal to remain in a very small amount over the insulating film and to be diffused into the insulating film through the second heat treatment or a heat treatment in a subsequent process. In such a case, the metal layer reaching a surface of the silicon layer forms a silicide. For example, in the case in which the silicide is formed in a PN junction region, a junction leakage current is caused. In the case in which the silicide is formed in the vicinity of an interface between a gate insulating film and a silicon layer, reliability of the gate insulating film is deteriorated.

As shown in FIG. 66, it is apparent that the same problem arises in the device 90A formed on the bulk silicon layer 1.

SUMMARY OF THE INVENTION

A first aspect of the present invention is directed to a semiconductor device comprising a semiconductor layer, a plurality of semiconductor elements formed on the semiconductor layer, an isolation film formed in a surface of the semiconductor layer, the semiconductor elements being electrically isolated from each other by the isolation film, a PN junction portion formed by two semiconductor regions of different conductivity types in the semiconductor layer provided under the isolation film, and a polysilicon film provided in a position opposed to a top of the PN junction portion with the isolation film interposed therebetween across the two semiconductor regions.

A second aspect of the present invention is directed to the semiconductor device, wherein the polysilicon film is formed in an upper portion of an outside of the isolation film, and a formation width of the polysilicon film is set such that a length Lg from a position in the polysilicon film corresponding to a position of the PN junction portion to an end of the polysilicon film and a thickness Tst of the isolation film satisfy an equation of 0.5 Lg<Tst<20 Lg.

A third aspect of the present invention is directed to the semiconductor device, wherein the semiconductor elements include a MOS transistor, and a thickness of the polysilicon film is equal to that of a gate polysilicon film constituting a gate electrode of the MOS transistor.

A fourth aspect of the present invention is directed to the semiconductor device, wherein the semiconductor elements include a MOS transistor, and a thickness of the polysilicon film is smaller than that of a gate polysilicon film constituting a gate electrode of the MOS transistor.

A fifth aspect of the present invention is directed to the semiconductor device, wherein the PN junction portion is extended along a provision pattern of the isolation film, and the polysilicon film is provided along the PN junction portion.

A sixth aspect of the present invention is directed to the semiconductor device, wherein the polysilicon film is formed in the isolation film, and has a substantially uniform thickness across the two semiconductor regions.

A seventh aspect of the present invention is directed to the semiconductor device, wherein the isolation film has an upper oxide film and a lower oxide film which are provided in upper and lower portions of the polysilicon film, and an oxide film spacer for covering side surfaces of the upper oxide film, the polysilicon film and the lower oxide film.

An eighth aspect of the present invention is directed to the semiconductor device, wherein the isolation film has an upper oxide film and a lower oxide film which are provided in upper and lower portions of the polysilicon film, and an oxide film provided on a side surface of the polysilicon film.

A ninth aspect of the present invention is directed to a semiconductor device comprising a semiconductor layer, a plurality of semiconductor elements formed on the semiconductor layer, an isolation film provided in a surface of the semiconductor layer, the semiconductor elements being electrically isolated from each other by the isolation film, a PN junction portion formed by two semiconductor regions of different conductivity types in the semiconductor layer provided under the isolation film, and the isolation film including a nitride film provided in a position corresponding to a top of the PN junction portion and having a substantially uniform thickness across the two semiconductor regions, and an upper oxide film and a lower oxide film which are provided in upper and lower portions of the nitride film.

A tenth aspect of the present invention is directed to a semiconductor device comprising an SOI substrate including a semiconductor substrate, a buried oxide film provided on the semiconductor substrate and an SOI layer provided on the buried oxide film, a plurality of semiconductor elements formed on the SOI layer, and an isolation film provided in a surface of the SOI layer, the semiconductor elements being electrically isolated from each other by the isolation film, the isolation film including a complete trench reaching the buried oxide film penetrating through the SOI layer and a partial trench leaving a well region thereunder without penetrating through the SOI layer which are continuously provided, an internal wall insulating film provided on internal walls of the complete trench and the partial trench, an internal polysilicon film provided to fill in the complete trench and to be extended over a bottom face of the partial trench, and an upper insulating film provided to cover the internal polysilicon film and surrounding the internal polysilicon film together with the internal insulating film, thereby electrically insulating the internal polysilicon film.

An eleventh aspect of the present invention is directed to the semiconductor device, wherein the internal polysilicon film is restrictively provided in the partial trench so as not to get over the internal wall insulating film formed on a side wall of the partial trench.

A twelfth aspect of the present invention is directed to a semiconductor device comprising a semiconductor layer, a plurality of semiconductor elements formed on the semiconductor layer, an isolation film provided in a surface of the semiconductor layer, the semiconductor elements being electrically isolated from each other by the isolation film, a PN junction portion formed by two semiconductor regions of different conductivity types in the semiconductor layer provided under the isolation film, and a local crystal defect region provided along the PN junction under the isolation film on at least one of sides in the two semiconductor regions.

A thirteenth aspect of the present invention is directed to the semiconductor device, wherein the crystal defect region is a region in which an impurity of the same conductivity type as a conductivity type of the semiconductor region having the crystal defect region formed therein is introduced in a relatively high concentration.

A fourteenth aspect of the present invention is directed to the semiconductor device, wherein the crystal defect region is a region in which an impurity of a different conductivity type from the conductivity type of the semiconductor region having the crystal defect region formed therein is introduced in a relatively high concentration.

A fifteenth aspect of the present invention is directed to a semiconductor device comprising an SOI substrate including a semiconductor substrate, a buried oxide film provided on the semiconductor substrate and an SOI layer provided on the buried oxide film, a plurality of semiconductor elements formed on the SOI layer, an isolation film provided in a surface of the SOI layer, the semiconductor elements being electrically isolated from each other by the isolation film, a PN junction portion formed by two semiconductor regions of different conductivity types in the SOI layer provided under the isolation film, and a first polysilicon film buried to penetrate through the vicinity of the PN junction portion on at least one of sides in the two semiconductor regions.

A sixteenth aspect of the present invention is directed to the semiconductor device, wherein the semiconductor elements include a MOS transistor, the MOS transistor having a source-drain region provided in a surface of the SOI layer, and a second polysilicon film is further buried to penetrate through the source-drain region adjacent to the isolation film.

A seventeenth aspect of the present invention is directed to the semiconductor device, further comprising first and second local crystal defect regions provided in the vicinity of an interface between the silicon substrate and the buried oxide film under the first and second polysilicon films.

An eighteenth aspect of the present invention is directed to a semiconductor device comprising a semiconductor layer, a plurality of semiconductor elements formed on the semiconductor layer, an isolation film formed in a surface of the semiconductor layer, the semiconductor elements being electrically isolated from each other by the isolation film, a PN junction portion formed by two semiconductor regions of different conductivity types in the semiconductor layer provided under the isolation film, and an upper nitride film provided in a position opposed to a top of the PN junction portion with the isolation film interposed therebetween across the two semiconductor regions.

A nineteenth aspect of the present invention is directed to the semiconductor device, wherein the semiconductor elements include a MOS transistor, the MOS transistor having a side wall spacer formed of a nitride film which is provided on side surfaces of a gate electrode and a gate insulating film, and a thickness of the upper nitride film is substantially equal to that of the side wall spacer.

A twentieth aspect of the present invention is directed to the semiconductor device, wherein the upper nitride film and the side wall spacer have a two-layered structure, and respective first layers and respective second layers have thicknesses substantially equal to each other.

A twenty-first aspect of the present invention is directed to a semiconductor device comprising a semiconductor layer, a plurality of semiconductor elements formed on the semiconductor layer, an isolation film formed in a surface of the semiconductor layer, the semiconductor elements being electrically isolated from each other by the isolation film, and a PN junction portion formed by two semiconductor regions of different conductivity types in the semiconductor layer provided under the isolation film, the isolation film having a plurality of silicon islands therein, the silicon islands being provided in a position corresponding to a top of the PN junction portion in the isolation film across the two semiconductor regions.

A twenty-second aspect of the present invention is directed to the semiconductor device, wherein the semiconductor device is an SOI semiconductor device formed on an SOI substrate including a silicon substrate, a buried oxide film provided on the silicon substrate and an SOI layer provided on the buried oxide film, the semiconductor layer being the SOI layer.

A twenty-third aspect of the present invention is directed to a method of manufacturing a semiconductor device comprising a silicon semiconductor layer, a plurality of semiconductor elements formed on the silicon semiconductor layer, and an isolation film formed in a surface of the silicon semiconductor layer, the semiconductor elements being electrically isolated from each other by the isolation film, the method comprising the steps of (a) forming the semiconductor elements and then forming a metal layer to provide a silicide layer over a whole surface, (b) carrying out a heat treatment to cause the metal layer to react to the silicon semiconductor layer, thereby forming a silicide layer, and (c) removing an unreacted metal layer and a surface of the isolation film by a predetermined thickness after the heat treatment.

A twenty-fourth aspect of the present invention is directed to the method of manufacturing a semiconductor device, wherein the step (c) includes the steps of (c-1) removing the unreacted metal layer by wet etching after the heat treatment, and (c-2) carrying out dry etching for removing the surface of the isolation film by the predetermined thickness after the step (c-1), the isolation film being formed of an oxide film, the step (c-2) including the step of using at least hydrofluoric acid as an etching agent, the predetermined thickness being 2 to 50 nm.

A twenty-fifth aspect of the present invention is directed to the method of manufacturing a semiconductor device, further comprising, prior to the step (c-2), the step of forming a mask setting at least a top of the isolation film to be an opening, the step (c-2) being carried out by using the mask.

A twenty-sixth aspect of the present invention is directed to a method of manufacturing a semiconductor device comprising a semiconductor layer, a plurality of semiconductor elements formed on the semiconductor layer, and an isolation film provided in a surface of the semiconductor layer, the semiconductor elements being electrically isolated from each other by the isolation film, the method comprising the steps of (a) providing a first oxide film, a polysilicon film and a second oxide film on the semiconductor layer, (b) selectively removing the first oxide film, the polysilicon film and the second oxide film, thereby forming a laminated film of a lower oxide film, the polysilicon film and an upper oxide film in a position where the isolation film is to be formed, (c) covering at least a side surface of the polysilicon film with an oxide film, thereby forming the isolation film, and (d) epitaxially growing the semiconductor layer, thereby burying the isolation film in the surface of the semiconductor layer thus grown after the step (c).

A twenty-seventh aspect of the present invention is directed to the method of manufacturing a semiconductor device, wherein the step (c) further includes the step of forming an oxide film spacer to cover a side surface of the laminated film.

A twenty-eighth aspect of the present invention is directed to the method of manufacturing a semiconductor device, wherein the step (c) includes the step of thermally oxidizing the side surface of the polysilicon film, thereby forming an oxide film.

A twenty-ninth aspect of the present invention is directed to a method of manufacturing a semiconductor device comprising a semiconductor layer, a plurality of semiconductor elements formed on the semiconductor layer, and an isolation film provided in a surface of the semiconductor layer, the semiconductor elements being electrically isolated from each other by the isolation film, the method comprising the steps of (a) providing a first oxide film, a nitride film and a second oxide film on the semiconductor layer, (b) selectively removing the first oxide film, the nitride film and the second oxide film, thereby forming a laminated film of a lower oxide film, the nitride film and an upper oxide film in a position where the isolation film is to be formed, and (c) epitaxially growing the semiconductor layer, thereby burying the isolation film in the surface of the semiconductor layer thus grown after the step (b).

A thirtieth aspect of the present invention is directed to a method of manufacturing a semiconductor device comprising an SOI substrate including a silicon substrate, a buried oxide film provided on the silicon substrate and an SOI layer provided on the buried oxide film, a plurality of semiconductor elements formed on the SOI layer, and an isolation film provided in a surface of the SOI layer, the semiconductor elements being electrically isolated from each other by the isolation film, the method comprising the steps of (a) selectively removing the SOI layer so as not to reach the buried oxide film and forming a partial trench to leave the SOI layer thereunder, (b) selectively removing the SOI layer in the partial trench and forming a complete trench reaching the buried oxide film penetrating through the SOI layer, (c) forming an internal wall insulating film covering internal walls of the complete trench and the partial trench, (d) forming a polysilicon film to fill in the complete trench and the partial trench, (e) selectively removing the polysilicon film, thereby forming an internal polysilicon film restrictively remaining in the partial trench, and (f) covering the internal polysilicon film and surrounding the internal polysilicon film together with the internal wall insulating film, thereby forming an upper insulating film for electrically insulating the internal polysilicon film.

A thirty-first aspect of the present invention is directed to a method of manufacturing a semiconductor device comprising a semiconductor layer, a plurality of semiconductor elements formed on the semiconductor layer, and an isolation film provided in a surface of the semiconductor layer, the semiconductor elements being electrically isolated from each other by the isolation film, (a) forming the isolation film and then implanting an impurity ion such that a PN junction portion is formed in the semiconductor layer provided under the isolation film, thereby forming two semiconductor regions of different conductivity types, and (b) implanting an ion from above the isolation film, thereby forming a local crystal defect region in the vicinity of the PN junction portion on at least one of sides of the two semiconductor regions.

A thirty-second aspect of the present invention is directed to the method of manufacturing a semiconductor device, wherein the step (b) includes the step of implanting an impurity ion of the same conductivity type as the conductivity type of the semiconductor region having the crystal defect region formed therein.

A thirty-third aspect of the present invention is directed to the method of manufacturing a semiconductor device, wherein the step (b) includes the step of implanting an impurity ion of a different conductivity type from the conductivity type of the semiconductor region having the crystal defect region formed therein.

A thirty-fourth aspect of the present invention is directed to a method of manufacturing a semiconductor device comprising a semiconductor layer, a plurality of semiconductor elements formed on the semiconductor layer, and an isolation film provided in a surface of the semiconductor layer, the semiconductor elements being electrically isolated from each other by the isolation film, the semiconductor elements including a MOS transistor, the method comprising the steps of (a) forming the isolation film and then selectively forming a gate electrode and a gate insulating film in the MOS transistor on the semiconductor layer, and (b) covering a whole surface including the gate electrode and the gate insulating film with a nitride film and then selectively removing them, thereby leaving the nitride film as a side wall spacer on side surfaces of the gate electrode and the gate insulating film and leaving the nitride film also in a position opposed to a top of the semiconductor layer with the isolation film interposed therebetween to form an upper nitride film.

A thirty-fifth aspect of the present invention is directed to the method of manufacturing a semiconductor device, wherein the step (b) includes the steps of covering the whole surface with a first nitride film and then selectively removing the first nitride film, thereby forming a first side wall spacer on the side surfaces of the gate electrode and the gate insulating film and leaving the first nitride film also on the isolation film to form a first upper nitride film, and covering a whole surface having the first side wall spacer and the first upper nitride film with a second nitride film and then selectively removing the second nitride film, thereby forming a second side wall spacer covering the first side wall spacer and leaving the second nitride film also on the first upper nitride film to form a second upper nitride film.

A thirty-sixth aspect of the present invention is directed to a method of manufacturing a semiconductor device comprising a semiconductor layer, a plurality of semiconductor elements formed on the semiconductor layer, and an isolation film provided in a surface of the semiconductor layer, the semiconductor elements being electrically isolated from each other by the isolation film, the method comprising the step of implanting a silicon ion or an oxygen ion in the isolation film and then carrying out annealing at a temperature of 1000 to 1400° C., thereby forming a plurality of silicon islands in the isolation film.

A thirty-seventh aspect of the present invention is directed to the semiconductor device, wherein the polysilicon film is connected to have a predetermined electric potential.

According to the first aspect of the present invention, the polysilicon film is provided in the position corresponding to the top of the PN junction portion on the isolation film across the two semiconductor regions. Therefore, a region where an unreacted metal layer remains as a residual metal in the formation of a silicide layer is restricted over the isolation film so that there can be a lower possibility that the residual metal might be diffused into the isolation film by a heat treatment in a process to reach an undesirable portion, for example, the PN junction portion. As a result, a silicide can be prevented from being formed in the PN junction portion and a junction leakage current can be prevented from being generated.

According to the second aspect of the present invention, the formation width of the polysilicon film is set to satisfy the equation of 0.5 Lg<Tst<20 Lg. Consequently, it is possible to obtain a polysilicon film capable of effectively preventing the residual metal from reaching an undesirable portion.

According to the third aspect of the present invention, the thickness of the polysilicon film is set to be equal to that of the gate polysilicon film. Consequently, the polysilicon film can be formed at the step of forming the gate electrode so that the manufacturing process can be simplified.

According to the fourth aspect of the present invention, the thickness of the polysilicon film is set to be smaller than that of the gate polysilicon film. Consequently, an internal residual stress is more relieved than that in the case in which the thickness of the polysilicon film is equal to or greater than that of the gate polysilicon film. Thus, a characteristic can be stabilized.

According to the fifth aspect of the present invention, the polysilicon film is provided along the PN junction portion. Consequently, a silicide can be effectively prevented from being formed in all the regions of the PN junction portion and a junction leakage current can be prevented from being generated.

According to the sixth aspect of the present invention, the polysilicon film having a substantially uniform thickness is provided in the position corresponding to the top of the PN junction portion in the isolation film across the two semiconductor regions. Therefore, even if an unreacted metal layer remains as a residual metal on the isolation film in the formation of the silicide layer and is diffused into the isolation film by the heat treatment in the process, it reaches the polysilicon film and then reacts to the polysilicon film to form a silicide. Therefore, it is possible to prevent the residual metal from reaching the PN junction portion of the two well regions, for example. Moreover, the residual metal can be prevented from reaching another PN junction portion in the semiconductor layer, for example, a PN junction portion of a well region and a source-drain region, a silicide can be prevented from being formed in the PN junction portion and the junction leakage current can be prevented from being generated.

According to the seventh aspect of the present invention, it is possible to obtain a more realistic structure of the isolation film having the polysilicon film therein.

According to the eighth aspect of the present invention, it is possible to obtain a more realistic and simplified structure of the isolation film having the polysilicon film therein.

According to the ninth aspect of the present invention, the nitride film having a substantially uniform thickness is provided in the position corresponding to the top of the PN junction portion in the isolation film across the two semiconductor regions. Therefore, even if an unreacted metal layer remains as a residual metal on the isolation film in the formation of the silicide layer and is diffused into the isolation film by the heat treatment in the process, it can be prevented from being further diffused after reaching the nitride film. Therefore, it is possible to prevent the residual metal from reaching the PN junction portion of the two well regions, for example. Moreover, the residual metal can be prevented from reaching another PN junction portion in the semiconductor layer, for example, a PN junction portion of a well region and a source-drain region, a silicide can be prevented from being formed in the PN junction portion and the junction leakage current can be prevented from being generated.

According to the tenth aspect of the present invention, the isolation film has such a structure that the complete trench and the partial trench are provided continuously, and the polysilicon film is provided to fill in the complete trench and to be extended over the bottom face of the partial trench. Therefore, even if an unreacted metal layer remains as a residual metal on the isolation film in the formation of the silicide layer and is diffused into the isolation film by the heat treatment in the process, it reaches the polysilicon film and then reacts to the polysilicon film to form a silicide. Therefore, it is possible to prevent the residual metal from reaching the PN junction portion of the two well regions in the semiconductor layer, for example. Moreover, the residual metal can be prevented from reaching another PN junction portion in the semiconductor layer, for example, a PN junction portion of a well region and a source-drain region, a silicide can be prevented from being formed in the PN junction portion and the junction leakage current can be prevented from being generated.

According to the eleventh aspect of the present invention, the polysilicon film is restrictively provided in the partial trench and is not protruded toward the outside of the isolation film. Therefore, it is possible to prevent drawbacks from being caused by a defective insulation.

According to the twelfth aspect of the present invention, the local crystal defect region is provided along the PN junction in the vicinity of the PN junction portion on at least one of sides in the two semiconductor regions. Therefore, even if an unreacted metal layer remains as a residual metal on the isolation film in the formation of the silicide layer and is diffused into the isolation film by the heat treatment in the process, the residual metal converges in the crystal defect region constituting the gettering region and can be prevented from reaching the PN junction portion of the two well regions in the semiconductor layer, for example. Moreover, the residual metal can be prevented from reaching another PN junction portion in the semiconductor layer, for example, a PN junction portion of a well region and a source-drain region, a silicide can be prevented from being formed in the PN junction portion and the junction leakage current can be prevented from being generated.

According to the thirteenth aspect of the present invention, the crystal defect region is formed by introducing the impurity of the same conductivity type as the conductivity type of the semiconductor region in a relatively high concentration. Therefore, it is possible to reduce the influence on the well region through the impurity introduction.

According to the fourteenth aspect of the present invention, the crystal defect region is formed by introducing the impurity of a different conductivity type from the conductivity type of the semiconductor region in a relatively high concentration. Therefore, it is possible to increase the degree of freedom in selection of the method of forming the crystal defect region.

According to the fifteenth aspect of the present invention, there is provided the first polysilicon film buried to penetrate through the vicinity of the PN junction portion on at least one of sides in the two semiconductor regions and through the buried oxide film. Therefore, even if an unreacted metal layer remains as a residual metal on the isolation film in the formation of the silicide layer and is diffused into the isolation film by the beat treatment in the process, it reaches the first polysilicon film and then reacts to the first polysilicon film to form a silicide. Therefore, it is possible to prevent the residual metal from reaching the PN junction portion of the two well regions, for example.

According to the sixteenth aspect of the present invention, there is further provided the second polysilicon film buried to penetrate through the source-drain region adjacent to the isolation film and through the buried oxide film. Therefore, even if an unreacted metal layer remains as a residual metal on the isolation film in the formation of the silicide layer and is diffused into the isolation film by the heat treatment in the process, it reaches the second polysilicon film and then reacts to the second polysilicon film. Consequently, the residual metal can be prevented from reaching a PN junction portion of a well region and a source-drain region, a silicide can be prevented from being formed in the PN junction portion and the junction leakage current can be prevented from being generated.

According to the seventeenth aspect of the present invention, the first and second local crystal defect regions are provided in the vicinity of the interface between the silicon substrate and the buried oxide film under the first and second polysilicon films. In addition to an original gettering effect of the silicon substrate;, therefore, the first and second crystal defect regions act as gettering sites. Consequently, the gettering effect can be enhanced.

According to the eighteenth aspect of the present invention, the upper nitride film is provided in the position corresponding to the top of the PN junction portion on the isolation film across the two semiconductor regions. Therefore, a region where an unreacted metal layer remains as a residual metal in the formation of a silicide layer is restricted over the isolation film so that there can be a lower possibility that the residual metal might be diffused into the isolation film by a heat treatment in a process to reach an undesirable portion, for example, the PN junction portion. Moreover, even if an unreacted metal layer remains as a residual metal on the isolation film in the formation of the silicide layer and is diffused into the isolation film by the heat treatment in the process, most of metal atoms are deposited in the upper nitride film or on an interface between the upper nitride film and the isolation film and are not diffused into the isolation film. As a result, a silicide can be prevented from being formed in the PN junction portion and the junction leakage current can be prevented from being generated.

According to the nineteenth aspect of the present invention, the thickness of the upper nitride film is substantially equal to that of the side wall spacer of the MOS transistor. Consequently, the upper nitride film can be formed at the step of forming the side wall spacer so that the manufacturing process can be simplified.

According to the twentieth aspect of the present invention, the upper nitride film and the side wall spacer are caused to have a two-layered structure and the respective first layers and the respective second layers are caused to have thicknesses substantially equal to each other. Consequently, the upper nitride film to be the first layer can be formed at the step of forming the first layer of the side wall spacer, the source-drain region is then formed, and the upper nitride film to be the second layer is thereafter formed at the step of forming the second layer of the side wall spacer. Thus, the total formation width of the side wall spacer can be increased and drawbacks can be prevented from being caused by the abnormal growth of the silicide film. In addition, the extension region to be generally formed under the first layer of the side wall spacer can be shortened, a parasitic resistance can be reduced and the characteristic of the MOS transistor is not deteriorated.

According to the twenty-first aspect of the present invention, a plurality of silicon islands are provided in the position corresponding to the top of the PN junction portion in the isolation film across the two semiconductor regions. Therefore, even if an unreacted metal layer remains as a residual metal on the isolation film in the formation of the silicide layer and is diffused into the isolation film by the heat treatment in the process, the residual metal converges in the silicon islands and can be prevented from reaching the PN junction portion of the two well regions, for example. Moreover, the residual metal can be prevented from reaching another PN junction portion in the semiconductor layer, for example, a PN junction portion of a well region and a source-drain region, a silicide can be prevented from being formed in the PN junction portion and the junction leakage current can be prevented from being generated.

According to the twenty-second aspect of the present invention, it is possible to obtain an SOI semiconductor device which is affected by metal pollution with difficulty.

According to the twenty-third aspect of the present invention, the unreacted metal layer is removed and the surface of the isolation film is removed by a predetermined thickness after the heat treatment for siliciding in the formation of the silicide layer. Therefore, the residual metal can be prevented from remaining on the isolation film and the residual metal can be prevented from being diffused into the isolation film by the heat treatment in the process and being silicided in an undesirable portion. For example, a silicide can be prevented from being formed in a PN junction portion and a junction leakage current can be prevented from being generated. Moreover, it is possible to prevent the silicide from being formed in the vicinity of an interface between the gate insulating film and the silicon layer. Thus, reliability of the gate insulating film can be maintained.

According to the twenty-fourth aspect of the present invention, the wet etching and the dry etching are carried out through two-time etching and hydrofluoric acid is used as the etching agent at the step (c-2). Consequently, the isolation film is removed together. Thus, it is possible to reliably prevent the residual metal from remaining on the isolation oxide film.

According to the twenty-fifth aspect of the present invention, portions other than the top of the isolation film are protected by a mask. Therefore, only the top of the isolation film is removed and other portions can be protected for the second removal of the unreacted metal layer.

According to the twenty-sixth aspect of the present invention, the isolation film having the polysilicon film therein can be obtained relatively easily.

According to the twenty-seventh aspect of the present invention, it is possible to obtain such a structure that the polysilicon film is insulated therein.

According to the twenty-eighth aspect of the present invention, it is possible to relatively easily obtain such a structure that the polysilicon film is insulated therein.

According to the twenty-ninth aspect of the present invention, it is possible to relatively easily obtain the isolation film having the nitride film therein.

According to the thirtieth aspect of the present invention, it is possible to relatively easily obtain the isolation film having such a structure that the complete trench and the partial trench are provided continuously, and having the internal polysilicon film provided to fill in the complete trench and to be extended over the bottom face of the partial trench.

According to the thirty-first aspect of the present invention, it is possible to obtain such a structure that the local crystal defect region is provided along the PN junction in the vicinity of the PN junction portion on at least one of sides in the two semiconductor regions.

According to the thirty-second aspect of the present invention, the crystal defect region is formed by introducing the impurity of the same conductivity type as the conductivity type of the semiconductor region in a relatively high concentration. Therefore, it is possible to reduce the influence on the well region through the impurity introduction.

According to the thirty-third aspect of the present invention, the crystal defect region is formed by introducing the impurity of a different conductivity type from the conductivity type of the semiconductor region in a relatively high concentration. Therefore, it is possible to increase the degree of freedom in selection of the method of forming the crystal defect region.

According to the thirty-fourth aspect of the present invention, it is possible to obtain such a structure that the upper nitride film is provided on the isolation film at the same step as the step of forming the side wall spacer of the MOS transistor.

According to the thirty-fifth aspect of the present invention, the first upper nitride film can be formed at the step of forming the first side wall spacer, the source-drain region can be then formed and the second upper nitride film is thereafter formed at the step of forming the second side wall spacer. Consequently, the total formation width of the side wall spacer can be increased and drawbacks can be prevented from being caused by-the abnormal growth of the silicide film. In addition, the extension region to be generally formed under the first side wall spacer can be shortened, a parasitic resistance can be reduced and the characteristic of the MOS transistor is not deteriorated.

According to the thirty-sixth aspect of the present invention, it is possible to obtain the isolation film having a plurality of silicon islands therein.

According to the thirty-seventh aspect of the present invention, the polysilicon film is connected to have the predetermined electric potential. Therefore, the isolation oxide film can be caused to function as a field shield isolating structure.

In order to solve the above-mentioned problems, it is an object of the present invention to provide a semiconductor device capable of preventing drawbacks from being caused by metal pollution and a method of manufacturing the semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 24 is a sectional view illustrating a structure of a semiconductor device according to a first variant of the third embodiment of the present invention, FIGS. 25 to 27 are sectional views illustrating a step of manufacturing a semiconductor device according to the first variant of the third embodiment of the present invention, FIGS. 62 and 65 are sectional views illustrating a conventional step of manufacturing a semiconductor device having a silicide process.

DESCRIPTION OF THE PREFERRED EMBODIMENTS

<A. First Embodiment>

<A-1. Manufacturing Method>

Figure 10:
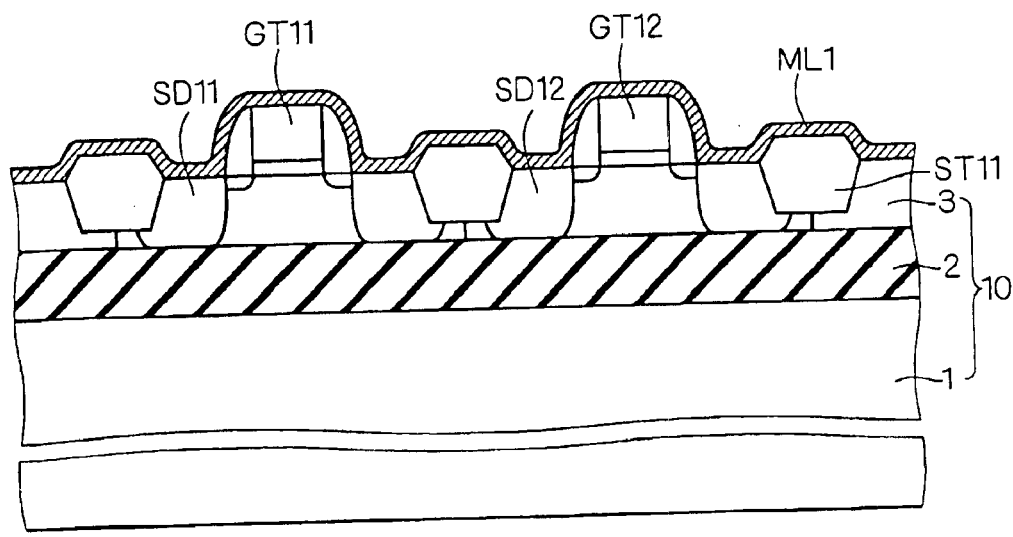
Figure 11:
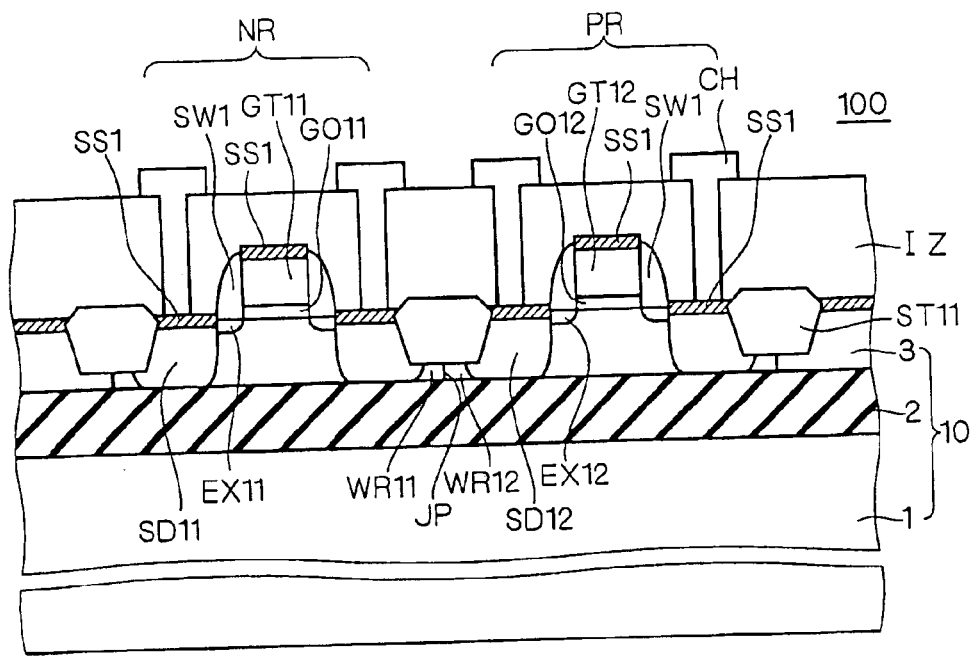
FIG. 11 is a sectional view illustrating a structure of a semiconductor device according to the first embodiment of the present invention.

With reference to FIGS. 1 to 15, a first embodiment of the present invention will be described. FIGS. 1 to 11 are sectional views showing a step of manufacturing an SOI device 100 in order. A structure of the SOI device 100 is shown in FIG. 11 illustrating a final step.

In the following description of first to ninth embodiments, a silicon oxide film will be simply referred to as an oxide film and a silicon nitride film will be simply referred to as a nitride film.

Figure 1:
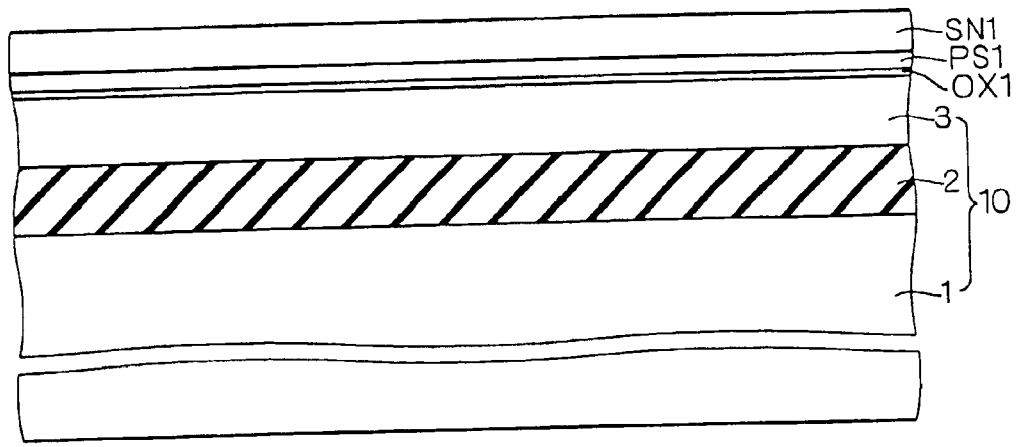
FIGS. 1 to 10 are sectional views illustrating a step of manufacturing a semiconductor device according to a first embodiment of the present invention.

As shown in FIG. 1, first of all, an SOI substrate 10 in which a buried oxide film 2 and an SOI layer 3 are provided on a silicon substrate 1 is prepared. The SOI substrate 10 may be formed by a SIMOX method, a wafer bonding method or any forming method. Usually, the SOI layer 3 has a thickness of 50 to 200 nm and the buried oxide film 2 has a thickness of 100 to 400 nm.

Then, an oxide film OX1 (a pad oxide film) having a thickness of 10 to 30 nm (100 to 300 angstroms) is formed on the SOI layer 3 at a temperature of 800° C. by a CVD method. The oxide film may be formed by thermally oxidizing the SOI layer 3 at a temperature of 800 to 1000° C.

Next, a polycrystalline silicon layer (hereinafter referred to as a polysilicon film) PS1 having a thickness of 10 to 100 nm (100 to 1000 angstroms) is formed on the oxide film OX1 by the CVD method.

Subsequently, a nitride film SN1 having a thickness of 30 to 200 nm (300 to 2000 angstroms) is formed on the polysilicon film PS1 at a temperature of approximately 700° C. by the CVD method.

Figure 2:
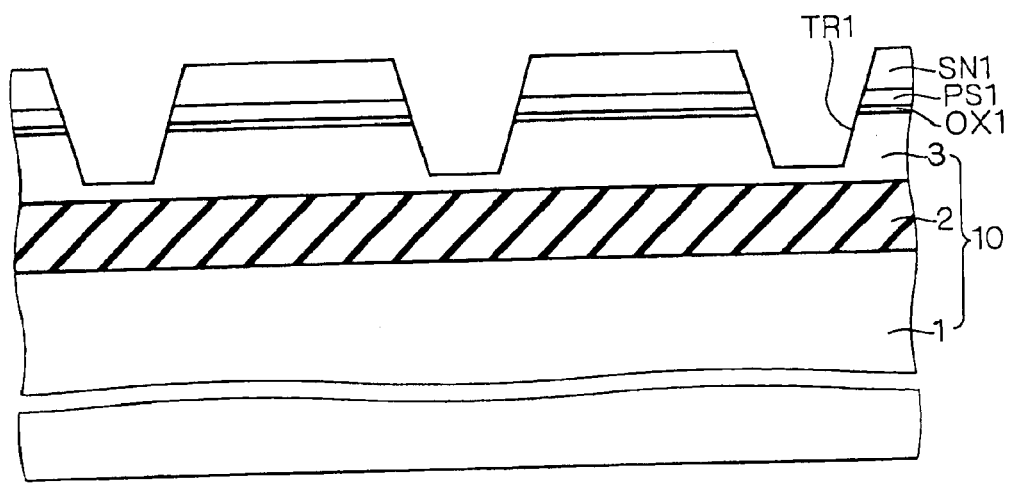

Then, a resist mask is patterned according to a pattern of a trench isolation oxide film defining an active region, and the nitride film SN1 and the polysilicon film PS1 are selectively removed through dry etching or wet etching and the SOI layer 3 is subjected to trench etching by using the nitride film SN1 as an etching mask. Thus, a trench TR1 is formed as shown in FIG. 2.

Figure 3:
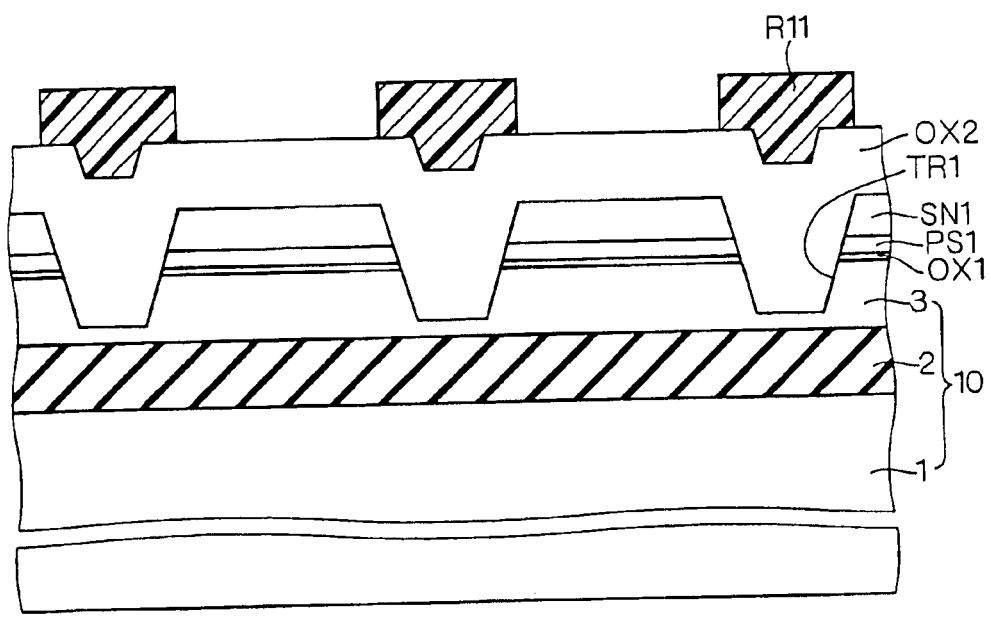

At a step shown in FIG. 3, next, an internal wall of the trench TR1 is oxidized and an oxide film OX2 is filled therein. The oxide film OX2 is formed by an HDP (High-Density-Plasma)-CVD method, for example. In the HDP-CVD method, a plasma having a higher density than that of a general plasma CVD by one to two digits is used and an oxide film is deposited while sputtering and deposition are carried out at the same time. Consequently, an oxide film of good quality can be obtained.

The oxide film OX2 has a concavo-convex portion reflecting a step shape of the trench TR1, and a resist mask R11 patterned to cover the concavo-convex portion is formed on the oxide film OX2.

Figure 4:
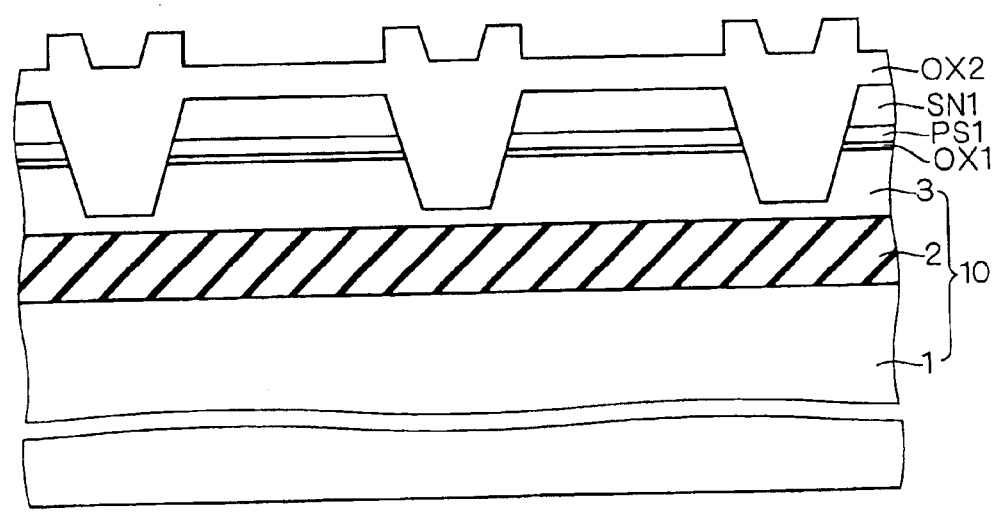

The resist mask R11 has a great thickness over the nitride film SN1 and is provided to reduce a thickness of the oxide film OX2 in a flat region within a wide range through etching. FIG. 4 shows a state in which the thickness of the oxide film OX2 is reduced.

Such a processing is carried out in order to enhance uniformity of the thickness of the oxide film OX2 after flattening when the oxide film OX2 is to be flattened through a CMP (Chemical Mechanical Polishing) treatment to be performed later.

Figure 5:
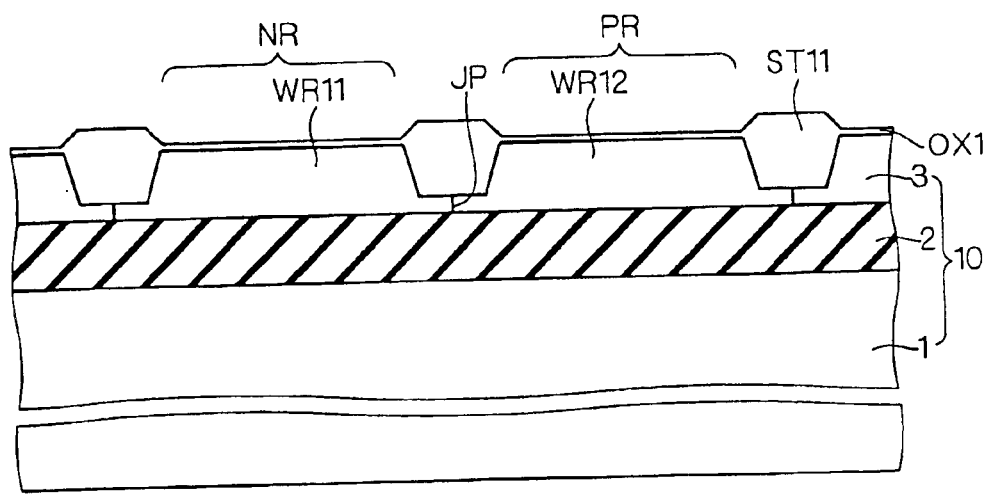

At a step shown in FIG. 5, next, the oxide film OX2 is polished and flattened by using the nitride film SN1 as a stopper through the CMP treatment, and the nitride film SN1 and the polysilicon film PS1 are then removed by wet etching or dry etching. Consequently, a trench isolation oxide film ST11 to be an isolating film is formed.

Subsequently, a region NR where an NMOS transistor is to be formed and a region PR where a PMOS transistor is to be formed are defined on the SOI layer 3 through the trench isolation oxide film ST11. A P-type impurity ion such as B (boron) is implanted into the region NR to form a P-type well region WR11, and an N-type impurity ion such as P (phosphorus) or As (arsenic) is implanted into the region PR to form an N-type well region WR12. Consequently, a PN junction portion JP of the P-type well region WR11 and the N-type well region WR12 is formed in the SOI layer 3.

Since the trench isolation oxide film ST11 is provided with a P-type well region WR11 and an N-type well region WR12 thereunder and does not electrically isolate elements completely from each other, it is also referred to as a shallow trench isolation oxide film (ST1) and a partial isolation oxide film (PT1) in the same manner as the trench isolation oxide film ST1.

Figure 6:
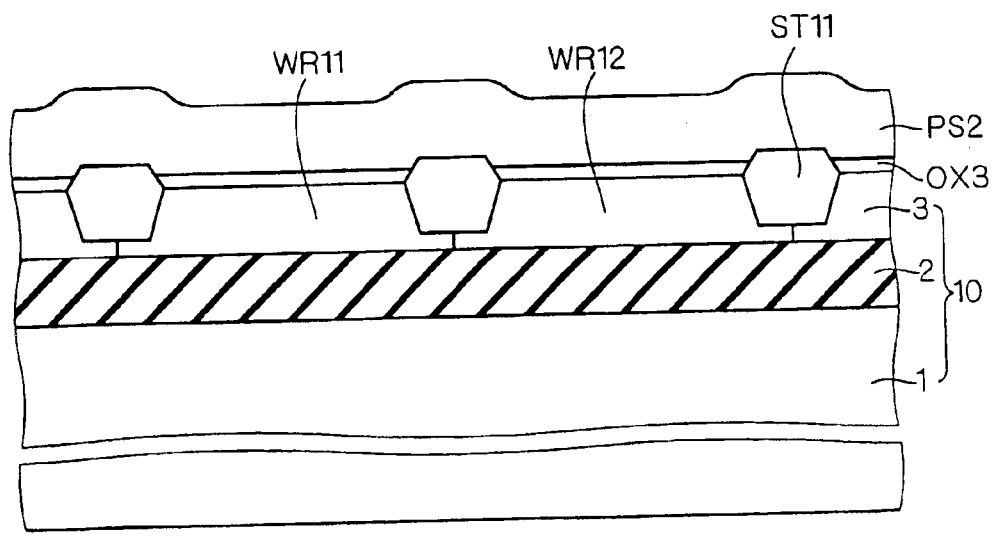

At a step shown in FIG. 6, next, the oxide film OX1 is removed. Then, an oxide film OX3 to be a gate oxide film is formed in a thickness of 1 to 4 nm (10 to 40 angstroms) over a whole surface, and furthermore, a polysilicon film PS2 to be a gate electrode is formed in a thickness of 100 to 400 nm (1000 to 4000 angstroms) thereon.

After the oxide film OX3 is formed, an impurity such as B (boron) or In (indium) is channel implanted into the region NR and an impurity such as P (phosphorus), As (arsenic) or Sb (antimony) is channel implanted into the region PR to set a threshold voltage of a transistor. After the channel implantation, a heat treatment is carried out for a short time in order to achieve implantation damage recovery.

Figure 7:
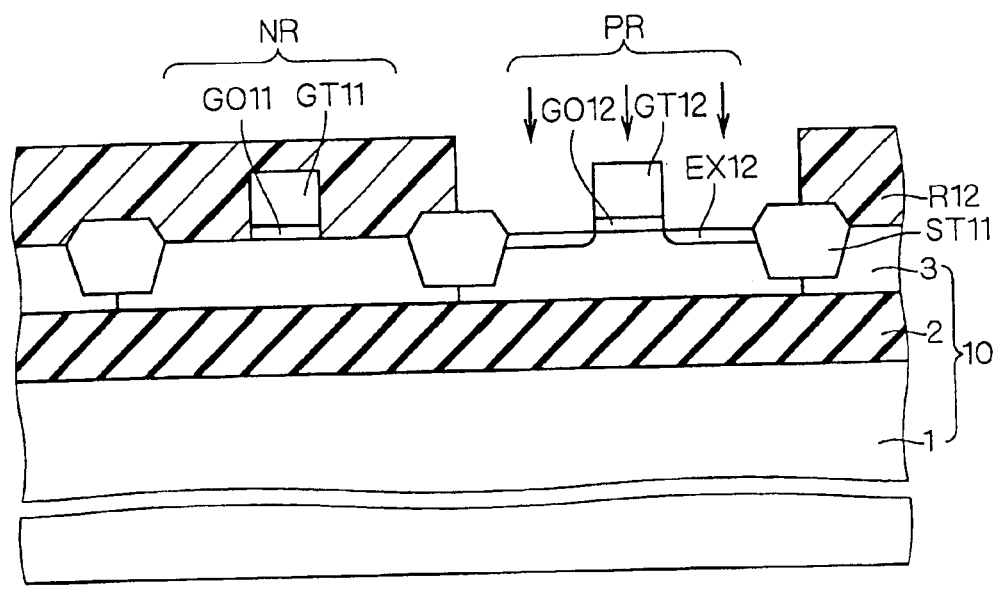

At a step shown in FIG. 7, next, the oxide film OX3 and the polysilicon film PS2 are subjected to patterning by using a mask for gate formation, and a gate oxide film GO11 and a gate electrode GT11, and a gate oxide film GO12 and a gate electrode GT12 are selectively formed on the SOI layer 3 in the regions NR and PR, respectively.

Then, a resist mask R12 is formed such that the region PR is to be an opening, and an impurity of the same conductivity type as that of a source-drain region in the SOI layer which is to be formed at a subsequent step, for example, a B ion is implanted by using the gate electrode GT12 as a mask. Thus, an extension region EX12 is formed in self-alignment.

Figure 8:
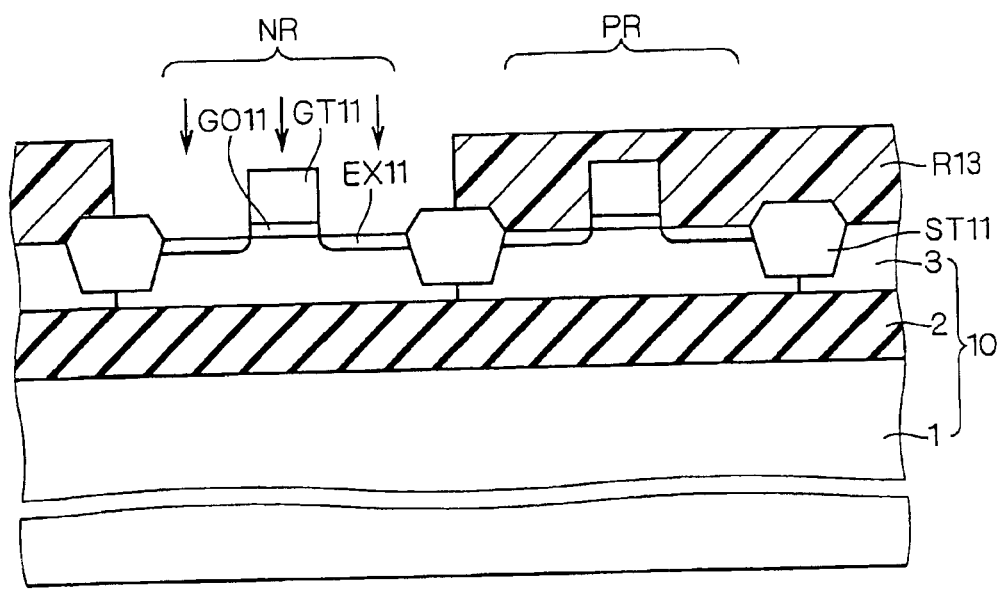

At a step shown in FIG. 8, subsequently, a resist mask R13 is formed such that the region NR is to be an opening, and an impurity of the same conductivity type as that of a source-drain region in the SOI layer which is to be formed at a subsequent step, for example, a P or As ion is implanted by using the gate electrode GT11 as a mask. Thus, an extension region EX11 is formed in self-alignment.

Both of the extension regions EX11 and EX12 are shallower diffusion regions than the source-drain region, and are formed by implanting the ion in a lower concentration than that of the source-drain region or substantially the same concentration as that of the source-drain region such that they act as a part of the source-drain region.

Figure 9:
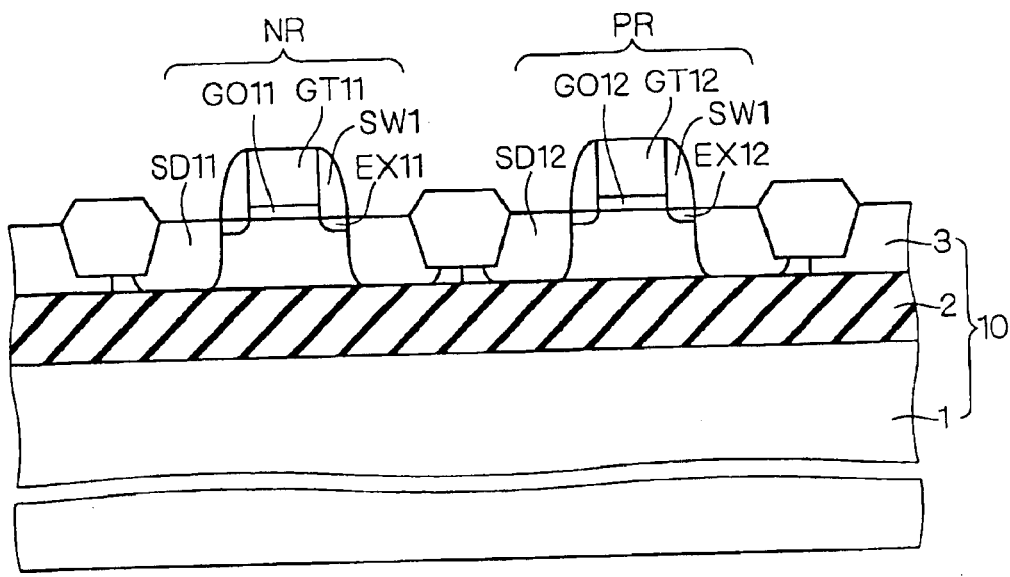

At a step shown in FIG. 9, next, a side wall spacer SW1 is formed on side surfaces of the gate electrodes GT11 and GT12 and a resist mask is provided such that the regions NR and PR are to be openings respectively in the same manner as the extension regions EX11 and EX12. In the region NR, for example, the P or As ion is implanted to form a source-drain region SD11 in self-alignment. In the region PR, for example, the B ion is implanted to form a source-drain region SD12 in self-alignment. In order to achieve implantation damage recovery and to activate the implanted ion, a heat treatment is carried out for a short time.

At a step shown in FIG. 10, subsequently, a metal layer ML1 constituted by Co or Ti is deposited in a thickness of 1 to 100 nm (10 to 1000 angstroms) over the whole surface through sputtering or the like, and annealing (first heat treatment) is carried out for 5 to 360 seconds at a temperature of 300 to 600° C. in a nitrogen atmosphere so that the metal layer ML1 provided on the source-drain regions SD11 and SD12 and the gate electrodes GT11 and GT12 are silicided. The metal layer ML1 is not silicided in a portion which is not provided in direct contact with the silicon layer and the polysilicon film, and reaction is not carried out in portions other than the source drain regions SD11 and SD12 and the gate electrodes GT11 and GT12.

Then, the unreacted metal layer ML1 is removed through the wet etching, for example. Consequently, a silicide layer SS1 is formed on the source-drain regions SD11 and SD12 and the gate electrodes GT11 and GT12.

Subsequently, annealing (second heat treatment) is carried out for 5 to 360 seconds at a temperature of 800 to 1200° C. in the nitrogen atmosphere to cause the silicide layer SS1 to have a stable structure.

As shown in FIG. 11, then, an interlayer insulating film IZ is formed on the SOI layer 3, and a plurality of contact portions CH reaching the silicide layer SS provided on the source-drain layers SD11 and SD12 through the interlayer insulating film IZ are formed so that the SOI device 100 is obtained.

A step of removing the unreacted metal layer ML1 which is a feature of the present embodiment will be described in detail with reference to FIGS. 12 and 13.

Figure 12:
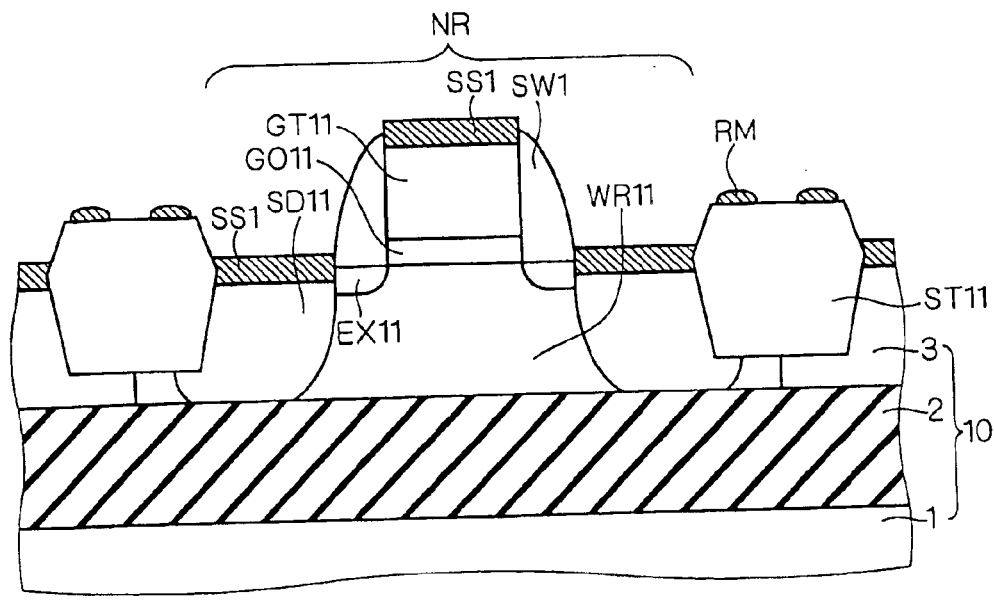
FIGS. 12 and 13 are sectional views illustrating a characteristic manufacturing process according to the first embodiment of the present invention.

FIG. 12 is a view showing the region NR in which the unreacted metal layer ML1 is removed through the wet etching.

Although most of the unreacted metal layer ML1 is removed through the wet etching, a metal RM slightly remains on the trench isolation oxide film ST11 in some cases. This is not restricted to a portion provided on the trench isolation oxide film ST11 but the metal RM also remains on the side wall spacer SW1 in some cases. In the following description, the case in which the residual metal RM is present on the trench isolation oxide film ST11 will be taken as an example.

When the residual metal RM is present, it is diffused into the trench isolation oxide film ST11 by a heat treatment in the process. In the case in which the residual metal RM forms a silicide on a surface of the silicon layer, a junction leakage is caused.

Conventionally, the unreacted metal layer ML1 is removed through one-time wet etching or dry etching. Therefore, there has been a high possibility that the residual metal RM might be present.

The present inventors have invented a method of removing the unreacted metal layer ML1 by a conventional method and carrying out the dry etching or wet etching on the condition that the trench isolation oxide film ST11 is slightly removed, thereby removing the residual metal RM together with a surface of the trench isolation oxide film ST11.

Although the etching has conventionally been carried out on the condition that the oxide film is not removed in order to remove the unreacted metal layer ML1, the present inventors have reached such a technical thought that the residual metal RM is removed together with the surface of the oxide film.

In order to remove the oxide film together, for example, it is preferable that hydrofluoric acid should be added to an etching agent. By regulating a concentration of the hydrofluoric acid and a time required for etching such that the amount of the oxide film to be removed is 2 to 50 nm (20 to 500 angstroms), it is possible to prevent the trench isolation oxide film ST11 and the side wall spacer SW from being removed excessively.

Figure 13:
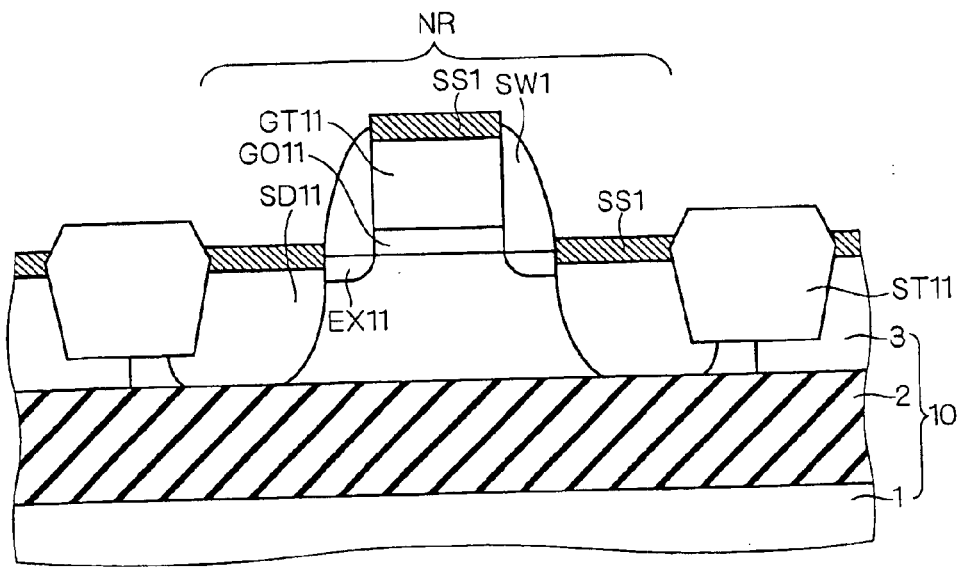

FIG. 13 shows a state in which the residual metal RM is removed. The residual metal RM is removed from a top of the trench isolation oxide film ST11 and the thickness of the trench isolation oxide film ST11 is also reduced slightly.

If the oxide film is subjected to the wet etching and is lifted off to completely remove the metal layer ML1 provided on the oxide film, the residual metal RM is not generated. By utilizing this process, a metal impurity diffused into the surface of the isolation oxide film by the first heat treatment can also be removed. Thus, the oxide film may be once subjected to the lift-off etching to suppress the generation of the residual metal RM.

<A-2. Function and Effect>

As described above, according to the first embodiment of the present invention, the unreacted metal layer ML1 which has not been silicided is removed twice after the first heat treatment for siliciding in the formation of the silicide layer, and the surface of the oxide film such as the trench isolation oxide film ST11 is removed together for the second removal. Therefore, it is possible to prevent the residual metal RM from remaining on the oxide film and to prevent the residual metal RM from being diffused into the oxide film by the heat treatment in the process and silicided in an undesirable portion. As a result, the silicide can be prevented from being formed in the PN junction portion and a junction leakage current can be prevented from being generated. Moreover, the silicide can be prevented from being formed in the vicinity of an interface between the gate insulating film and the silicon layer so that the reliability of the gate insulating film can be maintained.

<A-3. Variant>

In the removal of the residual metal RM described with reference to FIG. 13, in the case in which the oxide film to be removed is the trench isolation oxide film ST11, there is a possibility that the side wall spacer SW1 formed of the oxide film might be somewhat removed simultaneously even if anisotropic etching is used. Recently, the side wall spacer SW1 is formed of a nitride film in some cases. However, since the side wall spacer SW1 is often formed of an oxide film, it is desirable that the amount of removal should be reduced.

Figure 14:
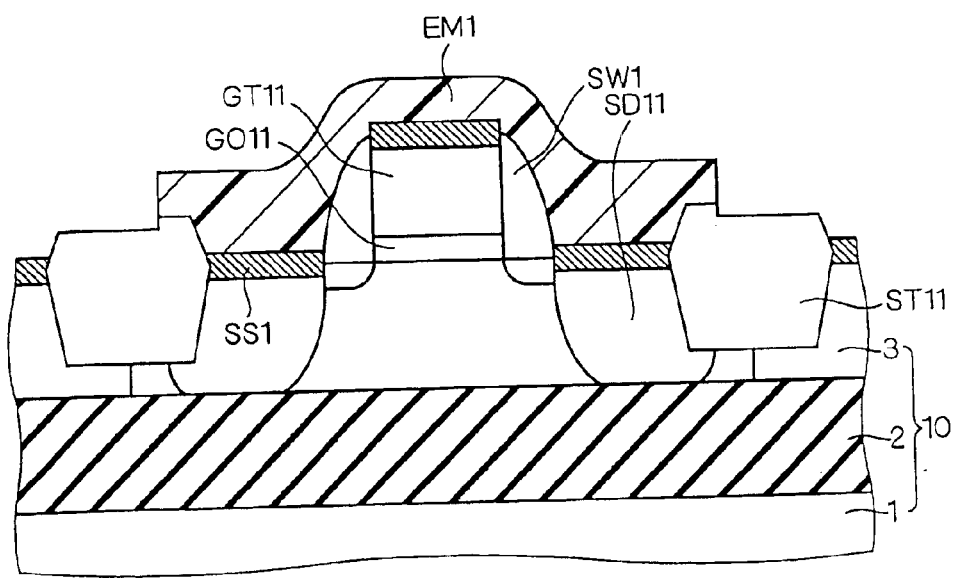
FIG. 14 is a sectional view illustrating a variant of a method of manufacturing a semiconductor device according to the first embodiment of the present invention.
Figure 15:
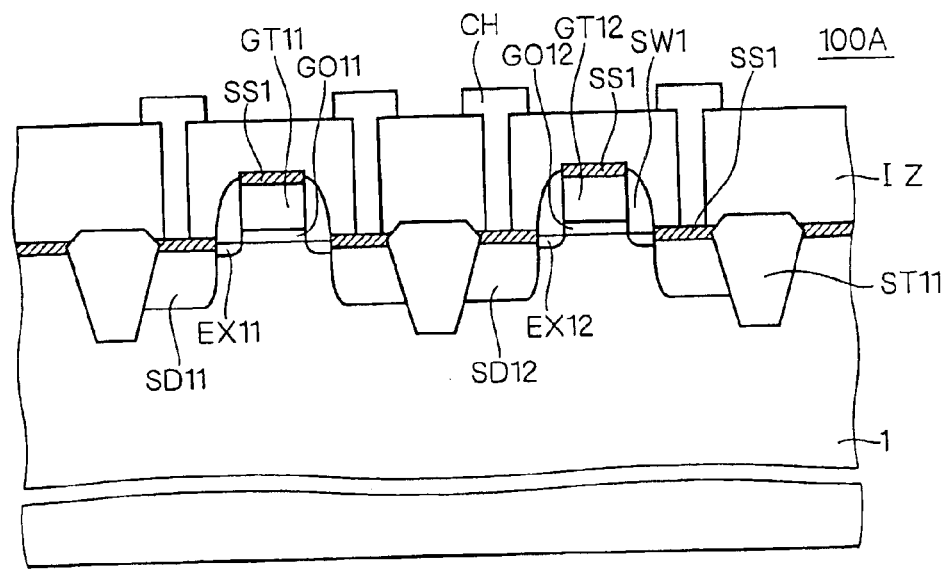
FIG. 15 is a sectional view showing an example in which the semiconductor device according to the first embodiment of the present invention is applied to a bulk device.

In order to protect the side wall spacer SW1, the trench isolation oxide film ST11 may be etched after portions other than the top of the trench isolation oxide film ST11 is covered with an etching mask EM1 as shown in FIG. 14.

The etching mask EM1 is provided on the gate electrode GT11, the side wall spacer SW1 and the source-drain region SD11. In FIG. 14, the etching mask EM1 is engaged with an edge portion of the trench isolation oxide film ST11. Consequently, the source-drain layer SD11 can be reliably prevented from being etched so that the damage of the etching can be avoided.

Accordingly, the surface of the trench isolation oxide film ST11 which is not covered with the etching mask EM1 is partially removed and the residual metal RM is also removed together.

While the SOI device 100 formed on the SOI substrate 10 has been described above, FIG. 15 shows a bulk device 100A formed on a bulk silicon substrate 1.

Although a deeper trench isolation oxide film ST12 is provided in place of the trench isolation oxide film ST11 in the bulk device 100A, other structures are the same as those of the SOI device 100 shown in FIG. 11. Therefore, the same structures have the same reference numerals and repetitive description will be omitted.

<B. Second Embodiment>
<B-1. Structure of Device>

A second embodiment according to the present invention will be described with reference to FIGS. 16 to 21.

Figure 16:
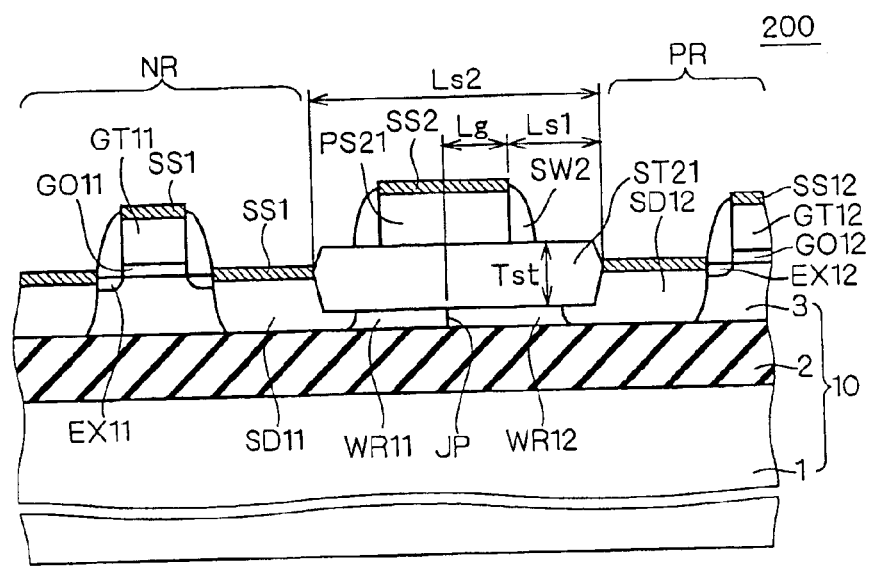
FIG. 16 is a sectional view illustrating a structure of a semiconductor device according to a second embodiment of the present invention.

FIG. 16 is a sectional view showing a structure of an SOI device 200 according to the second embodiment, and the same structures as those of the SOI device 100 described with reference to FIG. 11 have the same reference numerals and repetitive description will be omitted. For convenience, an interlayer insulating film IZ and a contact portion CH are not shown.

The SOI device 200 is different from the SOI device 100 in that a region NR and a region PR are defined by a trench isolation oxide film ST21, a polysilicon film PS21 (external polysilicon film) is selectively provided on the trench isolation oxide film ST21, a silicide layer SS2 is provided on the polysilicon film PS21, and a side wall spacer SW2 is provided on a side surface of the polysilicon film PS21.

The polysilicon film PS21 is provided in a position corresponding to a top of a PN junction portion JP of a P-type well region WR11 and an N-type well region WR12 in an SOI layer 3 across the two well regions.

With such a structure, a region where an unreacted metal layer remains as a residual metal is restricted in the formation of a silicide layer over the trench isolation oxide film ST21, and there is a lower possibility that the residual metal might be present and be diffused into the trench isolation oxide film ST21 due to a heat treatment in a process and reach an undesirable portion, for example, the PN junction portion JP.

Figure 17:
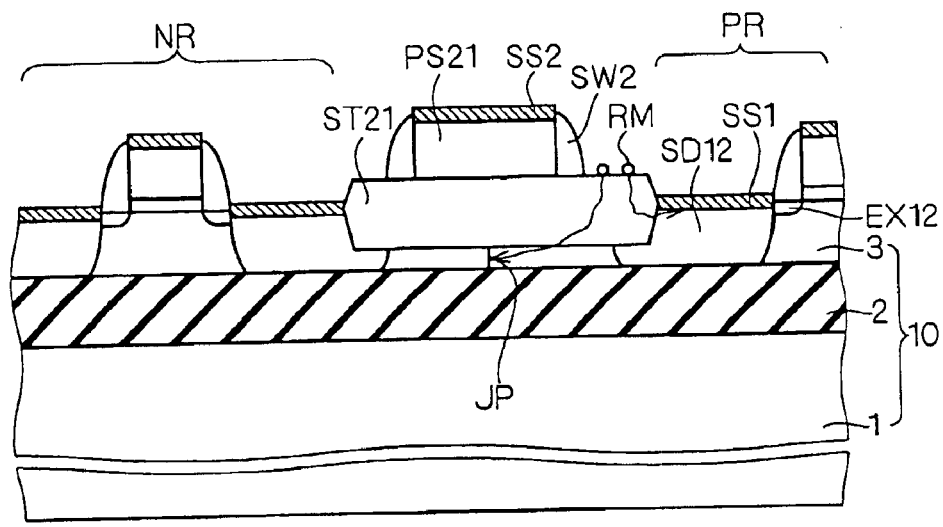
FIG. 17 is a sectional view illustrating effects of the semiconductor device according to the second embodiment of the present invention.

FIG. 17 typically shows a state in which a residual metal RM is diffused. In FIG. 17, the residual metal RM is present on the trench isolation oxide film ST21 at the region PR side and a distance from that position to the PN junction portion JP is great. When the distance is more increased, there is a lower possibility that the residual metal RM might reach the PN junction portion JP. Consequently, a silicide is formed in the PN junction portion JP so that a junction leakage current can be prevented from being increased. For the residual metal RM diffused in a direction of a source-drain region SD12, a silicide layer SS1 provided on the source-drain region SD12 becomes a gettering site. Therefore, it is possible to prevent drawbacks from being caused in the source-drain region SD12. The polysilicon film PS also functions as a gettering material.

In order to effectively obtain such an advantage, it is desirable that a formation width of the polysilicon film PS21 and that of the trench isolation oxide film ST21 should be limited.

For example, the formation width of the polysilicon film PS21 is determined by a thickness Tst of the trench isolation oxide film ST21.

More specifically, the formation width of the polysilicon film PS21 is set such that the relationship between a length Lg from a position in the polysilicon film PS21 positioned on an extension line in a vertical direction of the PN junction portion JP to an end of the polysilicon film PS21 and the thickness Tst of the trench isolation oxide film ST21 satisfies the following equation (1).

$$0.5\ Lg < Tst < 20\ Lg \qquad (1)$$

It is apparent that Lg>0 is set.

Moreover, a length of a region on the trench isolation oxide film ST21 which is not covered with the polysilicon film PS21 is also determined by the thickness Tst of the trench isolation oxide film ST21.

More specifically, the formation width of the polysilicon film PS21 or that of the trench isolation oxide film ST21 is set such that the relationship between a length Ls1 from an end of the polysilicon film PS21 to an end of the trench isolation oxide film ST21 and a thickness Tst of the trench isolation oxide film ST21 satisfies the following equation (2).

$$0.5\ Ls1 < Tst < 40\ Ls1 \qquad (2)$$

If the polysilicon film is not present on the trench isolation oxide film ST21, the formation width of the trench isolation oxide film ST21 is set such that the following equation (3) is satisfied based on the relationship with the thickness Tst of the trench isolation oxide film ST21.

$$0.5\ Ls2 < Tst < 30\ Ls2 \qquad (3)$$

<B-2. Manufacturing Method>

Figure 18:
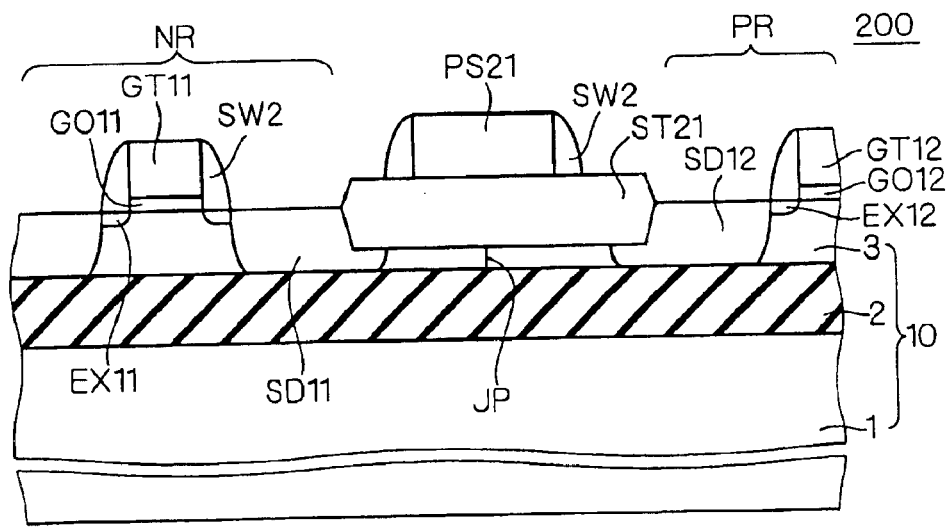
FIG. 18 is a sectional view illustrating a step of manufacturing the semiconductor device according to the second embodiment of the present invention.

A method of manufacturing the SOI device 200 will be described with reference to FIG. 18. The manufacturing method is basically the same as the method of manufacturing the SOI device 100 described with reference to FIGS. 1 to 11. In the method of manufacturing the SOI device 100, the oxide film OX3 to be the gate oxide film and the polysilicon film PS2 to be the gate electrode are formed over the whole surface at the step shown in FIG. 6 and the oxide film OX3 and the polysilicon film PS2 are subjected to patterning by using a mask for gate formation so that the gate oxide film GO11 and the gate electrode GT11, and the gate oxide film GO12 and the gate electrode GT12 are selectively formed on the SOI layer 3 in the regions NR and PR respectively at the step shown in FIG. 7. In the manufacture of the SOI device 200, however, a pattern of the mask for gate formation is changed such that the polysilicon film PS2 is also formed on the trench isolation oxide film ST21 to form the polysilicon film P21.

The extension regions EX11 and EX12, the source-drain regions SD11 and SD12 and the side wall spacer SW2 are formed through the same steps as those described with reference to FIGS. 7 to 9. As shown in FIG. 18, consequently, it is possible to obtain such a structure that the side wall spacer SW2 is formed on the side surface of the polysilicon film PS21.

Then, the silicide layer SS1 is formed in the source-drain regions SD11 and SD12 and the silicide layer SS2 is simultaneously formed on the polysilicon film PS21 through the same steps as those described with reference to FIG. 10. After the silicide layer SS2 is formed, the etching may be carried out only once at the step of removing an unreacted metal layer in the same manner as in the conventional art.

Thus, the polysilicon film PS21 provided on the trench isolation oxide film ST21 can also be formed on the trench isolation oxide film ST21 by changing the pattern of the mask for the gate formation such that the polysilicon film remains. Therefore, there is a characteristic in that a new step does not need to be added.

Figure 19:
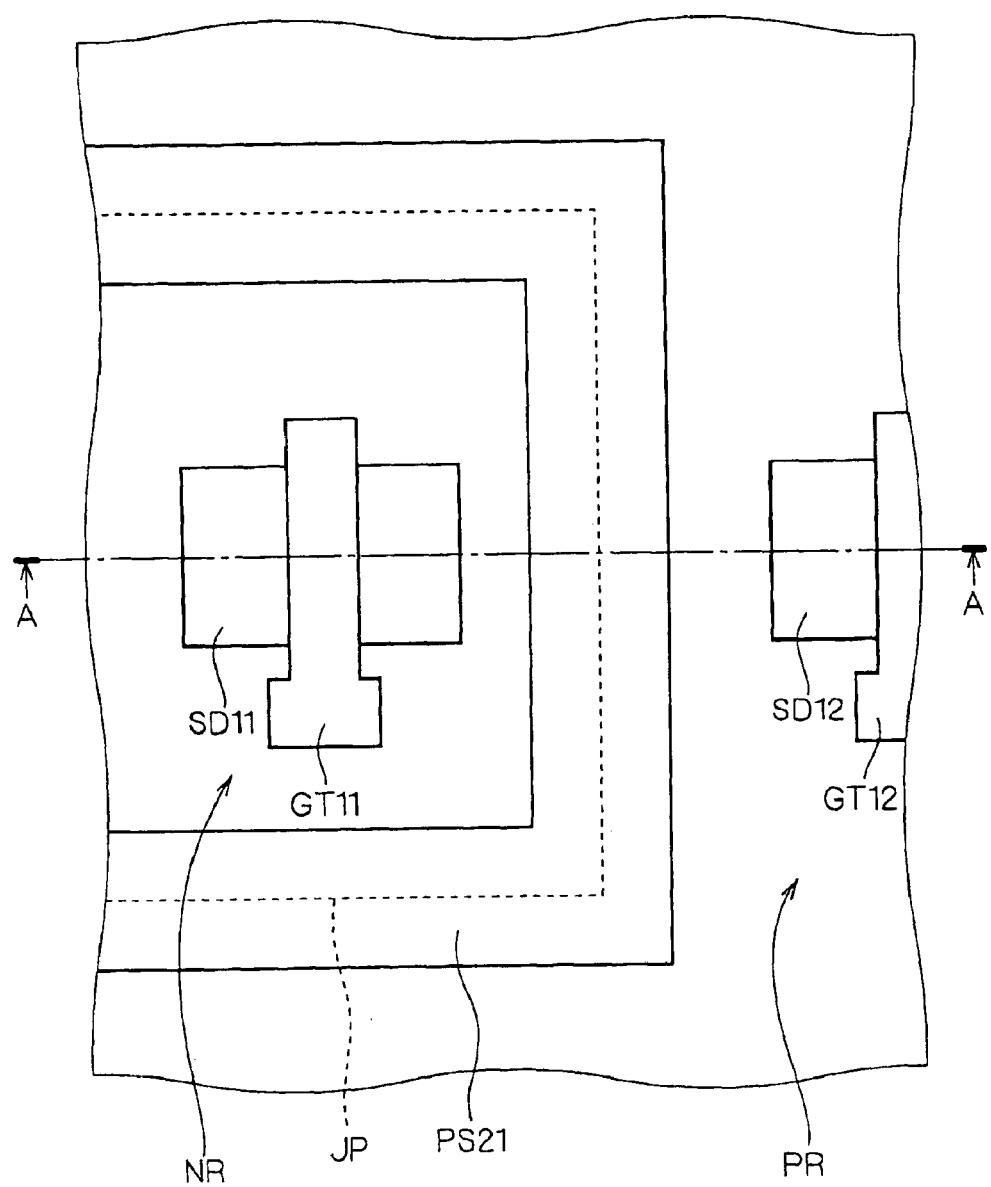
FIG. 19 is a plan view illustrating a structure of the semiconductor device according to the second embodiment of the present invention.

FIG. 19 shows a planar structure of the SOI device 200. In FIG. 19, a rectangular and annular trench isolation oxide film ST21 (not shown) defining a region NR is provided and the polysilicon film PS21 is provided thereon. A sectional structure taken along a line A—A in FIG. 19 corresponds to FIG. 16.

A PN junction portion JP in a well region is formed under the trench isolation oxide film ST21 (not shown). As shown in FIG. 19, therefore, it is effective that the polysilicon film PS21 is provided along the PN junction portion JP.

<B-3. Function and Effect>

As described above, according to the second embodiment of the present invention, the polysilicon film PS21 is provided on the trench isolation oxide film ST21 to cover the PN junction portion JP of the well region. Consequently, a region where the unreacted metal layer remains as a residual metal in the formation of the silicide layer is restricted over the trench isolation oxide film ST21.

Accordingly, also in the case in which the residual metal is present and is diffused into the trench isolation oxide film ST21 by a heat treatment in the process, it is possible to reduce a possibility that the residual metal might reach an undesirable portion, for example, the PN junction portion JP. As a result, a silicide can be prevented from being formed in the PN junction portion and a junction leakage current can be prevented from being generated.

<B-4. Variant>

While there has been described such a structure that the polysilicon film PS21 is provided on the trench isolation oxide film ST21 formed at the same step as the step of forming the gate electrode, a thick polysilicon film having substantially the same thickness as the thickness of an ordinary gate electrode is not required for suppressing metal pollution.

As described with reference to FIG. 6, the polysilicon film PS2 for the gate electrode is formed in a thickness of 100 to 400 nm, while it is sufficient that the polysilicon film PS21 provided on the trench isolation oxide film ST21 has a thickness of approximately 10 nm.

In order to implement such a structure, it is preferable that the polysilicon film PS21 should be formed on the trench isolation oxide film ST21 at a separate step before or after the gate forming step. Through a reduction in a thickness, a residual stress in the polysilicon film can be relieved and a characteristic thereof can be stabilized.

Figure 20:
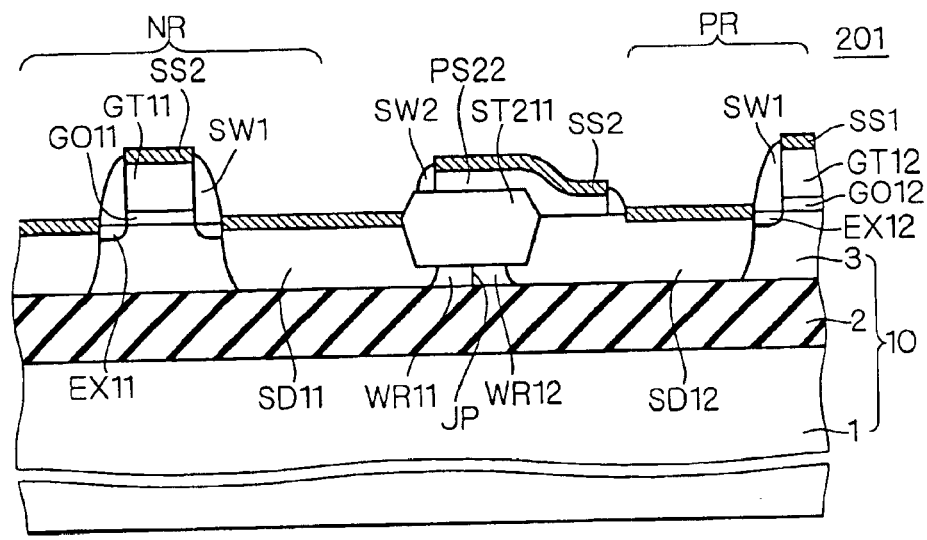
FIG. 20 is a sectional view illustrating a structure of the semiconductor device according to a variant of the second embodiment of the present invention.

FIG. 20 shows a structure of an SOI device 201 in which a polysilicon film PS22 is formed on the trench isolation oxide film ST21 at a separate step from the gate forming step.

The same structures as those of the SOI device 200 described with reference to FIG. 16 have the same reference numerals and repetitive description will be omitted.

The structure of the SOI device 201 is different from that of the SOI device 200 in that regions NR and PR are defined by a trench isolation oxide film ST211, a polysilicon film PS22 is selectively provided from a top of the trench isolation oxide film ST211 to that of a source-drain region SD12, and a side wall spacer SW2 is provided on a side surface of the polysilicon film PS22.

The polysilicon film PS22 is formed to have a smaller thickness than the thicknesses of gate electrodes GT11 and GT12.

As shown, moreover, also in the case in which a formation width of the trench isolation oxide film ST211 is small and the polysilicon film PS22 is protruded upward from the source-drain region SD12 and is extended, there is no problem if an electrical isolation from an adjacent transistor region can be achieved.

Figure 21:
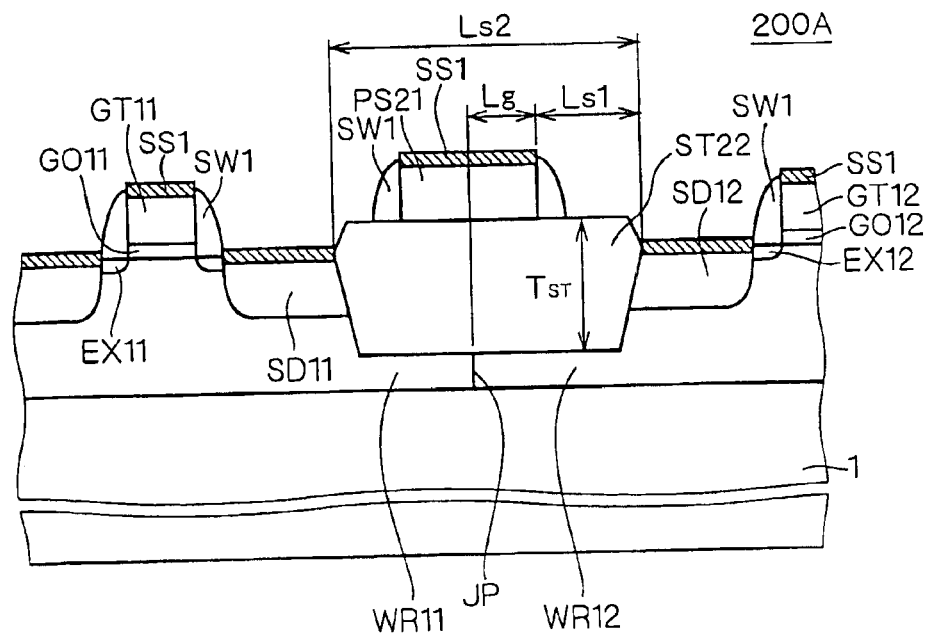
FIG. 21 is a sectional view showing an example in which the semiconductor device according to the second embodiment of the present invention is applied to a bulk device.

The SOI device 200 formed on an SOI substrate 10 has been described above. FIG. 21 shows a bulk device 200A formed on a bulk silicon substrate 1.

In the bulk device 200A, a deeper trench isolation oxide film ST22 is provided in place of the trench isolation oxide film ST21. Since other structures are the same as those of the SOI device 200 shown in FIG. 16, the same structures have the same reference numerals and repetitive description will be omitted.

<C. Third Embodiment>

<C-1. Structure of Device>

A third embodiment according to the present invention will be described with reference to FIGS. 22 to 35.

Figure 22:
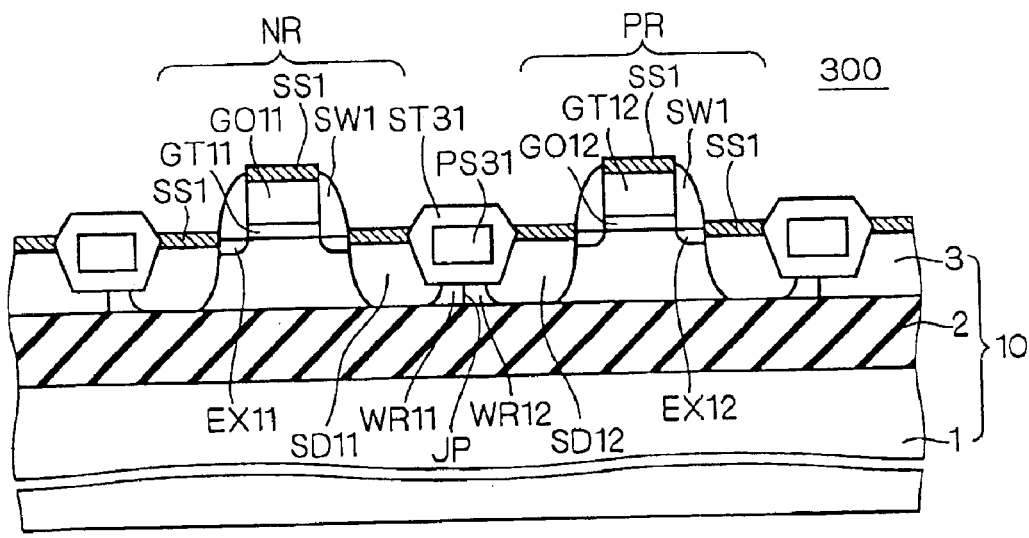
FIG. 22 is a sectional view illustrating a structure of a semiconductor device according to a third embodiment of the present invention.

FIG. 22 is a sectional view showing a structure of an SOI device 300 according to the third embodiment, and the same structures as those of the SOI device 100 described with reference to FIG. 11 have the same reference numerals and repetitive description will be omitted. For convenience, an interlayer insulating film IZ and a contact portion CH are not shown.

In the SOI device 300, a polysilicon film PS31 (an internal polysilicon film) is buried as a gettering material in a trench isolation oxide film ST31 provided on a PN junction portion JP of a well region, and is utilized as a gettering site for a residual metal.

More specifically, the polysilicon film PS31 having a thickness of approximately 50 nm (500 angstroms) in a position of a trench isolation oxide film ST31 shown in FIG. 22 which corresponds to a top of the PN junction portion JP of a P-type well region WR11 and an N-type well region WR12 in an SOI layer 3 across the two well regions.

It is apparent that the polysilicon film PS31 is effectively provided along the PN junction portion JP in the same manner as the polysilicon film PS21 described with reference to FIG. 19.

Figure 23:
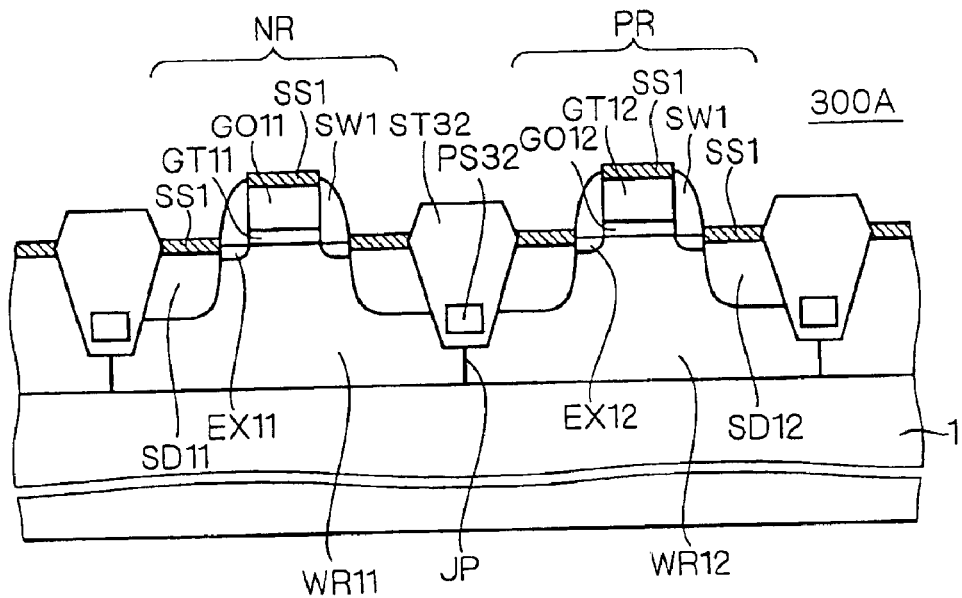
FIG. 23 is a sectional view showing an example in which the semiconductor device according to the third embodiment of the present invention is applied to a bulk device.

The SOI device 300 formed on an SOI substrate 10 has been described above. FIG. 23 shows a bulk device 300A formed on a bulk silicon substrate 1.

In the bulk device 300A, a deeper trench isolation oxide film ST32 is provided in place of the trench isolation oxide film ST31 and a polysilicon film PS32 (an internal polysilicon film) is provided in a position corresponding to the top of the PN junction portion JP in the trench isolation oxide film ST32 across the two well regions. Since other structures are the same as those of the SOI device 300 shown in FIG. 22, the same structures have the same reference numerals and repetitive description will be omitted.

<C-2. Function and Effect>

With such a structure, even if the unreacted metal layer remains as a residual metal on the trench isolation oxide film ST31 in the formation of the silicide layer and is diffused into the trench isolation oxide film ST31 by the heat treatment in the process, it reaches the polysilicon film PS31 and then reacts to the polysilicon film PS31 to form the silicide. Therefore, it is possible to prevent the residual metal from reaching the PN junction portion JP of the well region in the SOI layer 3. Moreover, it is possible to prevent the residual metal from reaching the PN junction portion in the SOI layer 3, for example, the junction portion of the P-type well region WR11 and the source-drain region SD11, and the junction portion of the N-type well region WR12 and the source-drain region SD12. As a result, the silicide can be prevented from being formed in the PN junction portion and a junction leakage current can be prevented from being generated.

<C-3. Manufacturing Method>

A method of manufacturing the SOI device 300 shown in FIG. 22 is basically the same as the method of manufacturing the SOI device 100 described with reference to FIGS. 1 to 11. A step of providing a polysilicon film PS31 after oxidizing an internal wall of a trench TR1 and before filling in an oxide film OX2 is added to the step shown in FIG. 3.

At this step, the trench TR1 is filled with a polysilicon film, an excessive polysilicon film is removed through anisotropic dry etching, and the polysilicon film is caused to remain on only the lower side in the trench TR1 so that the polysilicon film PS31 is formed.

Then, an upper portion of the polysilicon film PS31 is filled with an oxide film so that a trench isolation oxide film ST31 can be obtained. A trench isolation oxide film ST32 is formed in the same manner. The above-mentioned manufacturing method will be further described in a fourth embodiment which will be described below.

Moreover, steps to be carried out after forming the trench isolation oxide film ST31 are the same as those of the method of manufacturing the SOI device 100 described with reference to FIGS. 5 to 11. At a step of forming a silicide layer SS1 and then removing an unreacted metal layer, etching may be carried out only once in the same manner as in the conventional art.

<C-4. First Variant>

In order to obtain the same functions and effects as those of the SOI device 300 shown in FIG. 22, it is also possible to employ a structure of an SOI device 301 shown in FIG. 24.

The SOI device 301 shown in FIG. 24 is basically identical to the SOI device 100 described with reference to FIG. 11 except that a trench isolation oxide film ST33 having a polysilicon film PS33 is provided as a gettering material therein in place of the trench isolation oxide film ST11. Furthermore, the same structures as those of the SOI device 100 have the same reference numerals and repetitive description will be omitted.

FIG. 24 shows a portion corresponding to the region NR in the SOI device 100 shown in FIG. 11. For convenience, an interlayer insulating film IZ and a contact portion CH are not shown.

The trench isolation oxide film ST33 shown in FIG. 24 is constituted by a lower oxide film 331, a polysilicon film PS33 and an upper oxide film 332 which are sequentially provided on the buried oxide film 2 side, and an oxide film spacer 333 provided on their side surfaces. The trench isolation oxide film ST33 is provided to substantially fill in a surface of the SOI layer 3 and an upper surface of the upper oxide film 332 is exposed to the surface of the SOI layer 3.

Apparently, it is effective that the polysilicon film PS33 is effectively provided along a PN junction portion JP in the same manner as the polysilicon film PS21 described with reference to FIG. 19.

Thus, the trench isolation oxide film ST33 has the polysilicon film PS33 therein. Therefore, even if an unreacted metal layer remains as a residual metal on the trench isolation oxide film ST33 in the formation of a silicide layer and is diffused into the trench isolation oxide film ST33 by a heat treatment in a process, it reaches the polysilicon film PS33 and then reacts to the polysilicon film PS33 to form a silicide. Consequently, it is possible to prevent the residual metal from reaching the PN junction portion JP of a well region in the SOI layer 3.

Figure 26:
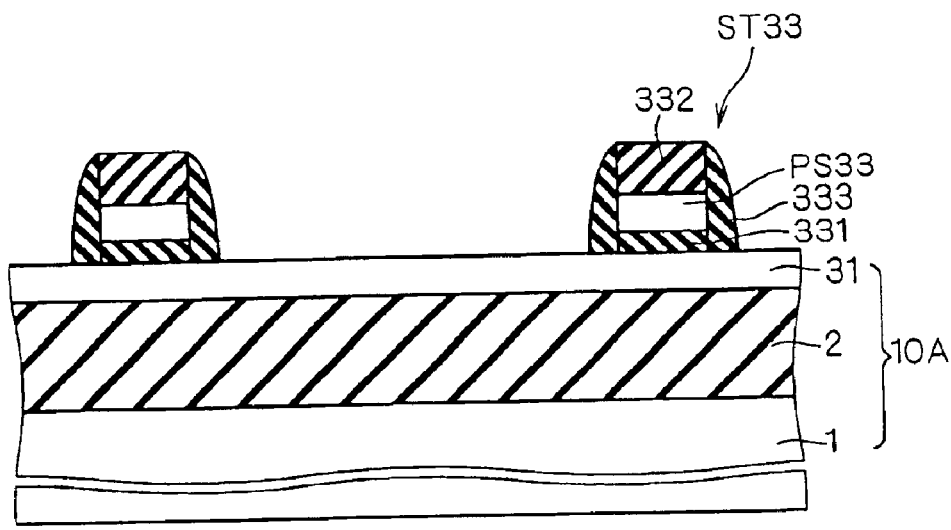

A method of manufacturing the SOI device 301 will be described below with reference to FIGS. 25 to 27.

At a step shown in FIG. 25, first of all, an SOI substrate 10A in which a buried oxide film 2 and an SOI layer 31 are provided on a silicon substrate 1 is prepared. The SOI layer 31 has a thickness corresponding to a thickness of a well region present under the trench isolation oxide film ST33.

An oxide film OX4 having a thickness of 20 to 50 nm (200 to 500 angstroms) is formed on the SOI layer 31 through thermal oxidization at a temperature of 700 to 1000° C. Moreover, the polysilicon film PS33 having a thickness of 30 to 60 nm (300 to 600 angstroms) is formed on the oxide film OX4 at a temperature of 600 to 800° C. by a CVD method, and furthermore, an oxide film OX5 having a thickness of 30 to 80 nm (300 to 800 angstroms) is formed on the polysilicon film PS33 at a temperature of 600 to 800° C. by the CVD method.

Then, a resist mask R15 is selectively formed on the oxide film OX5 corresponding to a position where the trench isolation oxide film ST33 is to be provided, and the oxide film OX5, the polysilicon film PS33 and the oxide film OX4 in portions which are not covered with the resist mask R15 are removed through etching.

As a result, the lower oxide film 331, the polysilicon film PS33 and the upper oxide film 332 are provided on the SOI layer 31. At a step shown in FIG. 26, the lower oxide film 331, the polysilicon film PS33 and the upper oxide film 332 are covered with an oxide film formed by the CVD method, and the same oxide film is removed through anisotropic etching until the SOI layer 31 is exposed. Consequently, an oxide film spacer 333 is formed on side surfaces of the lower oxide film 331, the polysilicon film PS33 and the upper oxide film 332 so that the trench isolation oxide film ST33 is obtained.

Figure 27:
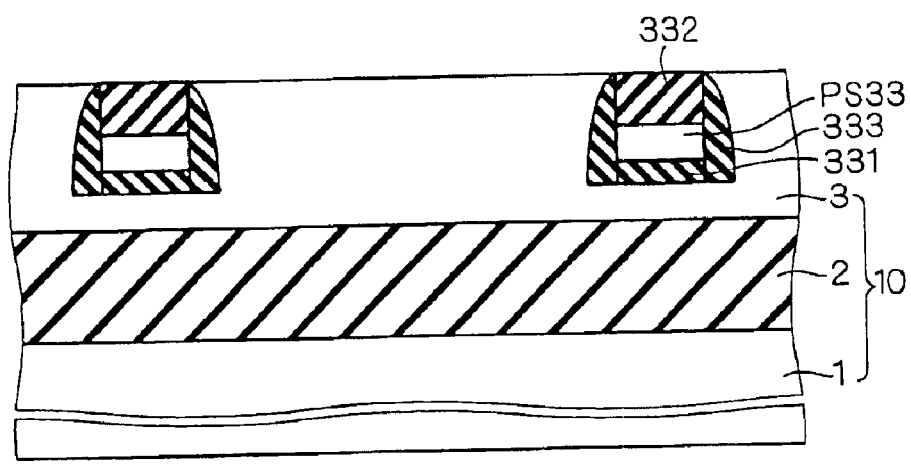

At a step shown in FIG. 27, next, the SOI layer 31 is subjected to epitaxial growth at a temperature of 500 to 1200° C. to form the SOI layer 3. Consequently, it is possible to obtain a structure in which the trench isolation oxide film ST33 is buried in the surface of the SOI layer 3.

It is sufficient that the SOI layer 31 is grown up to such a height that an upper surface of the upper oxide film 332 in the trench isolation oxide film ST33 is exposed to the surface of the SOI layer 3. After the SOI layer 31 is grown to completely bury the trench isolation oxide film ST33, the upper surface of the upper oxide film 332 may be exposed to the surface of the SOI layer 3 through flattening.

It is also possible to employ such a structure that the upper surface of the upper oxide film 332 is exposed to the surface of the SOI layer 3, and furthermore, the upper oxide film 332 is protruded from the surface of the SOI layer 3 by 30 to 50 nm.

While subsequent steps are basically the same as those of the method of manufacturing the SOI device 100 described with reference to FIGS. 5 to 11, etching may be carried out only once at a step of forming a silicide layer SS1 and then removing an unreacted metal layer in the same manner as in the conventional art.

<C-5. Second Variant>

Figure 28:
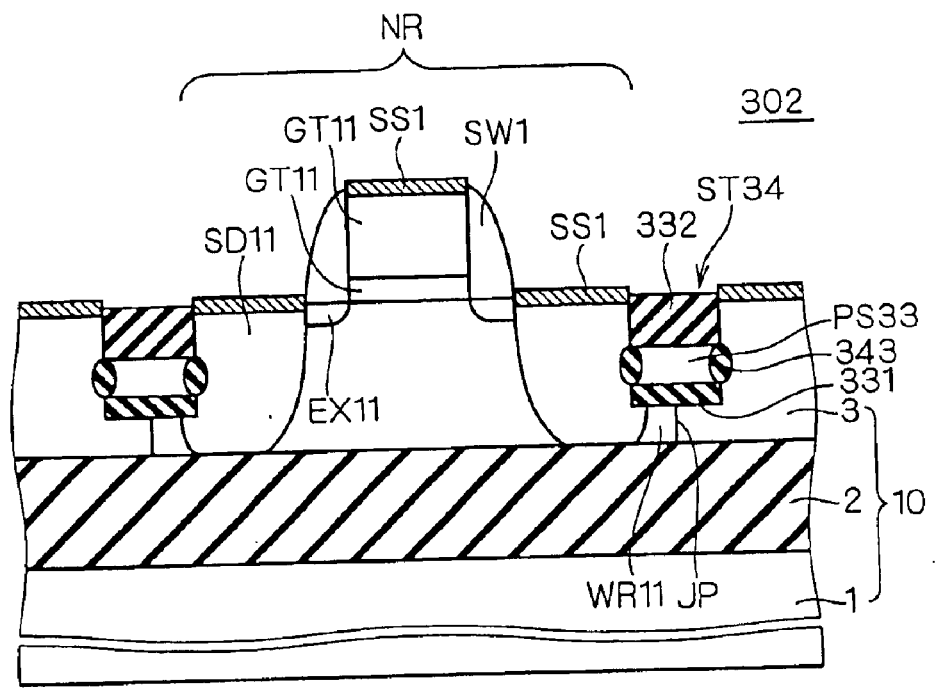
FIG. 28 is a sectional view illustrating a structure of a semiconductor device according to a second variant of the third embodiment of the present invention.

In order to obtain the same functions and effects as those of the SOI device 300 shown in FIG. 22, it is also possible to employ a structure of an SOI device 302 shown in FIG. 28.

The SOI device 302 shown in FIG. 28 is basically identical to the SOI device 100 described with reference to FIG. 11 except that a trench isolation oxide film ST34 is provided in place of the trench isolation oxide film ST11. Furthermore, the same structures as those of the SOI device 100 have the same reference numerals and repetitive description will be omitted. FIG. 28 shows a portion corresponding to the region NR in the SOI device 100 shown in FIG. 11. For convenience, an interlayer insulating film IZ and a contact portion CH are not shown.

The trench isolation oxide film ST34 shown in FIG. 28 is constituted by a lower oxide film 331, a polysilicon film PS33 and an upper oxide film 332 which are sequentially provided on the buried oxide film 2 side, and an oxide film 343 provided on a side surface of the polysilicon film PS33. The trench isolation oxide film ST34 is provided to be substantially buried in a surface of the SOI layer 3 and an upper surface of the upper oxide film 332 is exposed to the surface of the SOI layer 3.

The trench isolation oxide film ST34 having such a structure produces the same functions and effects as those of the trench isolation oxide film ST33 shown in FIG. 24.

Figure 29:
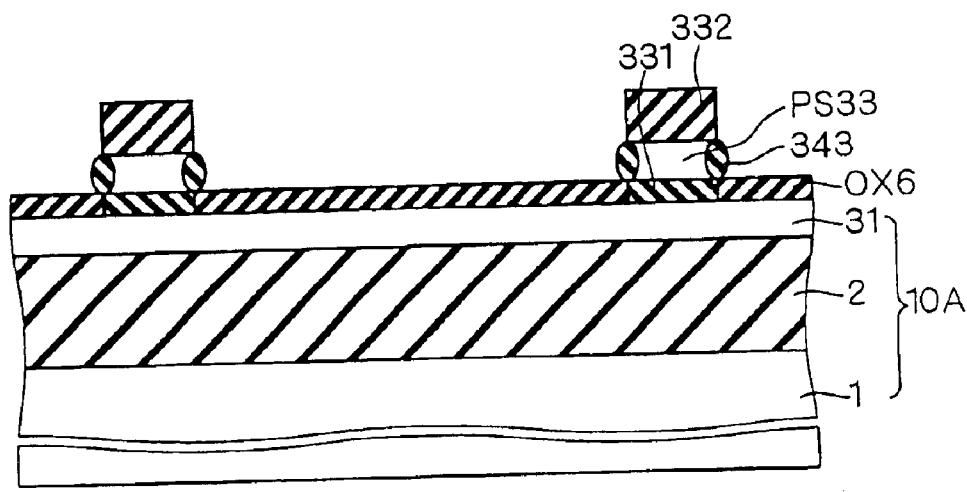
FIGS. 29 to 31 are sectional views illustrating a step of manufacturing a semiconductor device according to the second variant of the third embodiment of the present invention.

A method of manufacturing the SOI device 302 will be described below with reference to FIGS. 29 to 31.

First of all, such a structure that the lower oxide film 331, the polysilicon film PS33 and the upper oxide film 332 are provided on the SOI layer 31 is obtained through the step described with reference to FIG. 25. Then, the oxide film 343 is formed on the side surface of the polysilicon film PS33 by thermal oxidation.

Figure 30:
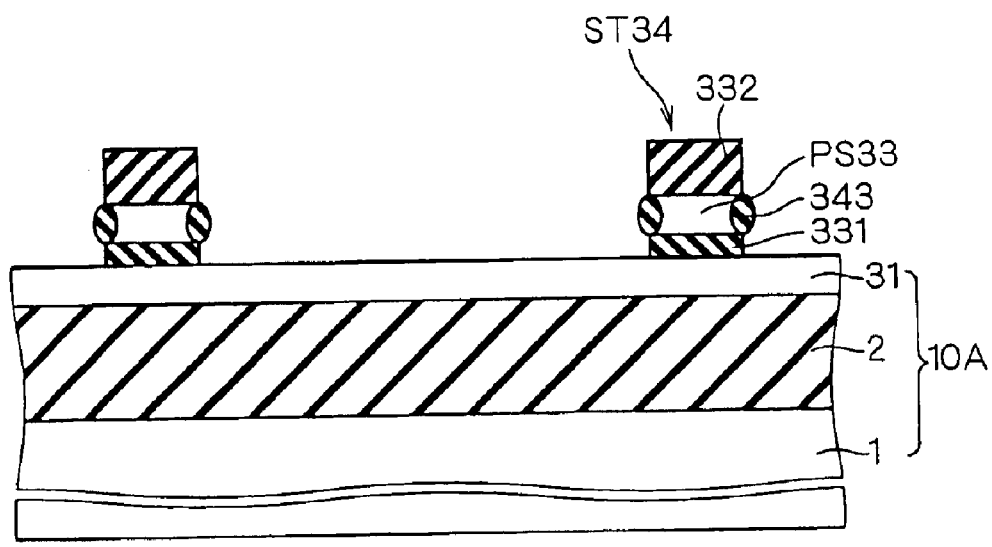

At this time, an oxide film OX6 is also formed on the surface of the SOI layer 31 and is then removed through anisotropic etching at a step shown in FIG. 30 so that the trench isolation oxide film ST34 is obtained. Although a portion bulged toward the outside of the oxide film 343 is also etched through the anisotropic etching, at least a portion bulged toward the inside slightly remains reliably. Therefore, an insulation of the polysilicon film PS33 can be maintained.

Figure 31:
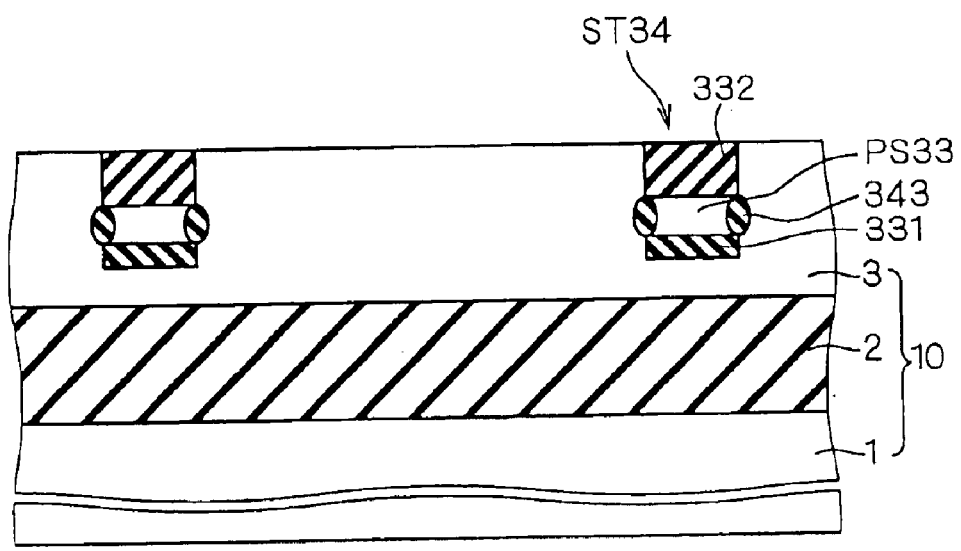

At a step shown in FIG. 31, next, the SOI layer 31 is epitaxially grown at a temperature of 500 to 1200° C. to form the SOI layer 3. Consequently, it is possible to obtain such a structure that the trench isolation oxide film ST34 is buried in the surface of the SOI layer 3.

The epitaxial growth of the SOI layer 31 is the same as that in the method of manufacturing the SOI device 301. Moreover, since subsequent steps are also the same as those in the method of manufacturing the SOI device 301, description will be omitted.

In the SOI devices 300 to 302 described above, the polysilicon films PS31 and PS33 in the trench isolation oxide films ST31, ST33 and ST34 do not particularly have such a structure that an impurity is introduced. However, an impurity having a high concentration may be introduced into the polysilicon films PS31 and PS33 to have a conducting property.

In this case, an electric potential of the polysilicon film in an NMOS region is connected to a ground potential (GND) and an electric potential of the polysilicon film in a PMOS region is connected to a source potential. Consequently, it is possible to prevent a depletion layer from being extended toward the outside of regions defined by the trench isolation oxide films ST31, ST33 and ST34. Thus, an electrical isolation between elements can be implemented. Such an electrode structure is similar to a field shield isolation structure. While the field shield isolation structure is formed on a main surface of a semiconductor layer, the trench isolation oxide films ST31, ST33 and ST34 are formed in the surface of the SOI layer.

By employing the above-mentioned structure, moreover, it is possible to suppress a junction leakage current between a source-drain and a well on an isolation oxide film side wall interface which is a problem peculiar to the trench isolation oxide film.

<C-6. Third Variant>

Figure 32:
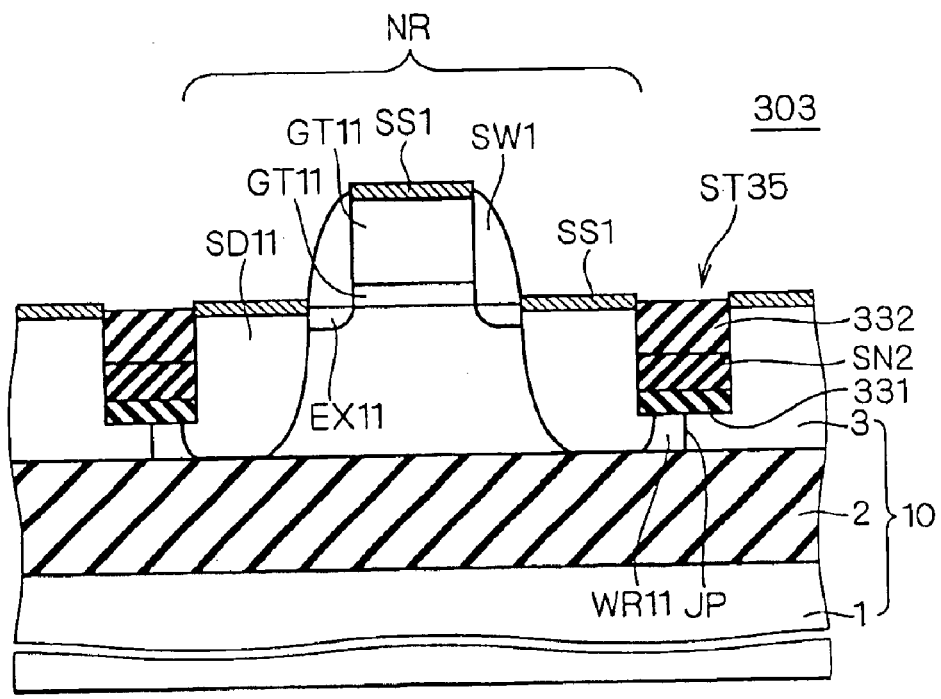
FIG. 32 is a sectional view illustrating a structure of a semiconductor device according to a third variant of the third embodiment of the present invention.

In order to obtain the same functions and effects as those of the SOI device 300 shown in FIG. 22, it is also possible to employ a structure of an SOI device 303 shown in FIG. 32.

The SOI device 303 shown in FIG. 32 is basically identical to the SOI device 100 described with reference to FIG. 11 except that a trench isolation oxide film ST35 is provided in place of the trench isolation oxide film ST11. Furthermore, the same structures as those of the SOI device 100 have the same reference numerals and repetitive description will be omitted. FIG. 32 shows a portion corresponding to the region NR in the SOI device 100 shown in FIG. 11. For convenience, an interlayer insulating film IZ and a contact portion CH are not shown.

The trench isolation oxide film ST35 shown in FIG. 32 is constituted by a lower oxide film 331, a nitride film SN2 (an internal nitride film) and an upper oxide film 332 which are sequentially provided on the buried oxide film 2 side. The trench isolation oxide film ST35 is provided to be substantially buried in a surface of the SOI layer 3 and an upper surface of the upper oxide film 332 is exposed to the surface of the SOI layer 3.

Thus, the trench isolation oxide film ST35 has the nitride film SN2 therein. Therefore, even if an unreacted metal layer remains as a residual metal on the trench isolation oxide film ST35 in the formation of a silicide layer and is diffused into the trench isolation oxide film ST35 by a heat treatment in a process, it reaches the nitride film SN2 and the nitride film SN2 then prevents the residual metal from being diffused any longer. Therefore, it is possible to prevent the residual metal from reaching the PN junction portion JP of a well region in the SOI layer 3.

Moreover, the nitride film SN2 to be an insulating film is provided in place of the polysilicon film PS33 of the trench isolation oxide films ST33 and ST34 shown in FIGS. 24 and 28. Therefore, in the case in which the nitride film SN2 is to be buried in a surface of the SOI layer 3, it is not necessary to insulate the polysilicon film PS33 with the oxide film spacer 333 or the oxide film 343 differently from the trench isolation oxide films ST33 and ST34. Consequently, a manufacturing process can be simplified.

Apparently, it is effective that the nitride film SN2 is provided along the PN junction portion JP in the same manner as the polysilicon film PS21 described with reference to FIG. 19.

Moreover, the nitride film SN2 is formed uniformly in a thickness of 30 to 60 nm in the same manner as the polysilicon film PS33. Therefore, even if the nitride film SN2 is heated by a heat treatment in the process or during the formation of a silicide layer, a thermal stress can be prevented from being increased. Consequently, crystal defects can be prevented from being generated on a silicon layer constituting the vicinity of an end of a transistor. Thus, a device characteristic is not deteriorated.

A method of manufacturing the SOI device 303 will be described below with reference to FIGS. 33 to 35.

Figure 33:
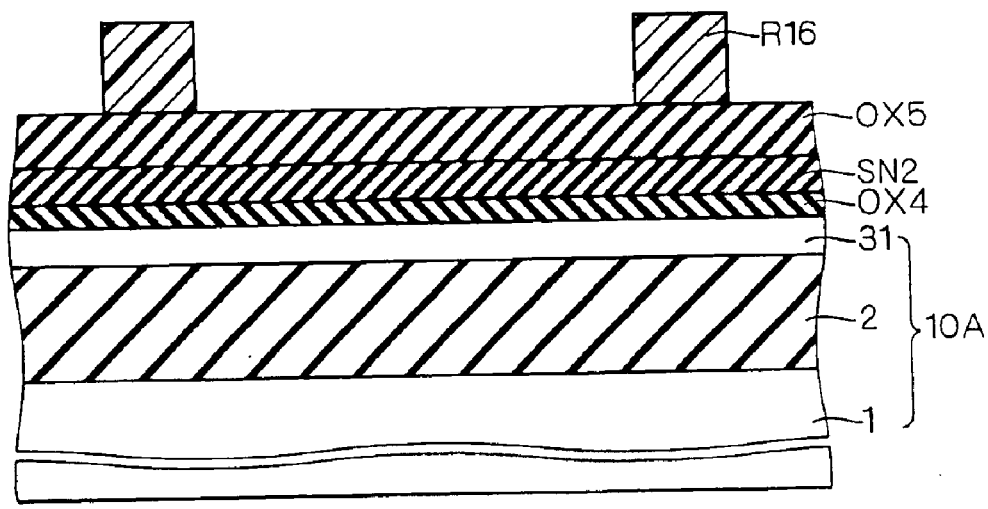
FIGS. 33 to 35 are sectional views illustrating a step of manufacturing a semiconductor device according to the third variant of the third embodiment o the present invention.

At a step shown in FIG. 33, first of all, an SOI substrate 10A in which a buried oxide film 2 and an SOI layer 31 are provided on a silicon substrate 1 is prepared. The SOI layer 31 has a thickness corresponding to a thickness of a well region present under the trench isolation oxide film ST35.

An oxide film OX4 having a thickness of 20 to 50 nm (200 to 500 angstroms) is formed on the SOI layer 31 through thermal oxidization at a temperature of 700 to 1000° C. Moreover, the nitride film SN2 having a thickness of 30 to 60 nm (300 to 600 angstroms) is formed on the oxide film OX4 at a temperature of 500 to 800° C. by a CVD method, and furthermore, an oxide film OX5 having a thickness of 30 to 80 nm (300 to 800 angstroms) is formed on the nitride film SN2 at a temperature of 600 to 800° C. by the CVD method.

Then, a resist mask R16 is selectively formed on the oxide film OX5 corresponding to a position where the trench isolation oxide film ST35 is to be provided, and the oxide film OX5, the nitride film SN2 and the oxide film OX4 in portions which are not covered with the resist mask R16 are removed through etching.

Figure 34:
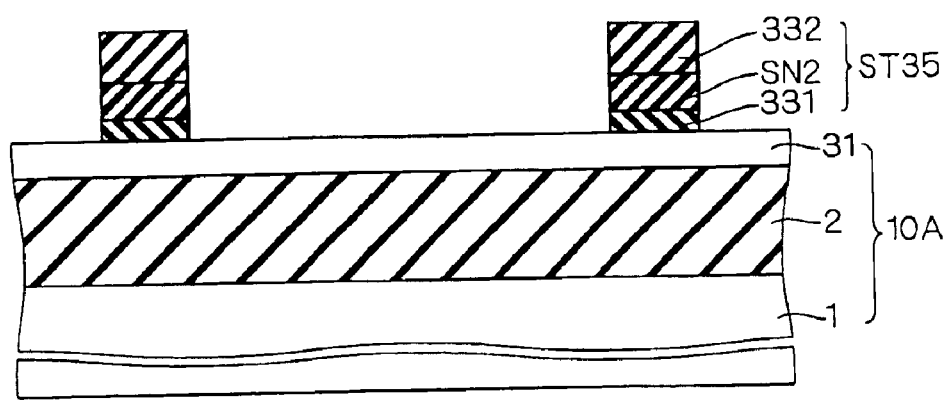

As a result, the trench isolation oxide film ST35 constituted by the lower oxide film 331, the nitride film SN2 (internal nitride film) and the upper oxide film 332 over the SOI layer 31 is obtained as shown in FIG. 34.

Figure 35:
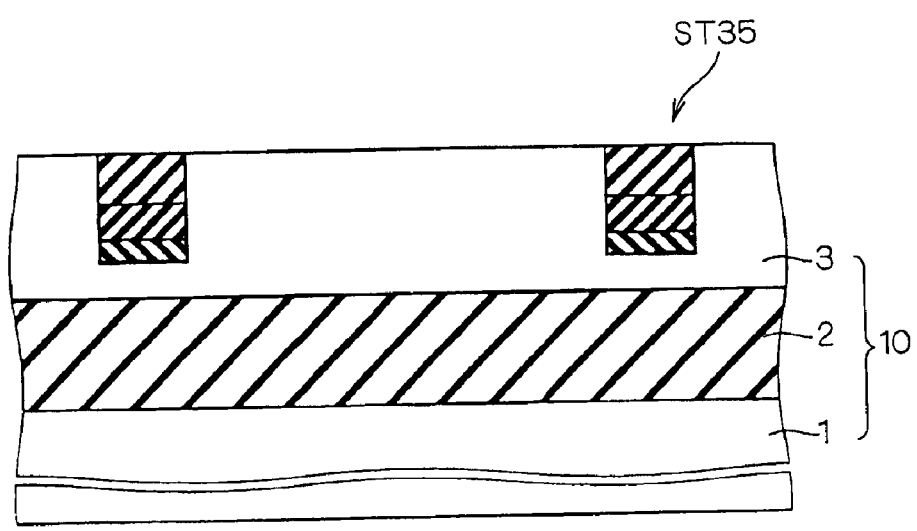

At a step shown in FIG. 35, next, the SOI layer 31 is subjected to epitaxial growth at a temperature of 500 to 1200° C. to form the SOI layer 3. Consequently, it is possible to obtain a structure in which the trench isolation oxide film ST35 is buried in the surface of the SOI layer 3.

The epitaxial growth of the SOI layer 31 is the same as that in the method of manufacturing the SOI device 301. Moreover, since subsequent steps are also the same as those in the method of manufacturing the SOI device 301, description will be omitted.

If the trench isolation oxide films ST33 to ST35 in the SOI devices 301 to 303 described above are formed on a bulk silicon substrate, it is apparent that a bulk device can be constituted.

Instead of forming the trench isolation oxide films ST33 to ST35 on the silicon substrate to epitaxially grow the SOI layer 31 by the above-mentioned manufacturing method, the silicon substrate may be epitaxially grown. In that case, it is preferable that a thickness of each layer constituting the trench isolation oxide films ST33 to ST35 should be increased if necessary.

<D. Fourth Embodiment>
<D-1. Structure of Device>

A fourth embodiment according to the present invention will be described with reference to FIGS. 36 to 40.

Figure 36:
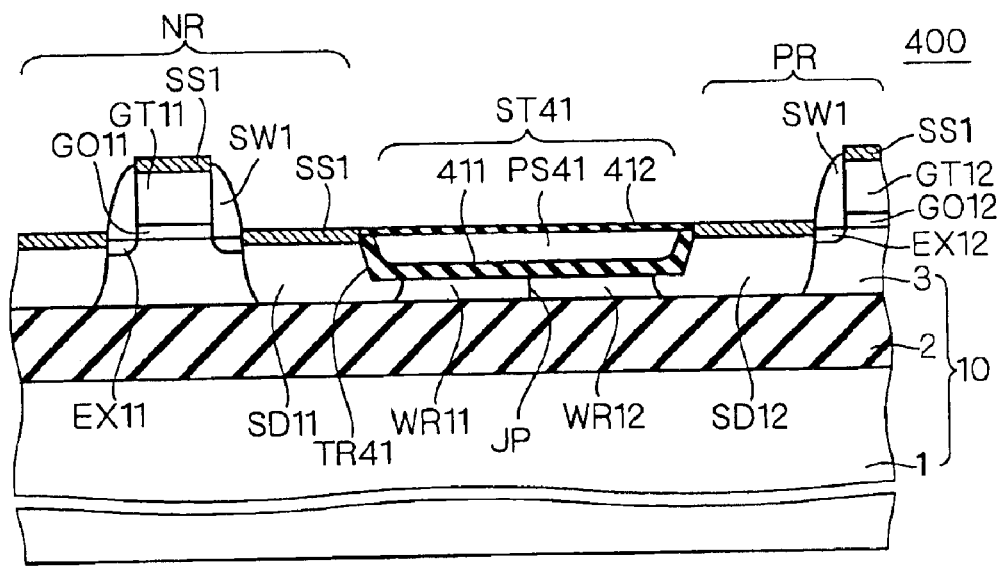
FIG. 36 is a sectional view illustrating a structure of a semiconductor device according to a fourth embodiment of the present invention.

FIG. 36 is a sectional view showing a structure of an SOI device 400 according to the fourth embodiment, and the SOI device 400 shown in FIG. 36 is basically identical to the SOI device 100 described with reference to FIG. 11 except that a trench isolation oxide film ST41 is provided in place of the trench isolation oxide film ST11. Furthermore, the same structures as those of the SOI device 100 have the same reference numerals and repetitive description will be omitted. For convenience, an interlayer insulating film IZ and a contact portion CH are not shown.

The trench isolation oxide film ST41 shown in FIG. 36 has an internal wall oxide film 411 formed on an internal wall of a trench TR41 provided in a surface of an SOI layer 3, a polysilicon film PS41 to be a gettering material which is provided to completely fill in the trench TR41 surrounded by the internal wall oxide film 411, and an upper oxide film 412 provided on the polysilicon film PS41 to surround the polysilicon film PS41 together with the internal wall oxide film 411, thereby electrically insulating the polysilicon film PS41.

The trench isolation oxide film ST41 is provided to be substantially buried in the surface of the SOI layer 3, and an upper surface of the oxide film 412 is exposed to the surface of the SOI layer 3.

Apparently, it is effective that the polysilicon film PS41 is provided along a PN junction portion JP in the same manner as the polysilicon film PS21 described with reference to FIG. 19.

<D-2. Manufacturing Method>

A method of manufacturing the SOI device 400 will be described below with reference to FIGS. 37 to 39.

Figure 37:
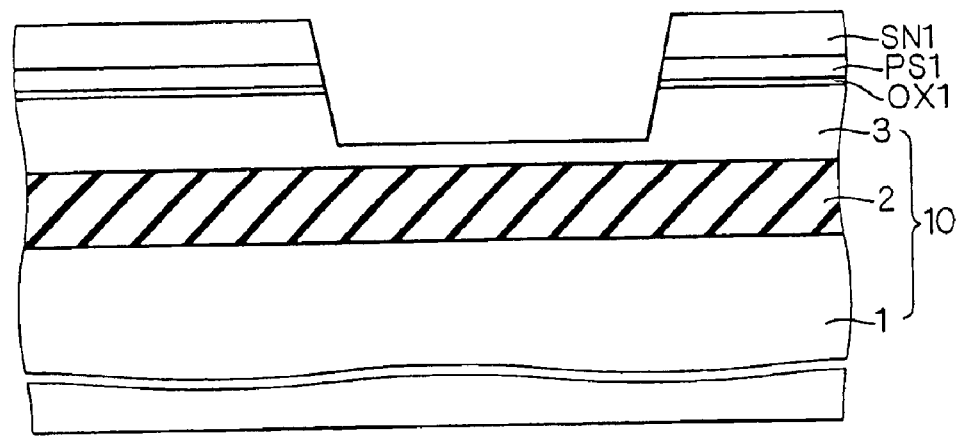
FIGS. 37 to 39 are sectional views illustrating a step of manufacturing a semiconductor device according to the fourth embodiment of the present invention.
Figure 38:
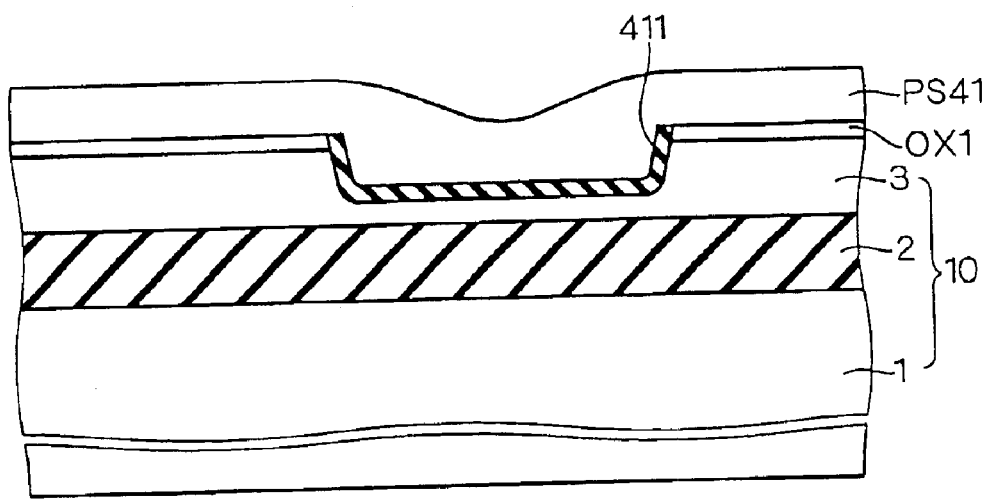

Through the same step as the step described with reference to FIG. 1, first of all, an oxide film OX1 (a pad oxide film) having a thickness of 10 to 30 nm, a polysilicon film PS1 having a thickness of 10 to 100 nm and a nitride film SN1 having a thickness of 30 to 200 nm are formed on the SOI layer 3 of an SOI substrate 10 as shown in FIG. 37.

Then, a resist mask is subjected to patterning according to a pattern of the trench isolation oxide film ST41, and the nitride film SN1 and the polysilicon film PS1 are selectively removed through dry etching or wet etching. Next, the resist mask is removed and the SOI layer 3 is then subjected to trench etching by using the nitride film SN1 as an etching mask. Thus, the trench TR41 is formed.

At a step shown in FIG. 38, subsequently, an internal wall of the trench TR41 is thermally oxidized to form an internal wall oxide film 411 having a thickness of a approximately 20 nm (200 angstroms). Then, the nitride film SN1 and the polysilicon film PS1 are removed. At this time, the trench TR41 has a depth of approximately 100 nm (1000 angstroms).

Then, the trench TR41 is filled with the polysilicon film PS41 formed by a CVD method, for example.

Figure 39:
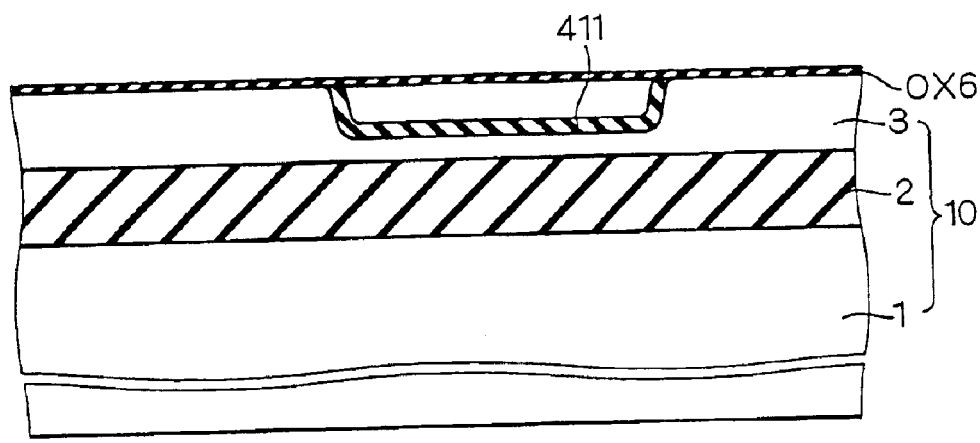
Figure 40:
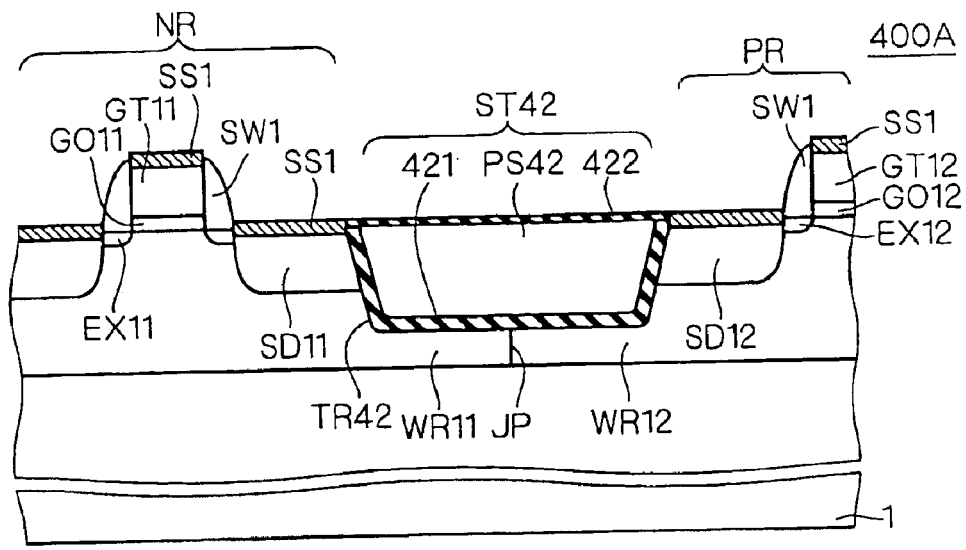
FIG. 40 is a sectional view showing an example in which the semiconductor device according to the fourth embodiment of the present invention is applied to a bulk device.

At a step shown in FIG. 39, next, the polysilicon film PS41 provided on the SOI layer 3 is polished and flattened through a CMP treatment to leave the polysilicon film PS41 only in the trench TR41. At this time, the oxide film OX1 provided on the SOI layer 3 is removed together.

Subsequently, an oxide film OX6 having a thickness of 2 to 4 nm (20 to 40 angstroms) is formed over the whole surface. Then, the upper oxide film 412 is formed with the oxide film OX6 remaining only on the polysilicon film PS. Thus, the trench isolation oxide film ST41 is obtained. The polysilicon film PS41 obtained through such a step has a thickness of approximately 80 nm (800 angstroms).

Subsequent steps are basically the same as those in the method of manufacturing the SOI device 100 described with reference to FIGS. 5 to 11. At a step of forming a silicide layer SS1 and then removing an unreacted metal layer, however, etching may be carried out only once in the same manner as in the conventional art.

While the SOI device 400 formed on the SOI substrate 10 has been described above, FIG. 40 shows a bulk device 400A formed on a bulk silicon substrate 1.

In the bulk device 400A, a deeper trench isolation oxide film ST42 is provided in place of the trench isolation oxide film ST41.

The trench isolation oxide film ST42 has an internal wall oxide film 421 formed on an internal wall of a trench TR42 formed in the surface of the SOI layer 3, a polysilicon film PS42 provided to completely fill in the trench TR42 surrounded by the internal wall oxide film 421, and an upper oxide film 422 provided on the polysilicon film PS42 to surround the polysilicon film PS42 together with the internal wall oxide film 421, thereby electrically insulating the polysilicon film PS42.

Since other structures are the same as those of the SOI device 400 shown in FIG. 36, the same structures have the same reference numerals and repetitive description will be omitted.

<D-3. Function and Effect>

As described above, the trench isolation oxide film ST41 has the polysilicon film PS41 therein in a position corresponding to a top of a PN junction portion JP of a P-type well region WR11 and an N-type well region WR12 in the SOI layer 3 across the two well regions. Therefore, the trench isolation oxide film ST41 has the same function as that of the trench isolation oxide film ST31 according to the third embodiment. In addition, a thickness of the polysilicon layer PS41 can be increased. Consequently, the function of a gettering site can be more enhanced.

<E. Fifth Embodiment>

<E-1. Structure of Device>

A fifth embodiment according to the present invention will be described with reference to FIGS. 41 to 44.

The trench isolation oxide film ST41 of the SOI device 400 described in the fourth embodiment is a partial isolation film which has the P-type well region WR1 and the N-type well region WR12 provided thereunder and does not electrically isolate elements completely from each other. Recently, there has been utilized a trench isolation oxide film continuously provided with a complete isolation region which penetrates through the SOI layer 3 to reach the buried oxide film 2 and a partial isolation region which does not penetrate through the SOI layer 3 but causes a well region to remain thereunder. Such an isolation oxide film is referred to as a combined isolation oxide film in some cases.

In the fifth embodiment according to the present invention, description will be given to an SOI device 500 having a polysilicon film PS51 (internal polysilicon film) in a trench isolation oxide film ST51 to be a combined isolation oxide film.

Figure 41:
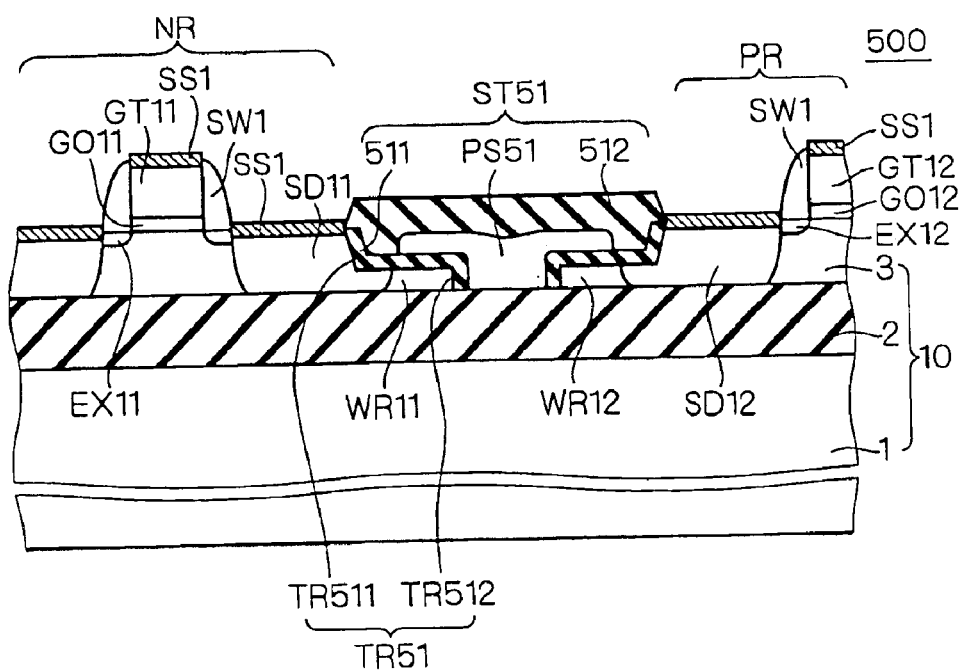
FIG. 41 is a sectional view illustrating a structure of a semiconductor device according to a fifth embodiment of the present invention.

FIG. 41 is a sectional view showing a structure of the SOI device 500 according to the fifth embodiment, and the SOI device 500 shown in FIG. 41 is basically identical to the SOI device 100 described with reference to FIG. 11 except that a trench isolation oxide film ST51 is provided in place of the trench isolation oxide film ST11. Furthermore, the same structures as those of the SOI device 100 have the same reference numerals and repetitive description will be omitted. For convenience, an interlayer insulating film IZ and a contact portion CH are not shown.

The trench isolation oxide film ST51 shown in FIG. 41 has an internal wall oxide film 511 formed on an internal wall of a trench TR51 formed in a surface of an SOI layer 3, a polysilicon film PS51 to be a gettering material which is partially provided in the trench TR51 surrounded by the internal wall oxide film 511, and an upper oxide film 512 provided to cover the polysilicon film PS51 and surrounding the polysilicon film PS51 together with the internal wall oxide film 511, thereby electrically insulating the polysilicon film PS51.

The trench TR51 is constituted by a trench TR511 (partial trench) which does not penetrate through the SOI layer 3 and is provided to leave a P-type well region WR11 and an N-type well region WR12 thereunder, and a trench TR512 (complete trench) provided to reach a buried oxide film 2 through the SOI layer 3 and having a smaller sectional shape than that of the trench TR511.

The polysilicon film PS51 completely fills in the trench TR512, is extended over a bottom face of the trench TR511 and has a T-shaped section.

The polysilicon film PS51 does not completely fill in the trench TR511 and a residual region in the trench TR511 is completely filled with the upper oxide film 512. The upper oxide film 512 is slightly protruded toward the SOI layer 3 from a surface thereof.

<E-2. Manufacturing Method>

A method of manufacturing the SOI device 500 will be described below with reference to FIGS. 42 to 44.

Figure 42:
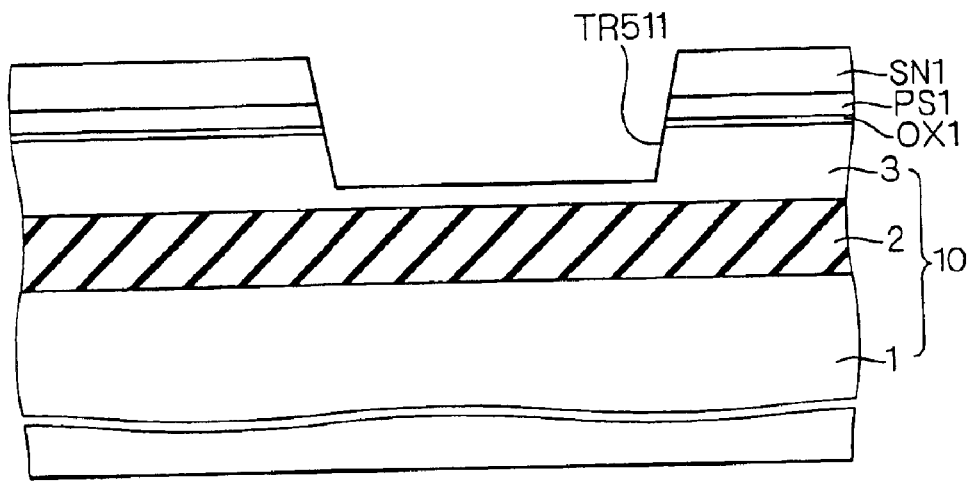
FIGS. 42 to 44 are sectional views illustrating a step of manufacturing a semiconductor device according to the fifth embodiment of the present invention.

Through the same step as the step described with reference to FIG. 1, first of all, an oxide film OX1 (a pad oxide film) having a thickness of 10 to 30 nm, a polysilicon film PS1 having a thickness of 10 to 100 nm and a nitride film SN1 having a thickness of 30 to 200 nm are formed on the SOI layer 3 of an SOI substrate 10 as shown in FIG. 42.

Then, a resist mask is subjected to patterning according to a pattern of the trench isolation oxide film ST51 seen in a plane, and the nitride film SN1 and the polysilicon film PS1 are selectively removed through dry etching or wet etching. Next, the resist mask is removed and the SOI layer 3 is then subjected to trench etching by using the nitride film SN1 as an etching mask. Thus, the trench TR511 is formed. The trench TR511 is a partial trench provided leaving the SOI layer 3 to be the P-type well region WR11 and the N-type well region WR12 later thereunder.

Figure 43:
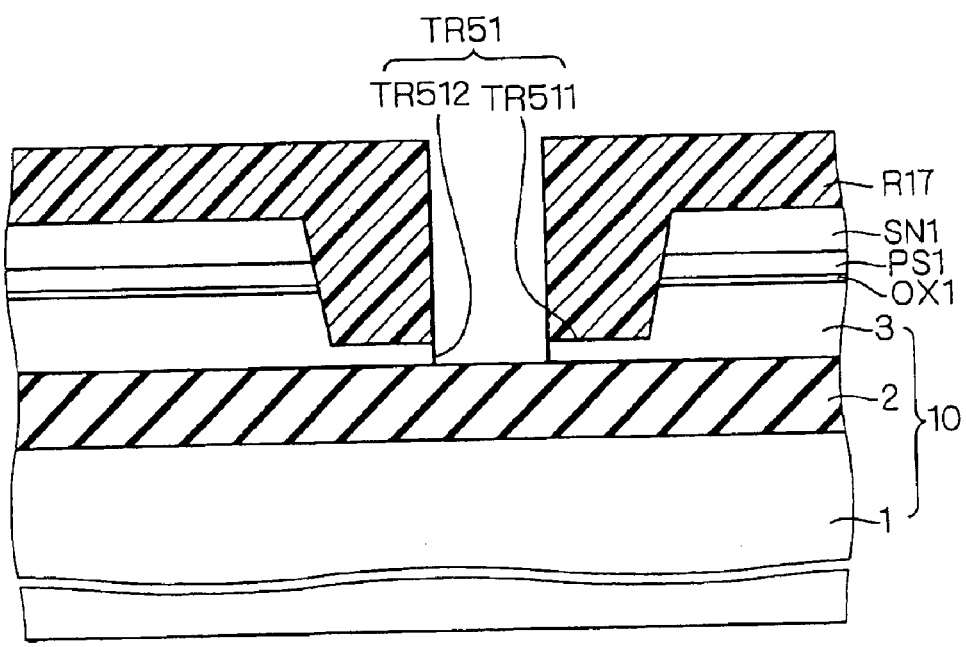

At a step shown in FIG. 43, next, the trench TR511 is filled with a resist mask R17 in which a portion corresponding to the trench TR512 is an opening. A bottom portion of the trench TR511 is further etched by using the resist mask R17, thereby forming the trench TR512 reaching the buried oxide film 2. Thus, the trench TR51 is obtained.

Figure 44:
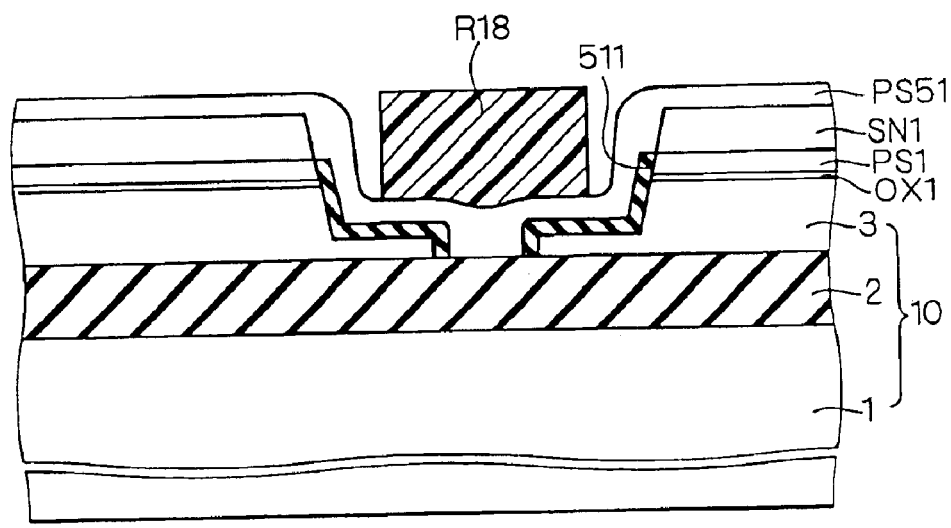

Next, after the resist mask R17 is removed, an internal wall of the trench TR51 is thermally oxidized to form the internal wall oxide film 511 having a thickness of approximately 20 nm (200 angstroms), and the polysilicon film PS51 having a thickness of approximately 50 to 80 nm (500 to 800 angstroms) over the whole surface by a CVD method, for example, thereby completely filling in the trench TR512 provided with the internal wall oxide film 511 and covering the internal wall of the trench TR511 at a step shown in FIG. 44.

Subsequently, a resist mask R18 for restricting a formation region for the polysilicon film PS51 on the bottom face of the trench TR511 is provided on the polysilicon film PS51, and the excessive polysilicon film PS51 is removed by using the resist mask R18.

By restricting the formation region for the polysilicon film PS51, it is possible to completely cover the polysilicon film PS51 in the trench TR511 through the upper oxide film 512 to be formed later. Consequently, the polysilicon film PS51 can be insulated reliably.

After the resist mask R18 is removed, an oxide film is formed by the CVD method, for example, to completely fill in the residual region in the trench TR511 and is then polished and flattened by using a nitride film SN1 as a stopper through a CMP treatment. Thereafter, the nitride film SN1 and the polysilicon film PS1 is removed through wet etching or dry etching. Thus, the trench isolation oxide film ST51 is formed.

While subsequent steps are basically the same as those of the method of manufacturing the SOI device 100 described with reference to FIGS. 5 to 11, a step of forming a silicide layer SS1 and then removing an unreacted metal layer may be carried out through one-time etching in the same manner as that in the conventional art.

<E-3. Function and Effect>

Thus, the trench isolation oxide film ST51 has the polysilicon film PS provided therein across the P-type well region WR11 and the N-type well region WR12 in the SOI layer 3. Therefore, even if the unreacted metal layer remains as a residual metal on the trench isolation oxide film ST51 in the formation of the silicide layer and is diffused into the trench isolation oxide film ST51 by the heat treatment in the process, it reaches the polysilicon film PS51 and then reacts to the polysilicon film PS51 to form the silicide. Therefore, it is possible to prevent the PN junction portion in the SOI layer 3, for example, the junction portion of the P-type well region WR11 and the source-drain region SD11, and the junction portion of the N-type well region WR12 and the source-drain region SD12. As a result, the silicide can be prevented from being formed in the PN junction portion and a junction leakage current can be prevented from being generated.

Moreover, the polysilicon film PS51 is restrictively provided in the trench TR511 and the polysilicon film PS51 is not protruded toward the outside of the isolating film. Therefore, it is possible to prevent drawbacks from being caused by insulation failures.

If the polysilicon film PS51 can be prevented from being protruded toward the outside of the isolating film beyond the internal oxide film 511, the polysilicon film PS51 may be provided in contact with the internal oxide film 511.

<F. Sixth Embodiment>

<F-1. Structure of Device>

A sixth embodiment according to the present invention will be described with reference to FIGS. 45 to 48.

Figure 45:
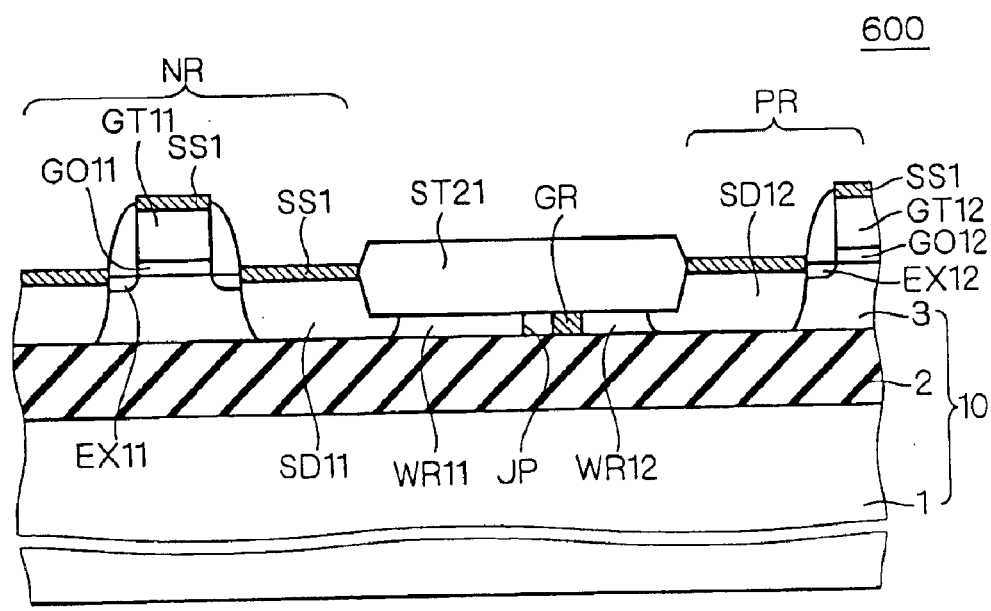
FIG. 45 is a sectional view illustrating a structure of a semiconductor device according to a sixth embodiment of the present invention.

FIG. 45 is a sectional view showing a structure of an SOI device 600 according to the sixth embodiment, and the SOI device 600 shown in FIG. 45 is basically identical to the SOI device 100 described with reference to FIG. 11. However, a region NR and a region PR are defined by a trench isolation oxide film ST21 and a gettering region GR constituted by a local crystal defect region through ion implantation is provided in an N-type well region WR12 provided under the trench isolation oxide film ST21. Furthermore, the same structures as those of the SOI device 100 have the same reference numerals and repetitive description will be omitted. For convenience, an interlayer insulating film IZ and a contact portion CH are not shown.

With such a structure, also in the case in which an unreacted metal layer remains as a residual metal on the trench isolation oxide film ST21 in the formation of a silicide layer and is diffused into the trench isolation oxide film ST21 by a heat treatment in a process, there can be a lower possibility that the metal might reach an undesirable portion, for example, a PN junction portion JP through the gettering function of the gettering region GR. The gettering region GR is extended along the PN junction portion JP.

Figure 46:
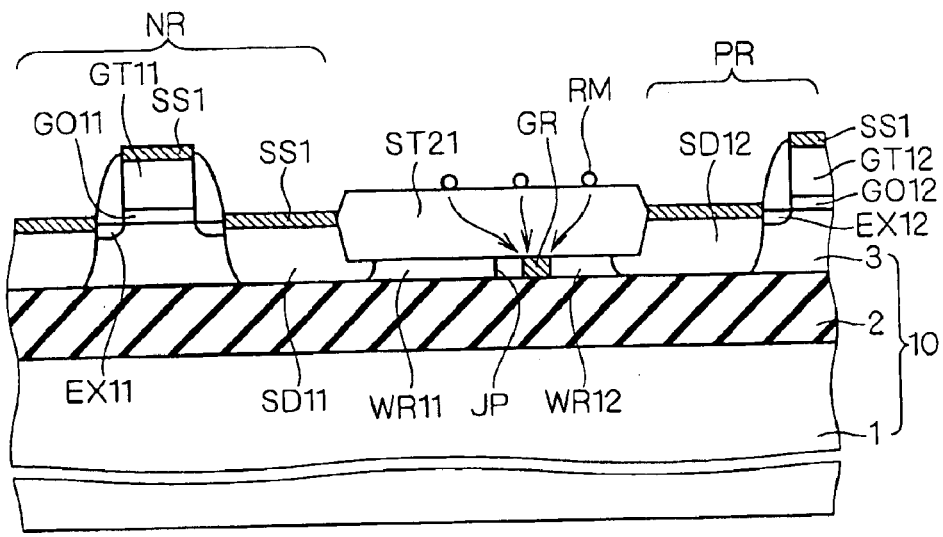
FIG. 46 is a sectional view illustrating effects of the semiconductor device according to the sixth embodiment of the present invention.

FIG. 46 typically shows a state in which a residual metal RM is diffused. In FIG. 46, the residual metal RM is present on the trench isolation oxide film ST21. Even if the residual metal RM is diffused into the trench isolation oxide film ST21 by the heat treatment in the process, the gettering region GR is provided in the vicinity of the PN junction portion JP so that the residual metal RM converges on the gettering region GR. Consequently, there can be a lower possibility that the residual metal RM might reach the PN junction portion JP. Consequently, it is possible to prevent the residual metal RM from being silicided in the PN junction portion JP to increase a junction leakage current.

<F-2. Manufacturing Method>

A method of manufacturing the SOI device 600 will be described below with reference to FIG. 47.

Figure 47:
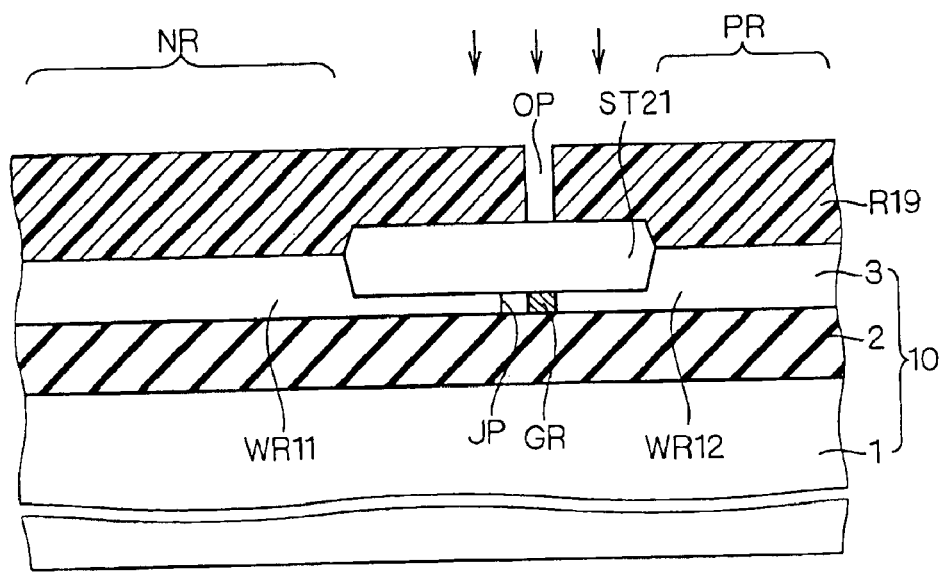
FIG. 47 is a sectional view illustrating a step of manufacturing a semiconductor device according to the sixth embodiment of the present invention.
Figure 48:
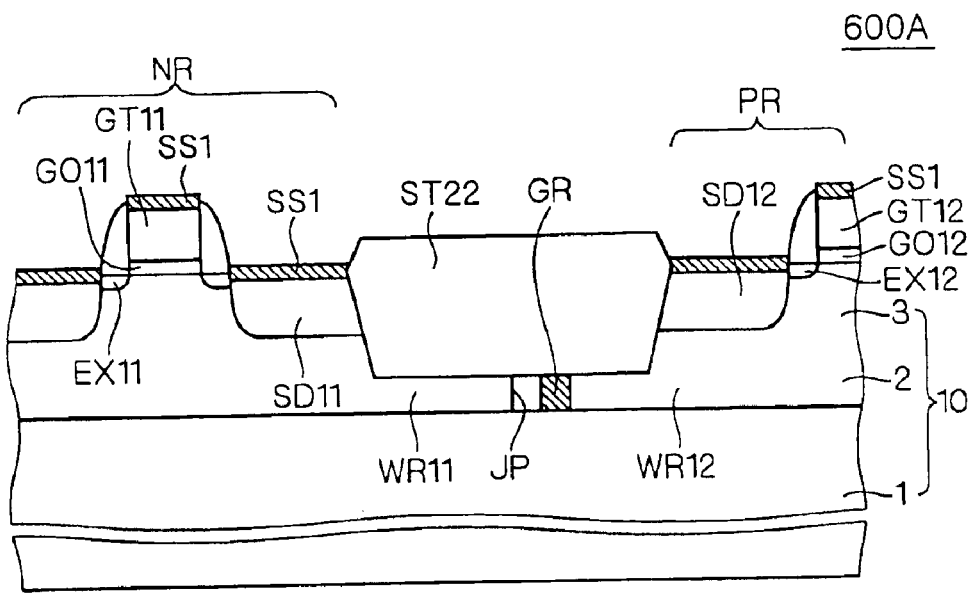
FIG. 48 is a sectional view showing an example in which the semiconductor device according to the sixth embodiment of the present invention is applied to a bulk device.

Through the same steps as the steps described with reference to FIGS. 1 to 5, first of all, the trench isolation oxide film ST21 is formed in a surface of an SOI layer 3 in an SOI substrate 10 as shown in FIG. 47.

Then, a P-type impurity ion and an N-type impurity ion are implanted into the region NR and the region PR defined by the trench isolation oxide film ST21, thereby forming a P-type well region WR11 and an N-type well region WR12, respectively. Consequently, the PN junction portion JP of the P-type well region WR11 and the N-type well region WR12 is formed in the SOI layer 3.

Thereafter, a resist mask R19 in which a portion corresponding to the gettering region GR is an opening OP is provided such that the gettering region GR can be formed in the vicinity of the PN junction portion JP, and an ion having a high concentration is implanted from above the resist mask R19.

The opening OP is set to have a minimum processing dimension of approximately 10 to 200 nm in the resist mask, for example.

Moreover, it is desirable that a position in which the gettering region GR is to be formed should be out of a region where a depletion layer is to be formed during the operation of a MOS transistor.

FIG. 47, the gettering region GR is formed in the N-type well region WR12. Therefore, a boron (B) ion to be the N-type impurity is implanted in a concentration of $1 \times 10^{18}/\text{cm}^3$ or more, thereby forming an implantation defect.

While subsequent steps are basically the same as those of the method of manufacturing the SOI device 100 described with reference to FIGS. 5 to 11, a step of forming a silicide layer SS1 and then removing an unreacted metal layer may be carried out through one-time etching in the same manner as that in the conventional art.

Although the example in which the gettering region GR is formed in the N-type well region WR12 has been described above, it may be formed in the P-type well region WR11 or in both the P-type well region WR11 and the N-type well region WR12.

While the example in which an impurity of the same conductivity type as the conductivity type of the well region is used as the impurity to be implanted for forming the gettering region GR has been described, an impurity of a different conductivity type from the conductivity type of the well region may be used or an ion other than a semiconductor impurity, for example, carbon (C) or silicon (Si) may be used in order to form a crystal defect through the ion implantation.

<F-3. Function and Effect>

With such a structure, even if the unreacted metal layer remains as a residual metal on the trench isolation oxide film ST21 in the formation of the silicide layer and is diffused into the trench isolation oxide film ST21 by the heat treatment in the process, the gettering region GR is provided in the vicinity of the PN junction portion JP so that the residual metal RM converges on the gettering region GR. Consequently, it is possible to prevent the residual metal RM from reaching the PN junction portion JP, the PN junction portion JP in the SOI layer 3, for example, the junction portion of the P-type well region WR11 and the source-drain region SD11, and the junction portion of the N-type well region WR12 and the source-drain region SD12. As a result, the silicide can be prevented from being formed in the PN junction portion and a junction leakage current can be prevented from being generated.

While the SOI device 600 formed on the SOI substrate 10 has been described above, FIG. 48 shows a bulk device 600A formed on a bulk silicon substrate 1.

In the bulk device 600A, a deeper trench isolation oxide film ST22 is provided in place of the trench isolation oxide film ST21. Since other structures are the same as those of the SOI device 600, repetitive description will be omitted.

<G. Seventh Embodiment>
<G-1. Structure of Device>

A seventh embodiment according to the present invention will be described with reference to FIGS. 49 to 51.

Figure 49:
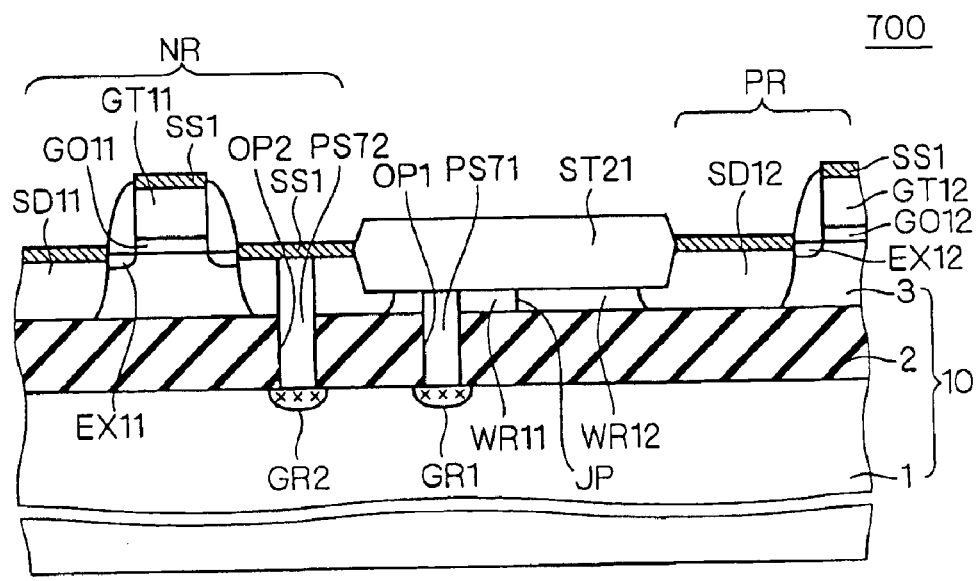
FIG. 49 is a sectional view illustrating a structure of a semiconductor device according to a seventh embodiment of the present invention.

FIG. 49 is a sectional view showing a structure of an SOI device 700 according to the seventh embodiment, and the SOI device 700 shown in FIG. 49 is basically identical to the SOI device 100 described with reference to FIG. 11. However, a region NR and a region PR are defined by a trench isolation oxide film ST21 and a gettering region GR is provided through ion implantation on an interface with a buried oxide film 2 in a silicon substrate 1 opposed to a P-type well region WR11 provided under the trench isolation oxide film ST21.

Moreover, a gettering region GR2 constituted by a local crystal defect region through ion implantation is provided on the interface with the buried oxide film 2 in the silicon substrate 1 opposed to a lower portion of a source-drain region SD11 adjacent to the trench isolation oxide film ST21.

Polysilicon films PS71 and PS72 are buried as gettering materials in openings OP1 and OP2 on the gettering regions GR1 and GR2.

Furthermore, the same structures as those of the SOI device 100 have the same reference numerals and repetitive description will be omitted. For convenience, an interlayer insulating film IZ and a contact portion CH are not shown.

<G-2. Manufacturing Method>

A method of manufacturing the SOI device 700 will be described below with reference to FIGS. 50 and 51.

Figure 50:
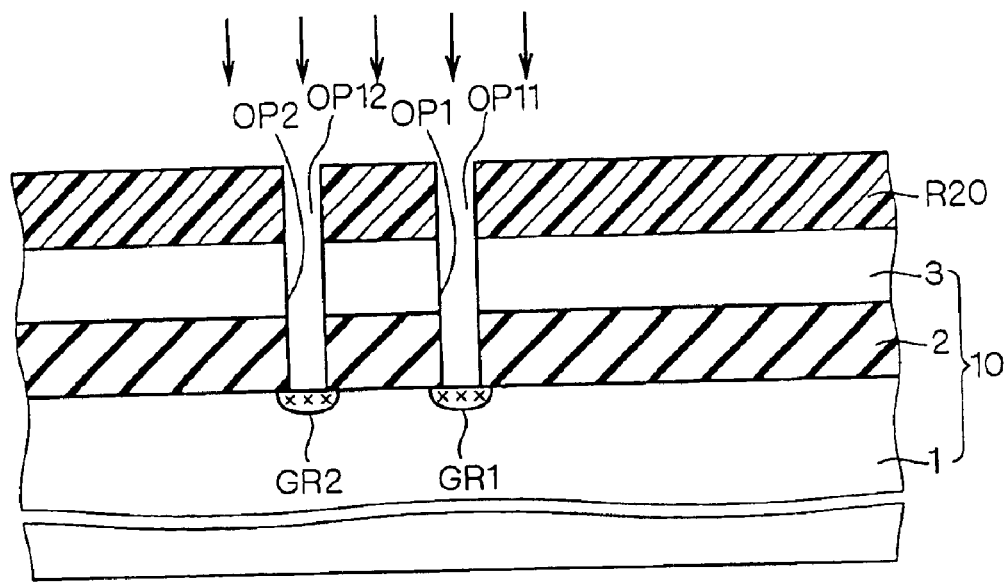
FIGS. 50 and 51 are sectional views illustrating a step of manufacturing a semiconductor device according to the seventh embodiment of the present invention.
Figure 51:
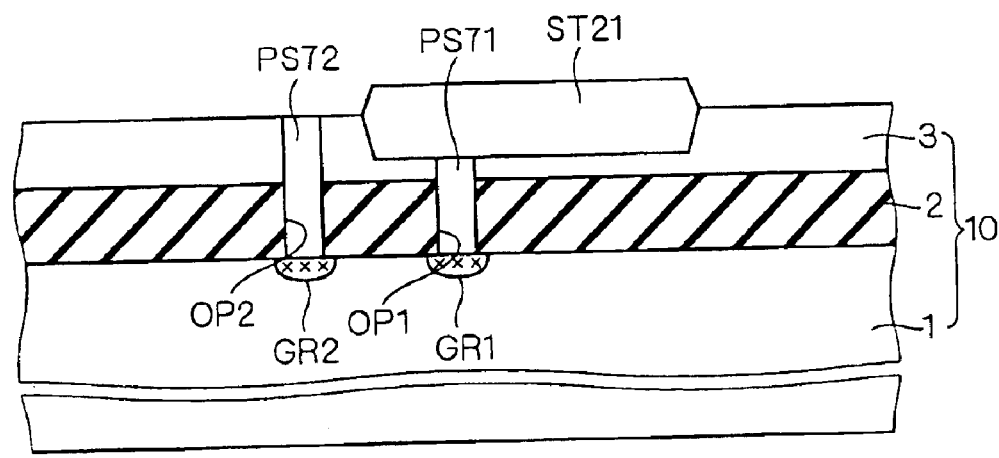

As shown in FIG. 50, first of all, an SOI substrate 10 is prepared, and a resist mask R20 having openings OP11 and OP12 is provided on an SOI layer 3.

By using the resist mask R20, then, the SOI layer 3 and the buried oxide film 2 are etched to form the openings OP1 and OP2 reaching a surface of the silicon substrate 1.

As shown in FIG. 49, the openings OP11 and OP12 of the resist mask R20 are subjected to patterning such that the opening OP1 is provided in the vicinity of a PN junction portion JP in the P-type well region WR11 provided under the trench isolation oxide film ST21 to be formed later and the opening OP2 is provided in the source-drain region SD11 to be formed later.

The openings OP11 and OP12 are set to have a minimum processing dimension of approximately 10 to 200 nm in the resist mask.

Then, ion implantation is carried out in a high concentration from above the resist mask R20 to form the gettering regions GR1 and GR2. A dose amount is $1 \times 10^{14}/cm^2$ or more, and the ion is implanted such that the implantation region has a concentration of $1 \times 10^{18}/cm^3$ or more. Thus, an implantation defect is formed.

A Si or C ion as well as an impurity ion such as B or P can be used as the ion to be implanted. Moreover, it is possible to use any ion which can form the implantation defect and does not affect the operation of a semiconductor device, or any ion of the same conductivity type as that of the impurity contained in the silicon substrate 1 or of different conductivity type from that of the same impurity.

At a step shown in FIG. 51, next, the openings OP1 and OP2 are filled with the polysilicon films 71 and 72, and the trench isolation oxide film ST21 is formed in a surface of the SOI layer 3 in the SOI substrate 10 through the same steps as those described with reference to FIGS. 1 to 5.

While subsequent steps are basically the same as those of the method of manufacturing the SOI device 100 described with reference to FIGS. 5 to 11, a step of forming a silicide layer SS1 and then removing an unreacted metal layer may be carried out through one-time etching in the same manner as that in the conventional art.

While the example in which the gettering regions GR1 and GR2 are formed in the silicon substrate 1 corresponding to the P-type well region WR11 provided under the trench isolation oxide film ST21 and the silicon substrate 1 corresponding to the lower portion of the source-drain region SD11 adjacent to the trench isolation oxide film ST21 has been described above, they may be formed in the silicon substrate 1 corresponding to the N-type well region WR12 provided under the trench isolation oxide film ST21 and the silicon substrate 1 corresponding to the lower portion of the source-drain region SD12 adjacent to the trench isolation oxide film ST21, or may be formed corresponding to all the portions.

<G-3. Function and Effect>

With such a structure, even if the unreacted metal layer remains as a residual metal on the trench isolation oxide film ST21 in the formation of the silicide layer and is diffused into the trench isolation oxide film ST21 by the heat treatment in the process, the residual metal RM is silicided in the polysilicon films PS71 and PS 72 in the openings OP1 and OP2. Consequently, it is possible to prevent the residual metal RM from reaching the PN junction portion JP, the PN junction portion JP of the SOI layer 3, for example, the junction portion of the P-type well region WR11 and the source-drain region SD11, and the junction portion of the N-type well region WR12 and the source-drain region SD12. As a result, the silicide can be prevented from being formed in the PN junction portion and a junction leakage current can be prevented from being generated.

In addition to the original gettering effect of the silicon substrate 1, moreover, the gettering regions GR1 and GR2 act as gettering sites. Therefore, the gettering effect of a metallic element contained in the silicon substrate 1 can be enhanced in the manufacturing process.

In respect of the prevention of the formation of a silicide in the PN junction portion, it is also possible to employ such a structure that only the polysilicon films PS71 and PS72 are provided and the gettering regions GR1 and GR2 are not provided. In this case, the polysilicon films PS71 and PS72 do not need to be provided in the buried oxide film 2 but may be buried only in the P-type well region WR11 and the source-drain region SD11 which are provided under the trench isolation oxide film ST21.

By filling in the polysilicon films PS71 and PS72, moreover, a plasma damage can be suppressed effectively in a wafer process. More specifically, an SOI layer is set in an electrical floating state in an ordinary SOI device. Therefore, in the case in which etching or the like is to be carried out through a plasma, a damage which is not generated in a bulk device is caused in some cases.

However, the SOI layer 3 is electrically connected to the silicon substrate 1 by the presence of the polysilicon films PS71 and PS72. Therefore, it is possible to prevent drawbacks from being caused by the floating state of the SOI layer.

Conversely, the silicon substrate 1 is electrically connected to the source-drain region SD11 of the SOI layer 3. Therefore, an electric potential of the silicon substrate 1 can be fixed. Consequently, it is possible to obtain an effective structure for a semiconductor device in which an electric potential of a back face of a substrate is hard to fix, for example, a flip chip.

<H. Eighth Embodiment>
<H-1. Structure of Device>

An eighth embodiment according to the present invention will be described with reference to FIGS. 52 to 58.

Figure 52:
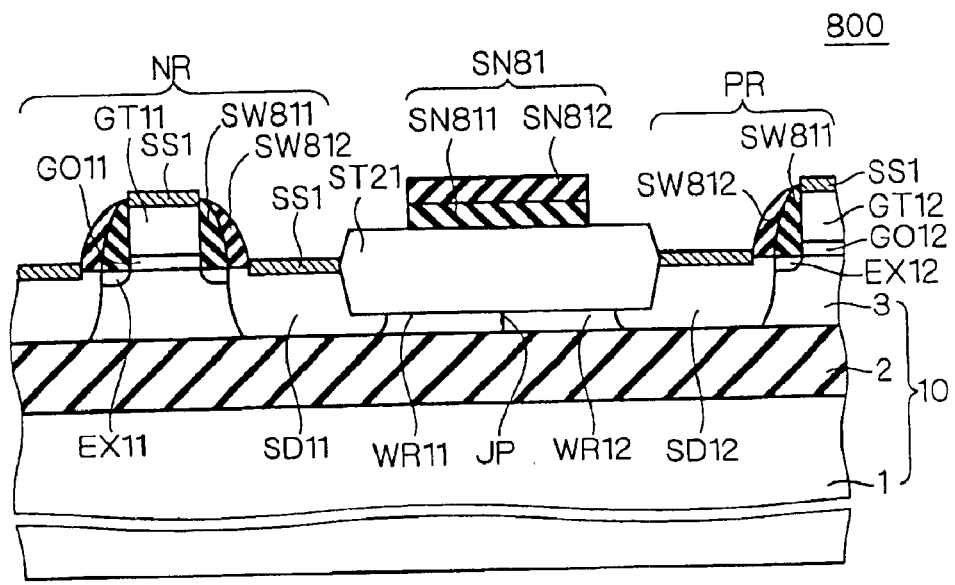
FIG. 52 is a sectional view illustrating a structure of a semiconductor device according to an eighth embodiment of the present invention.

FIG. 52 is a sectional view showing a structure of an SOI device 800 according to the eighth embodiment, and the same structures as those of the SOI device 100 described with reference to FIG. 11 have the same reference numerals and repetitive description will be omitted. For convenience, an interlayer insulating film IZ and a contact portion CH are not shown.

The SOI device 800 is different from the SOI device 100 in that a region NR and a region PR are defined by a trench isolation oxide film ST21, a two-layered upper nitride film SN81 is selectively provided on the trench isolation oxide film ST21, and furthermore, a two-layered side wall spacer SW81 formed of a nitride film is provided on side surfaces of gate electrodes GT11 and GT12.

The upper nitride film SN81 is provided in a position corresponding to a top of a PN junction portion JP of a P-type well region WR11 and an N-type well region WR12 in an SOI layer 3 across the two well regions.

Apparently, it is effective that the upper nitride film SN81 is provided along the PN junction portion JP in the same manner as the polysilicon film PS21 described with reference to FIG. 19.

<H-2. Manufacturing Method>

A method of manufacturing the SOI device 800 will be described with reference to FIGS. 53 to 58.

Figure 53:
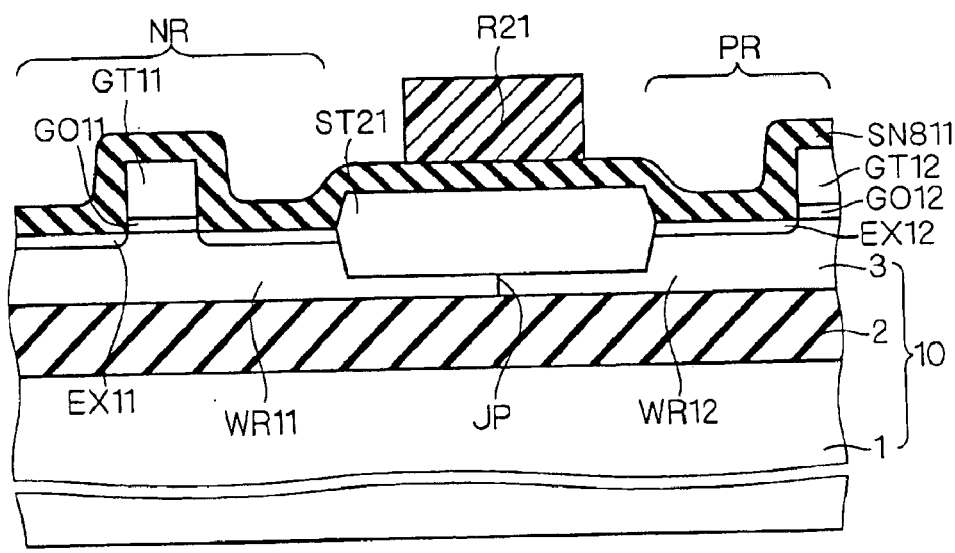
FIGS. 53 to 56 are sectional views illustrating a step of manufacturing a semiconductor device according to the eighth embodiment of the present invention.

Through the same steps as those described with reference to FIGS. 1 to 8, first of all, the trench isolation oxide film ST21 is formed in a surface of the SOI layer 3 of an SOI substrate 10, the gate electrodes GT11 and GT12 are formed in the regions NR and PR respectively, and extension regions EX11 and EX12 are formed in the SOI layer 3 by using the gate electrodes GT11 and GT12 as masks in self-alignment as shown in FIG. 53.

Then, a first nitride film SN8 is formed over the whole surface, and a resist mask R21 is selectively formed on the first nitride film SN8 provided on the trench isolation oxide film ST21. The resist mask R21 is provided corresponding to a region where the upper nitride film SN81 is to be formed.

Figure 54:
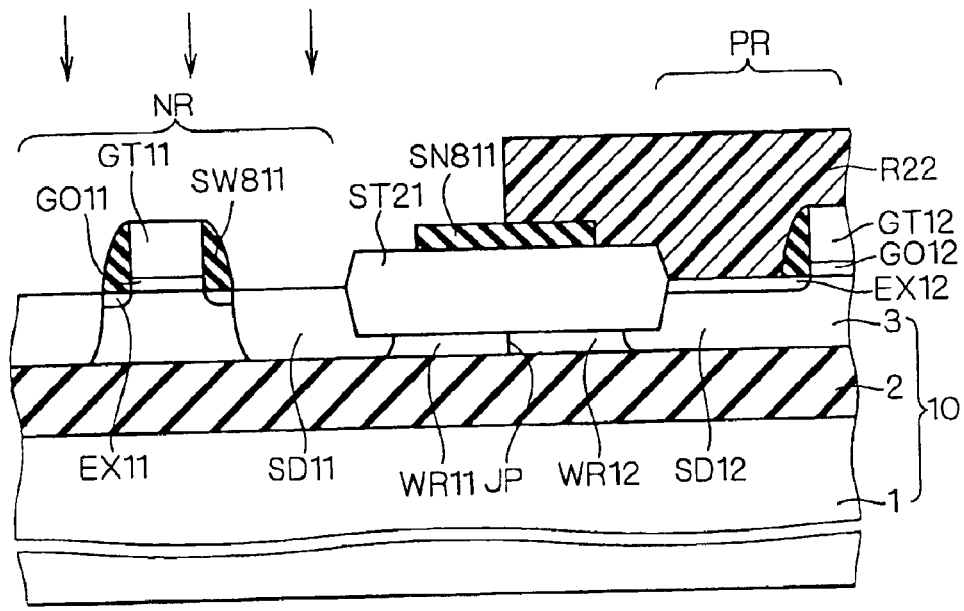

At a step shown in FIG. 54, next, the first nitride film SN8 is removed through anisotropic etching and is caused to remain as a first upper nitride film SN811 on the trench isolation oxide film ST21. In addition, a first side wall spacer SW811 formed of a nitride film is provided on side surfaces of the gate electrodes GT11 and GT12.

Subsequently, the region PR is covered with a resist mask R22, and a P or As ion is implanted into the region NR, for example, to form a source-drain region SD11 in self-alignment. At this step, the extension region EX11 remains under the first side wall spacer SW811.

Figure 55:
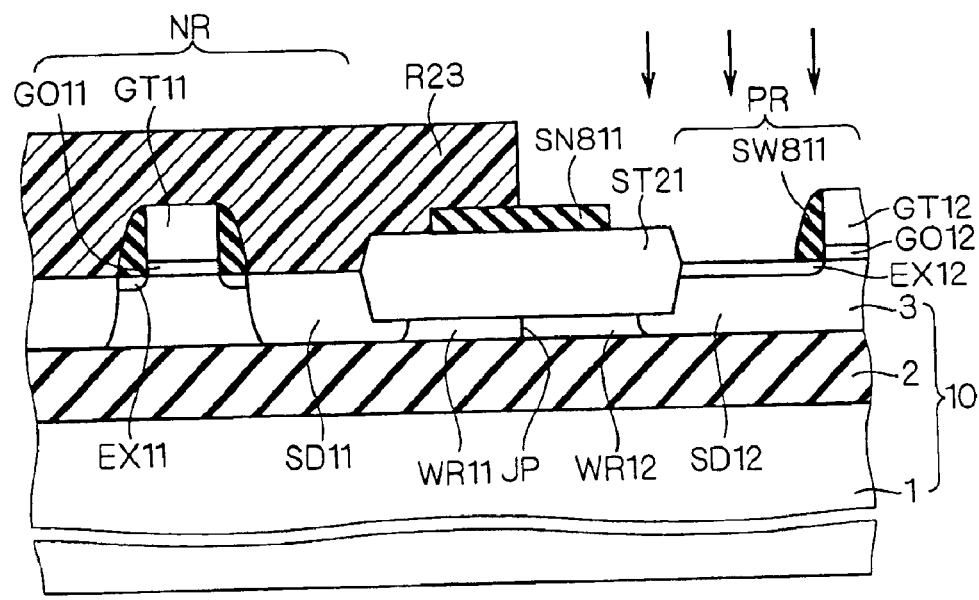

At a step shown in FIG. 55, then, the region NR is covered with a resist mask R23, and a B ion is implanted into the region PR, for example, to form a source-drain region SD12 in self-alignment. At this step, the extension region EX12 remains under the first side wall spacer SW811.

Figure 56:
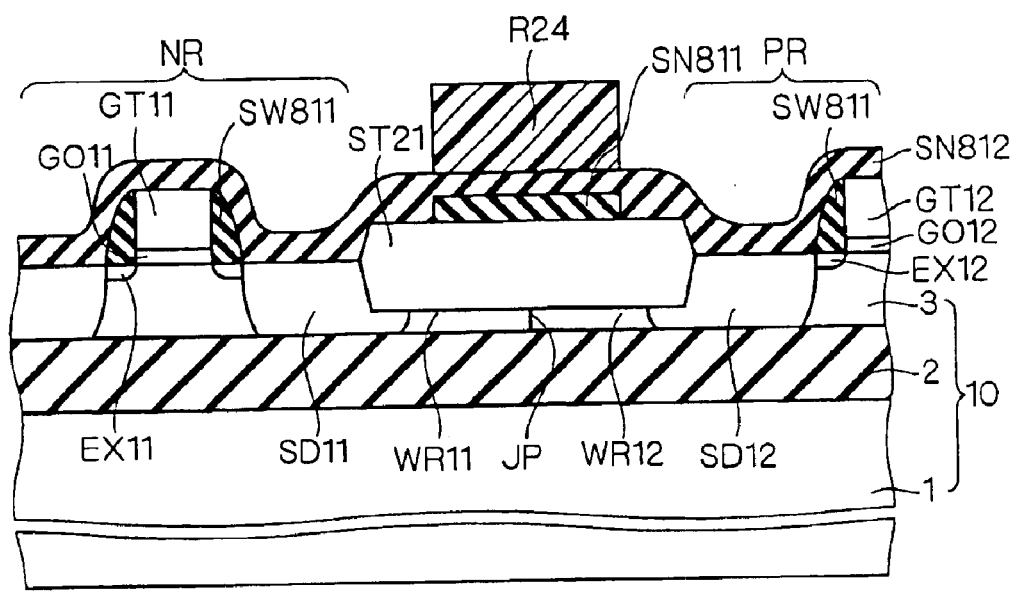

At a step shown in FIG. 56, next, a second nitride film SN9 is formed over the whole surface, and a resist mask R24 is selectively formed on the second nitride film SN9 provided on the trench isolation oxide film ST21. The resist mask R24 is provided corresponding to a region where the upper nitride film SN81 is to be formed.

Then, the second nitride film SN9 is removed through the anisotropic etching to leave a second upper nitride film SN812 on the first upper nitride film SN811. Consequently, the two-layered upper nitride film SN81 is formed. Moreover, a second side wall spacer SW812 is formed to cover the first side wall spacer SW811 on the side surfaces of the gate electrodes GT11 and GT12. Thus, the two-layered side wall spacer SW81 is constituted.

While subsequent steps are basically the same as those of the method of manufacturing the SOI device 100 described with reference to FIGS. 10 and 11, a step of forming a silicide layer SS1 and then removing an unreacted metal layer may be carried out through one-time etching in the same manner as that in the conventional art.

The side wall spacer provided on the side surfaces of the gate electrodes GT11 and GT12 may be formed of an oxide film and the upper nitride film SN81 may be formed on the trench isolation oxide film ST21 at a separate step from the step of forming the side wall spacer. Consequently, a stress given to the SOI layer 3 can be relieved and a fluctuation in a threshold of a transistor can be suppressed.

Although a special step of forming the upper nitride film SN81 is required, there is an advantage that a thickness thereof can be set optionally.

<H-3. Function and Effect>

With such a structure, a region in which an unreacted metal layer remains as a residual metal on the trench isolation oxide film ST21 in the formation of the silicide layer is restricted, and there can be a lower possibility that the residual metal might be present and diffused into the trench isolation oxide film ST21 by the heat treatment in the process, thereby reaching an undesirable portion, for example, a PN junction portion JP.

Moreover, in the case in which the unreacted metal layer remains as a residual metal on the upper nitride film SN81, most of metal atoms are deposited in the upper nitride film SN81 or on an interface between the upper nitride film SN81 and the trench isolation oxide film ST21 and are not diffused into the trench isolation oxide film ST21 even if the residual metal is diffused by the heat treatment in the process. As a result, it is possible to prevent a silicide from being formed in the PN junction portion and to prevent a junction leakage current from being generated.

In the SOI device 800 formed in the above-mentioned process, furthermore, the two-layered side wall spacer SW81 formed of a nitride film is provided on the side surfaces of the gate electrodes GT11 and GT12.

The second side wall spacer SW812 to be a second layer is provided after the formation of the source-drain regions SD11 and SD12. Therefore, drawbacks are rarely caused on a transistor characteristic. On the contrary, there is an effect that the gate oxide films GO11 and GO12 can be prevented from being broken due to abnormal growth of the silicide film SS1 in the source-drain regions SD11 and SD12.

The abnormal growth of the silicide film is a phenomenon in which the silicide film SS1 abnormally grows along an interface with the SOI layer 3 provided under the spacer to reach the gate oxide films GO11 and GO12 during a silicide reaction, thereby deteriorating an insulating property.

As a countermeasure, a method of increasing a width (thickness) of the spacer can be proposed. However, if the width of the spacer is increased, drawbacks might be caused on the characteristic of the transistor.

Figure 57:
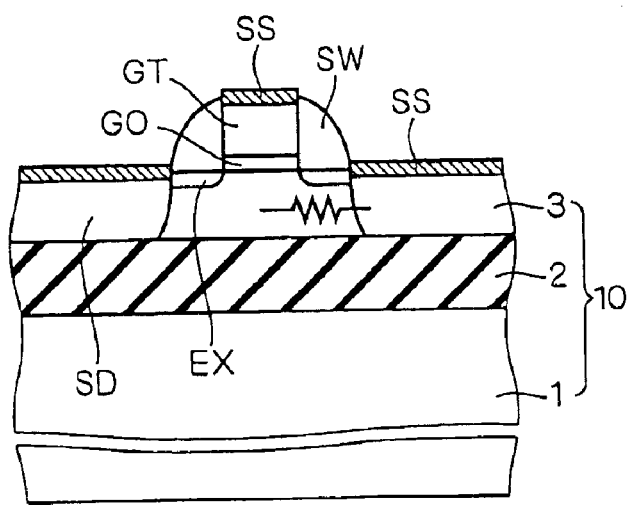
FIG. 57 is a sectional view showing a structure of a MOS transistor having a thick side wall spacer.
Figure 58:
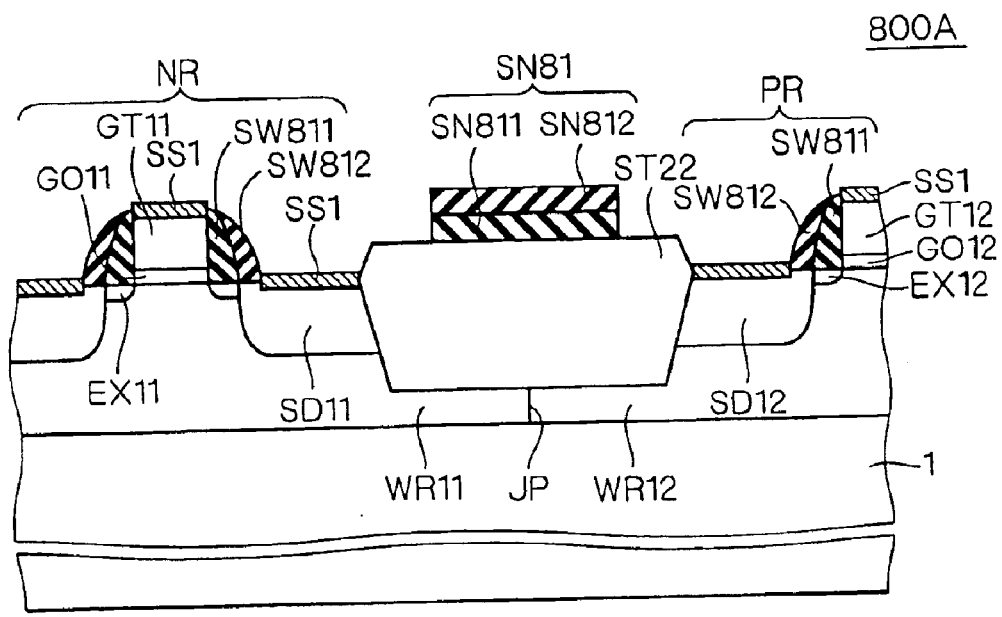
FIG. 58 is a sectional view showing an example in which the semiconductor device according to the eighth embodiment of the present invention is applied to a bulk device.

The foregoing will be described with reference to FIG. 57. FIG. 57 shows a structure in which a thickness of a side wall spacer is increased in an SOI device. Since the side wall spacer SW is thick, a relatively long extension region EX is formed in the SOI layer 3 provided under the side wall spacer SW.

The extension region EX is referred to as an LDD region in some cases, and is often provided as an impurity region having a low concentration and has a relatively higher resistivity as that in the source-drain region. Accordingly, if the extension region EX is long, a parasitic resistance of a MOS transistor is increased so that drawbacks are caused on the characteristic of the transistor.

In the SOI device 800, however, the width of the side wall spacer SW81 is great so that drawbacks can be prevented from being caused by the abnormal growth of the silicide film. In addition, since the extension regions EX11 and EX12 are short, the parasitic resistance can be reduced. Therefore, the characteristic of the transistor is not deteriorated.

While the SOI device 800 formed on the SOI substrate 10 has been described above, FIG. 58 shows a bulk device 800A formed on a bulk silicon substrate 1.

In the bulk device 800A, a deeper trench isolation oxide film ST22 is provided in place of the trench isolation oxide film ST21. Since other structures are the same as those of the SOI device 800, repetitive description will be omitted.

<I. Ninth Embodiment>

<I-1. Structure of Device>

A ninth embodiment according to the present invention will be described with reference to FIGS. 59 and 60.

Figure 59:
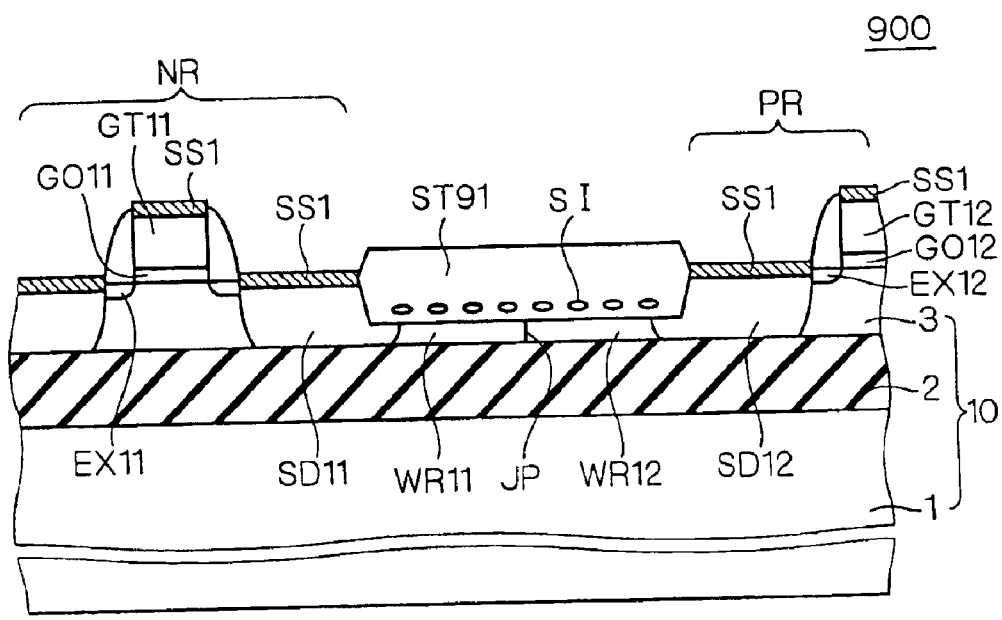
FIG. 59 is a sectional view illustrating a structure of a semiconductor device according to a ninth embodiment of the present invention.

FIG. 59 is a sectional view showing a structure of an SOI device 900 according to the ninth embodiment, and the same structures as those of the SOI device 100 described with reference to FIG. 11 have the same reference numerals and repetitive description will be omitted. For convenience, an interlayer insulating film IZ and a contact portion CH are not shown.

The SOI device 900 is different from the SOI device 100 in that a region NR and a region PR are defined by a trench isolation oxide film ST91.

The trench isolation oxide film ST91 has, as a gettering material, a plurality of silicon islands SI provided therein in positions corresponding to a top of a PN junction portion JP of a P-type well region WR11 and an N-type well region WR12 in an SOI layer 3 across the two well regions.

There has been known that the silicon island SI is a lump of silicon having a maximum particle size of approximately 0.1 μm and is present in a buried oxide film of an SOI wafer formed by a SIMOX (Separation by Implanted Oxygen) method. This is caused by the implantation of an oxygen (O) ion having a high concentration in a silicon substrate to form a buried oxide film. When the silicon island SI is present in the buried oxide film, a dust is caused at the process for manufacturing a semiconductor device. Therefore, the presence of the silicon island SI is not desirable.

However, the inventors have thought of the positive utilization of the silicon island SI as a gettering site.

More specifically, the trench isolation oxide film is generally formed by a general CVD method. Therefore, the silicon island is not present in the trench isolation oxide film. However, if a Si or O ion having a high concentration is implanted into the trench isolation oxide film, the silicon island can be formed. When the silicon island is formed, an interface between Si and $SiO_2$ is formed. Consequently, the gettering site can be obtained.

<I-2. Manufacturing Method>

A method of manufacturing the SOI device 900 will be described below with reference to FIG. 59.

Figure 60:
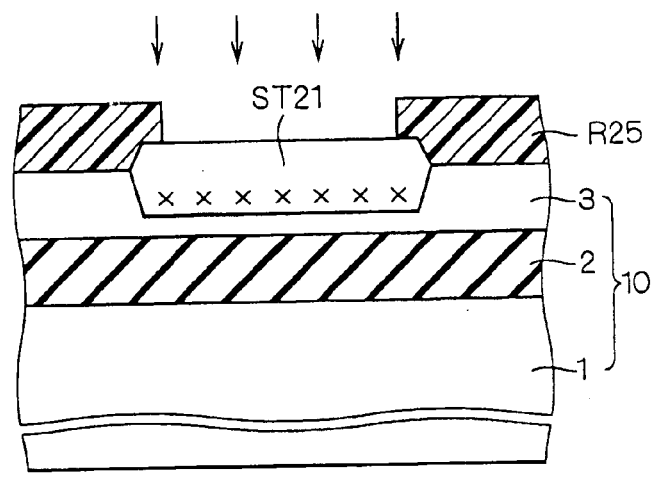
FIG. 60 is a sectional view illustrating a step of manufacturing a semiconductor device according to the ninth embodiment of the present invention.

Through the same steps as those described with reference to FIGS. 1 to 5, first of all, the trench isolation oxide film ST21 is formed in a surface of the SOI layer 3 of an SOI substrate 10 as shown in FIGS. 59 and 60. In FIG. 60, only the trench isolation oxide film ST21 portion is shown for convenience.

Next, a resist mask R25 having only a top of the trench isolation oxide film ST21 opened is formed on the SOI layer 3, and a silicon ion is implanted in a high concentration from above the resist mask R25, for example. A dose amount is $1\times10^{18}/cm^2$ or more, and the implantation is carried out such that an implantation region has a concentration of $1\times10^{22}/cm^3$ or more.

Then, annealing is carried out for five minutes to six hours at a temperature of 1000 to 1400° C. to form the silicon island SI in the trench isolation oxide film ST21. Thus, the trench isolation oxide film ST91 is obtained.

While subsequent steps are basically the same as those of the method of manufacturing the SOI device 100 described with reference to FIGS. 5 to 11, a step of forming a silicide layer SS1 and then removing an unreacted metal layer may be carried out through one-time etching in the same manner as that in the conventional art.

An ion may be implanted into the silicon island SI and annealing may be carried out at a temperature of 600° C. or more to perform crystallization such that a gettering capability can be enhanced.

At this time, B, P, As and C as well as Si and O can be used for the ion to be implanted and a dose amount thereof is $1\times10^{14}/cm^2$ or more.

Moreover, the gettering capability can be enhanced by the implantation of the B or P ion in a dose amount of $1\times10^{14}/cm^2$ or more without the polycrystallization.

<I-3. Function and Effect>

With such a structure, even if the unreacted metal layer remains as a residual metal on the trench isolation oxide film ST91 in the formation of the silicide layer and is diffused into the trench isolation oxide film ST91 by the heat treatment in the process, the residual metal converges on the silicon islands SI provided across the two well regions. Consequently, it is possible to prevent the residual metal from reaching the PN junction portion JP, the PN junction portion in the SOI layer 3, for example, the junction portion of the P-type well region WR11 and the source-drain region SD11, and the junction portion of the N-type well region WR12 and the source-drain region SD12. As a result, the silicide can be prevented from being formed in the PN junction portion and a junction leakage current can be prevented from being generated.

Figure 61:
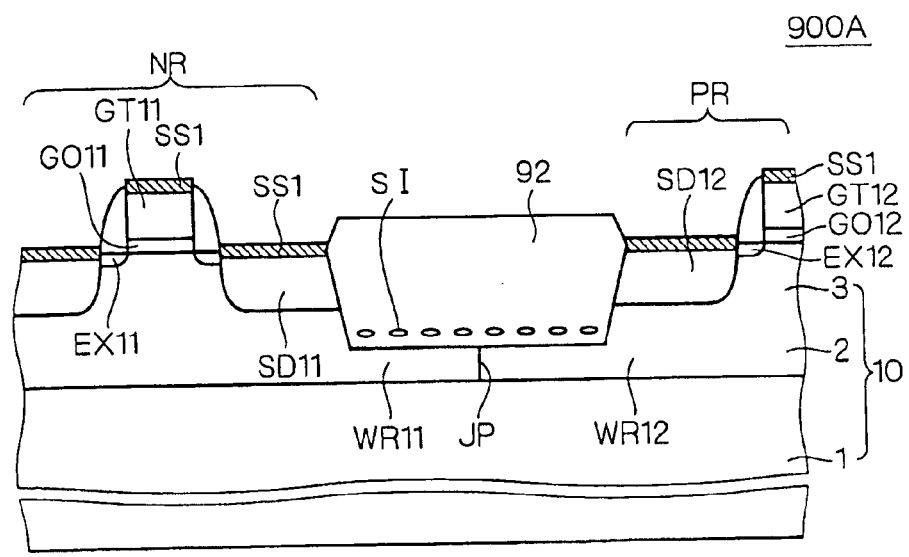
FIG. 61 is a sectional view showing an example in which the semiconductor device according to the ninth embodiment of the present invention is applied to a bulk device.
Figure 64:
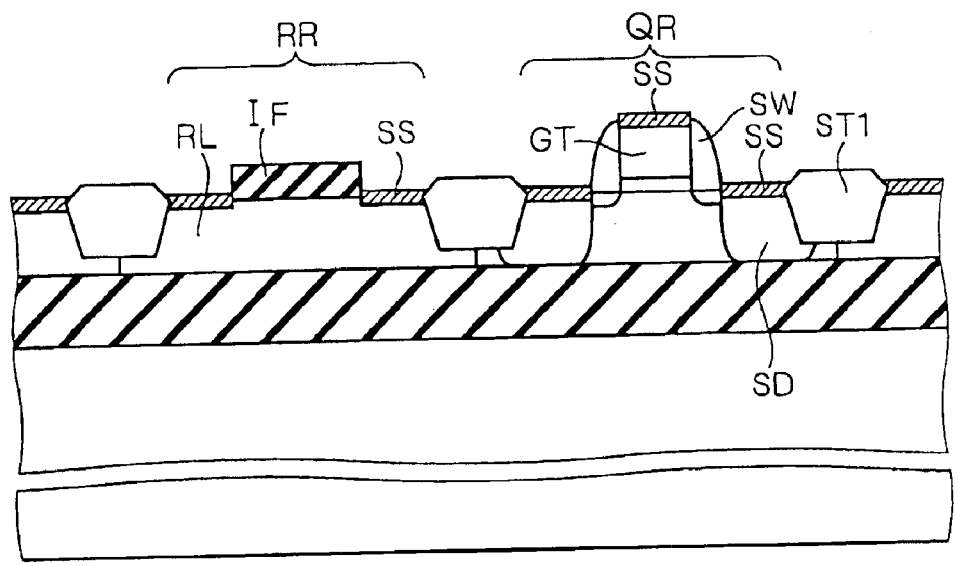
Figure 65:
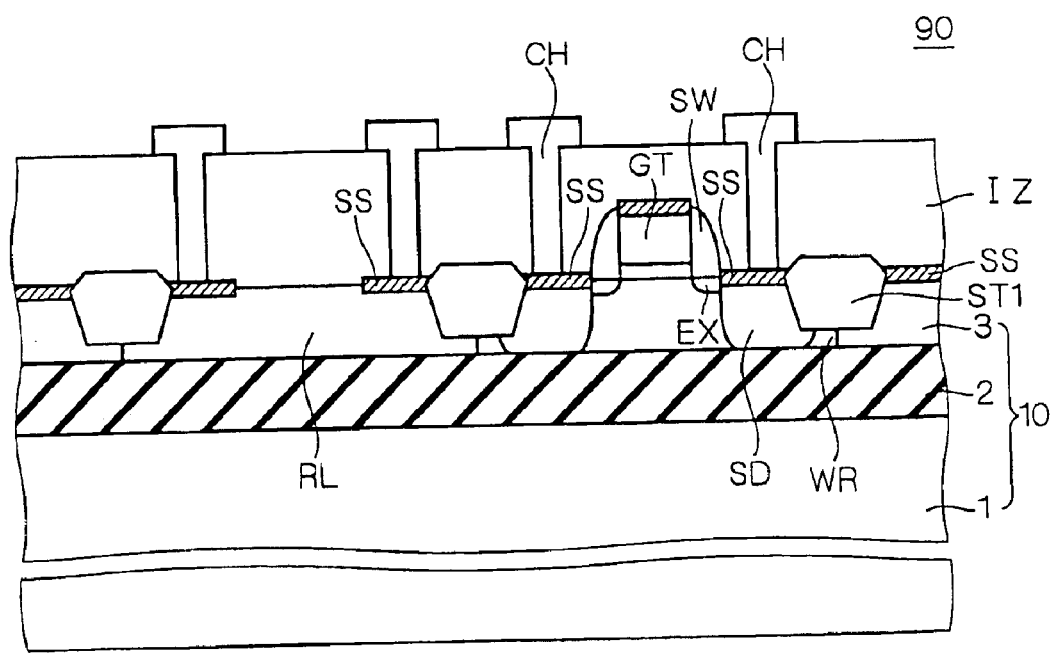
Figure 66:
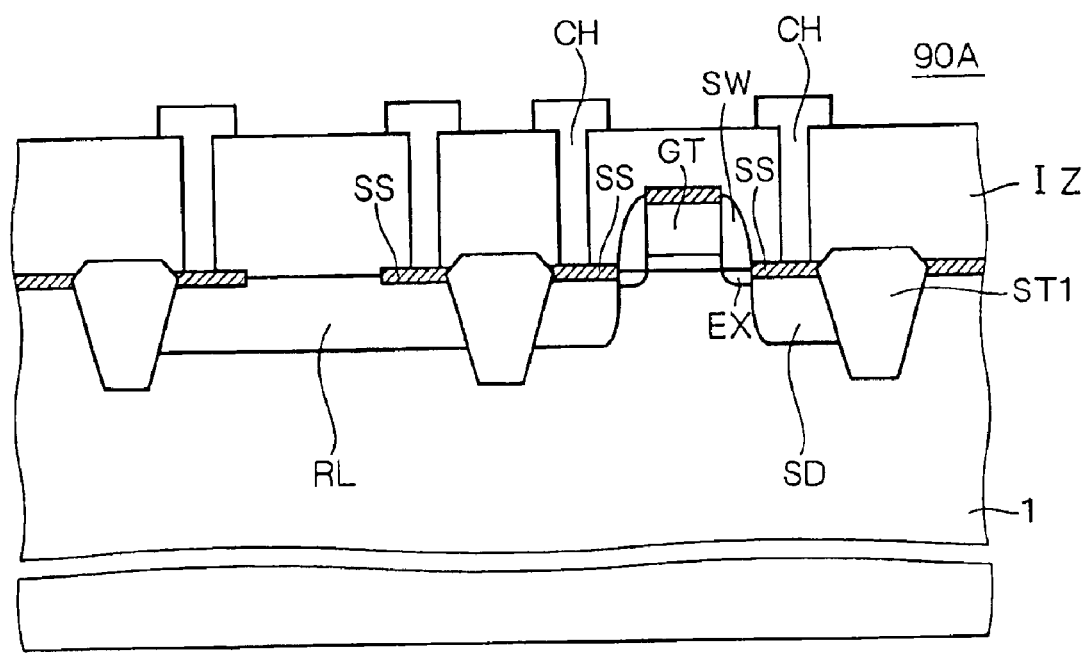
FIG. 66 is a sectional view showing a conventional bulk device having a silicide layer.

While the SOI device 900 formed on the SOI substrate 10 has been described above, FIG. 61 shows a bulk device 900A formed on a bulk silicon substrate 1.

In the bulk device 900A, a deeper trench isolation oxide film 92 is provided in place of the trench isolation oxide film ST21. Since other structures are the same as those of the SOI device 900, repetitive description will be omitted.

EXAMPLE OF APPLICATION OF THE PRESENT INVENTION

While CoSi$_2$ and TiSi$_2$ have been taken as an example of the silicide layer and the metal remaining during the formation of the silicide layer has been taken as an example of a metal pollution source in the first to ninth embodiments described above, the present invention is also effective in a metal pollution source in the process for manufacturing a semiconductor device, for example, copper in a Cu (copper) wiring, Fe (iron), Ni (nickel) and Cr (chromium) discharged from a wiring etching device, and the like.

In other-words, the-present-invention is effective in pollution by related manufacturing apparatuses as well as the pollution by the metal materials themselves, and is particularly effective in a device generally using a metal material such as a metal gate, a silicide layer in a source-drain region or a Cu wiring and an SOI device which has a low gettering capability and might be highly affected by very slight metal pollution with microfabrication of a semiconductor device.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

a semiconductor layer;

a plurality of semiconductor elements formed on said semiconductor layer;

an isolation film provided in a surface of said semiconductor layer, said semiconductor elements being electrically isolated from each other by said isolation film; and a PN junction portion formed by two semiconductor regions of different conductivity types in said semiconductor layer provided under said isolation film, said isolation film including:

a nitride film provided in a position corresponding to a top of said PN junction portion and having a substantially uniform thickness across said two semiconductor regions, and an upper oxide film and a lower oxide film which are provided in upper and lower portions of said nitride film, wherein, said surface of said semiconductor layer is silicidized in such a state that a surface of said isolation film is exposed.

2. The semiconductor device according to claim 1, wherein said semiconductor device is an SOI semiconductor device formed on an SOI substrate including a silicon substrate, a buried oxide film provided on said silicon substrate and an SOI layer provided on said buried oxide film, said semiconductor layer being said SOI layer.

3. A semiconductor device comprising:

a semiconductor layer;

a plurality of semiconductor elements formed on said semiconductor layer;

an isolation film provided in a surface of said semiconductor layer, said semiconductor elements being electrically isolated from each other by said isolation film; and a PN junction portion formed by two semiconductor regions of different conductivity types in said semiconductor layer provided under said isolation film, said isolation film including:

a nitride film provided in a position corresponding to a top of said PN junction portion and having a substantially uniform thickness across said two semiconductor regions, and said nitride film being completely buried within said semiconductor layer, and an upper oxide film and a lower oxide film which are provided in upper and lower portions of said nitride film.

4. The semiconductor device according to claim 3, wherein said semiconductor device is an SOI semiconductor device formed on an SOI substrate including a silicon substrate, a buried oxide film provided on said silicon substrate and an SOI layer provided on said buried oxide film, said semiconductor layer being said SOI layer.

5. A semiconductor device comprising:

a semiconductor layer;

a plurality of semiconductor elements formed on said semiconductor layer;

an isolation film provided in a surface of said semiconductor layer, said semiconductor elements being electrically isolated from each other by said isolation film;

a PN junction portion formed by two semiconductor regions of different conductivity types in said semiconductor layer provided under said isolation film; and a metal layer formed over said semiconductor layer and said plurality of semiconductor elements such to expose said isolation film, said isolation film including:

a nitride film provided in a position corresponding to a top of said PN junction portion and having a substantially uniform thickness across said two semiconductor regions, and an upper oxide film and a lower oxide film which are provided in upper and lower portions of said nitride film.

6. The semiconductor device according to claim 5, wherein said semiconductor device is an SOI semiconductor device formed on an SOI substrate including a silicon substrate, a buried oxide film provided on said silicon substrate and an SOI layer provided on said buried oxide film, said semiconductor layer being said SOI layer.

7. A semiconductor device comprising:

a semiconductor layer;

a plurality of semiconductor elements formed on said semiconductor layer;

an isolation film provided in a surface of said semiconductor layer, said semiconductor elements being electrically isolated from each other by said isolation film, and said isolation film having an upper surface flush with said surface of said semiconductor layer; and a PN junction portion formed by two semiconductor regions of different conductivity types in said semiconductor layer provided under said isolation film, said isolation film including:

a nitride film provided in a position corresponding to a top of said PN junction portion and having a substantially uniform thickness across said two semiconductor regions, and an upper oxide film and a lower oxide film which are provided in upper and lower portions of said nitride film.

8. The semiconductor device according to claim 7, wherein said semiconductor device is an SOI semiconductor device formed on an SOI substrate including a silicon substrate, a buried oxide film provided on said silicon substrate and an SOI layer provided on said buried oxide film, said semiconductor layer being said SOT layer.

* * * * *